(12) United States Patent
Yamamoto et al.

(10) Patent No.: US 8,305,043 B2
(45) Date of Patent: Nov. 6, 2012

(54) VOLTAGE DETECTING APPARATUS WITH VOLTAGE CONTROLLED OSCILLATOR AND BATTERY STATE CONTROL SYSTEM

(75) Inventors: Hiroyoshi Yamamoto, Nagoya (JP); Hiroshi Tamura, Nagoya (JP)

(73) Assignee: Denso Corporation, Kariya (JP)

( * ) Notice: Subject to any disclaimer, the term of this patent is extended or adjusted under 35 U.S.C. 154(b) by 684 days.

(21) Appl. No.: 12/418,069

(22) Filed: Apr. 3, 2009

(65) Prior Publication Data

US 2009/0251103 A1 Oct. 8, 2009

(30) Foreign Application Priority Data

Apr. 4, 2008 (JP) ................................. 2008-098453
Feb. 26, 2009 (JP) ................................. 2009-043314

(51) Int. Cl.
*H02J 7/04* (2006.01)
*H02J 7/16* (2006.01)
*G01N 27/416* (2006.01)

(52) U.S. Cl. ........ 320/150; 320/127; 320/128; 320/130; 320/144; 320/153; 324/426; 324/431; 324/433; 324/436

(58) Field of Classification Search ................. 324/436; 320/150
See application file for complete search history.

(56) References Cited

U.S. PATENT DOCUMENTS

| 5,396,247 A | | 3/1995 | Watanabe et al. |
| 5,592,095 A | * | 1/1997 | Meadows ....................... 324/436 |
| 6,103,408 A | * | 8/2000 | Richter ............................ 429/7 |

FOREIGN PATENT DOCUMENTS

| JP | 05-259907 | | 10/1993 |
| JP | 10-070462 | | 3/1998 |
| JP | 2007-012568 | | 1/2007 |
| JP | 2007012568 A | * | 1/2007 |
| WO | WO 2007114016 A1 | * | 10/2007 |

* cited by examiner

*Primary Examiner* — Edward Tso
*Assistant Examiner* — Ahmed Omar
(74) *Attorney, Agent, or Firm* — Nixon & Vanderhye P.C.

(57) ABSTRACT

In a voltage detecting apparatus, a voltage controlled oscillator, when an input voltage is applied thereto, outputs a signal with a logical value that is periodically inverted. A detector counts a number of logical inversion of the output signal from the voltage controlled oscillator over an interval between edges of pulses of a pulse signal to thereby generate, based on the counted number of logical inversion, digital data as a detected result of the input voltage. A determiner determines whether a reduction of a time required to detect the input voltage is higher in priority than an increase of a resolution of detection of the input voltage. A variably setting unit variably sets a frequency of the pulse signal based on a result of the determination of whether the reduction of the time required to detect the input voltage is higher in priority than the increase of the resolution of detection of the input voltage.

23 Claims, 28 Drawing Sheets

(a)

(b)

(c)

(a1)

(a2)

(b1)

(b2)

(c1)

(c2)

(a1)

(a2)

(b1)

(b2)

(c1)

(c2)

(a1)

(a2)

(b1)

(b2)

(c1)

(c2)

VOLTAGE DETECTING APPARATUS WITH VOLTAGE CONTROLLED OSCILLATOR AND BATTERY STATE CONTROL SYSTEM

CROSS REFERENCE TO RELATED APPLICATIONS

This application is based on Japanese Patent Applications 2008-98453 and 2009-043314 filed on Apr. 4, 2008 and Feb. 26, 2009, respectively. This application claims the benefit of priority from the Japanese Patent Application, so that the descriptions of which are all incorporated herein by reference.

FIELD OF THE INVENTION

The present invention relates to voltage detecting apparatuses provided with a voltage controlled oscillator and a digital-data output circuit, and battery state control systems provided with such a voltage detecting apparatus. More particularly, the voltage controlled oscillator works to output a signal with a logical value that is periodically inverted when an input voltage is applied thereto. The digital-data generating circuit works to count the number of logical inversion of the output signal from the voltage controlled oscillator over an interval between edges of pulses of a pulse signal, such as a clock to thereby generate, based on the counted number of logical inversion, digital data according to the input voltage.

BACKGROUND OF THE INVENTION

As conventional voltage detecting apparatuses provided with such a pair of voltage controlled oscillator and digital-data output circuit, time A/D converters, referred to as TAD converters, have been developed. Examples of such TAD converters are disclosed in U.S. Pat. No. 5,396,247 corresponding to Japanese Patent Application Publication No. H05-259907.

TAD converters are each provided with a ring oscillator (voltage controlled oscillator) operating on an input analog voltage signal based on a target voltage to be detected, and achieve high-resolution with a simple circuit structure.

As another type of conventional voltage detecting apparatuses, a voltage detecting apparatus having pipeline analog-to-digital (A/D) converters is disclosed in Japanese Patent Application Publication No, H10-070462. The conventional voltage detecting apparatus of another type is designed such that the pipeline A/D converters parallely carry out A/D converting processes.

SUMMARY OF THE INVENTION

In using, as a power source, a battery pack consisting of a group of series-connected battery cells, it is desired to measure a voltage value across each of battery modules; each of these battery modules consists of one battery cell or a set of some adjacent battery cells. In order to address the desire, TAD converters can be applied as a voltage detector of a voltage monitoring system for a battery pack; this voltage detector works to measure a voltage value across each of the battery modules.

Such a battery pack can be applied for vehicles, such as hybrid vehicles or electric motor vehicles. The applications require facilitating battery-pack longevity. In order to address the requirement, measurement of a voltage value across each of the battery modules of a vehicle battery pack with higher accuracy is needed; his requires further higher resolution for the voltage detecting processes for TAD converters.

For meeting demand for miniaturization, lithium ion secondary cells have been prepared to be applied as each battery cell of each of the battery modules of vehicle battery packs. Note that overcharge and/or over-discharge of lithium ion secondary cells may easily decrease the reliability of them. This therefore requires monitoring, at short intervals, whether overcharge and/or over-discharge of each lithium ion secondary cell occurs; this also requires greater voltage detecting process speeds for TAD converters.

However, response to the higher-resolution requirement for TAD converters may increase processing load required to carry out voltage detecting processes, making it difficult to achieve greater voltage detecting speeds of TAD converters.

In other words, it may be difficult to achieve both higher resolution and greater speeds of the voltage detecting processes of TAD converters.

Voltage detecting apparatuses each with a voltage controlled oscillator may cause the same issue as TAD converters.

In view of the circumstances set force above, an object of a aspect of the present invention is to provide voltage detecting apparatuses each with a voltage controlled oscillator; these voltage detecting apparatuses are improved to achieve both higher resolution and greater speeds of their voltage detecting processes.

An alternative object of another aspect of the present invention is to provide battery state control systems each with such an improved voltage detecting apparatus.

According to one aspect of the present invention, there is provided a voltage detecting apparatus. The voltage detecting apparatus includes a voltage controlled oscillator working to, when an input voltage is applied thereto, output a signal with a logical value that is periodically inverted. the apparatus includes a detector working to count a number of logical inversion of the output signal from the voltage controlled oscillator over an interval between edges of pulses of a pulse signal to thereby generate, based on the counted number of logical inversion, digital data as a detected result of the input voltage. The apparatus includes a determiner working to determine whether a reduction of a time required to detect the input voltage is higher in priority than an increase of a resolution of detection of the input voltage. The apparatus includes a variably setting unit working to variably set a frequency of the pulse signal based on a result of the determination of whether the reduction of the time required to detect the input voltage is higher in priority than the increase of the resolution of detection of the input voltage.

In a preferred embodiment of this one aspect, the input voltage is based an a voltage across a battery, the voltage across the battery being a target voltage to be detected. In the preferred embodiment of this one aspect, when a temperature of the battery is lower than a preset value, the battery is cyclically charged and discharged by a charge and discharge unit such that the temperature of the battery is increased. The determiner works to determine that the reduction of the time required to detect the input voltage is higher in priority than the increase of the resolution of detection of the input voltage.

According to another aspect of the present invention, there is provided a battery state control system. The system includes the voltage detecting apparatus according to the preferred embodiment of this one aspect, and the charge and discharge unit. The charge and discharge unit works to cyclically charge and discharge the battery such that the temperature of the battery is increased; and change, with increase in the temperature of the battery, at least one of: a frequency of the cyclic charge and discharge of the battery, and an amount of currents flowing into and out of the battery by the cyclic charge and discharge.

According to a further aspect of the present invention, there is provided a battery state control system for controlling a state of a battery. The system includes a charge and discharge unit working to cyclically charge and discharge the battery when a temperature of the battery is lower than a preset value, and carry out at least one of:

a process to change, with increase in the temperature of the battery by the charge and discharge, a frequency of the cyclic charge and discharge of the battery; and a process to increase, with increase in the temperature of the battery by the charge and discharge, an amount of currents flowing into and out of the batter by the cyclic charge and discharge.

BRIEF DESCRIPTION OF THE DRAWINGS

Other objects and aspects of the invention will become apparent from the following description of embodiments with reference to the accompanying drawings in which.

Figure 25:
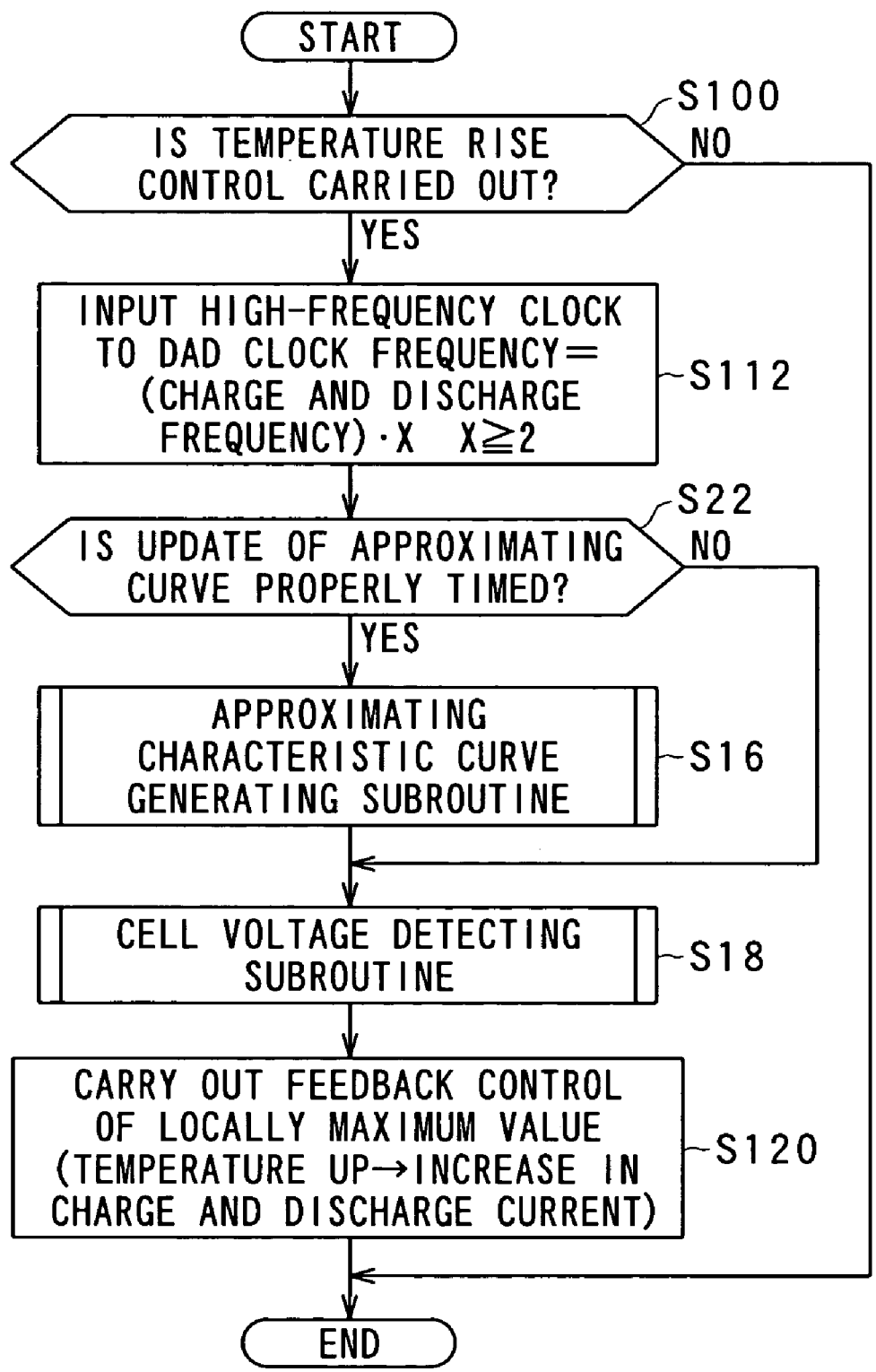
Figure 26:
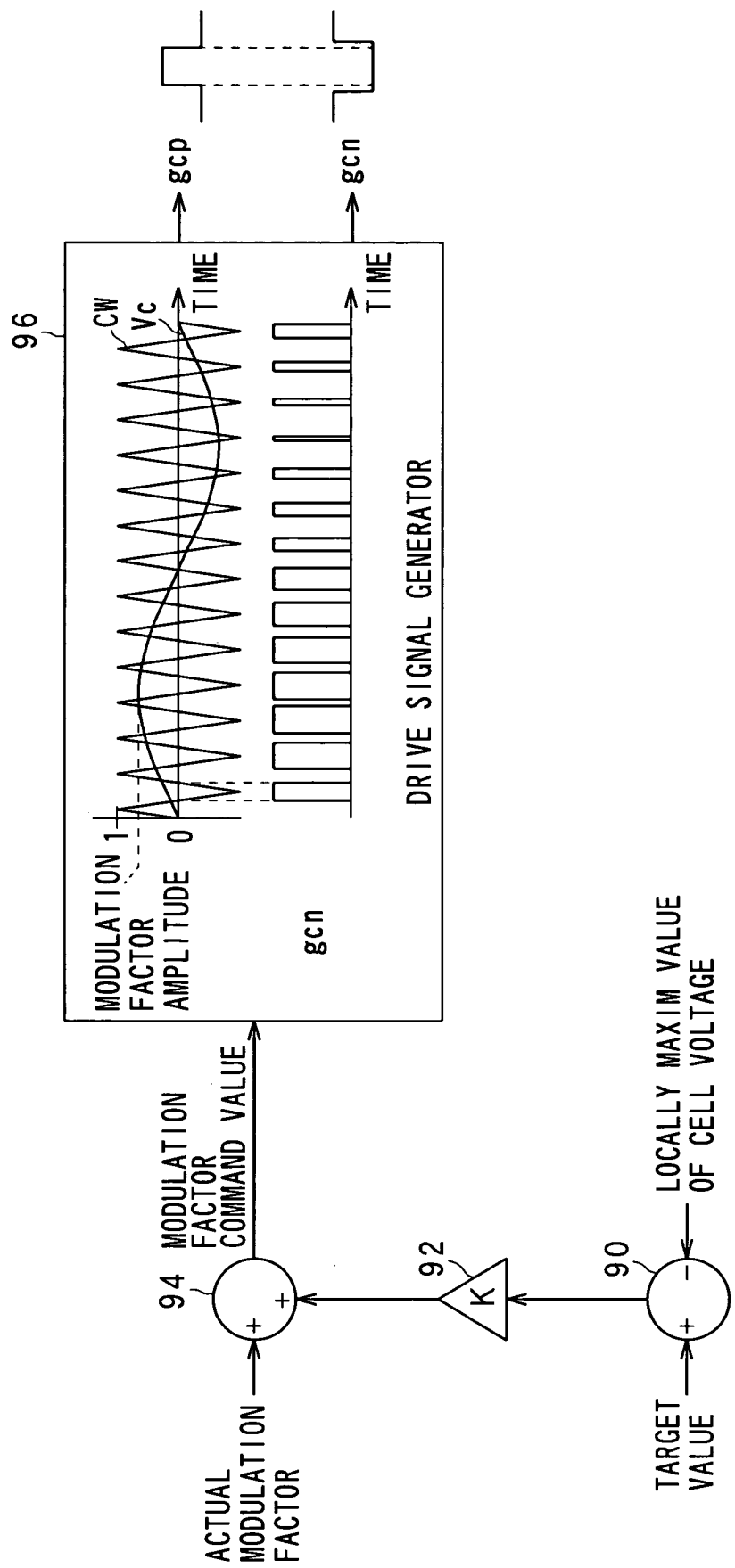
Figure 27:
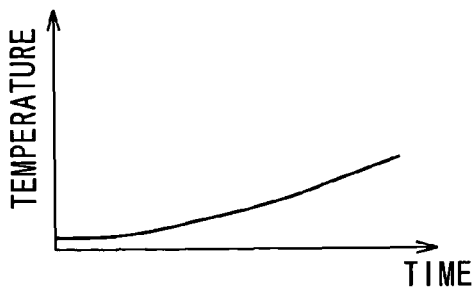
Figure 27:
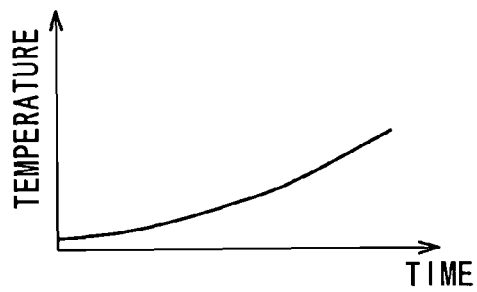
Figure 27:
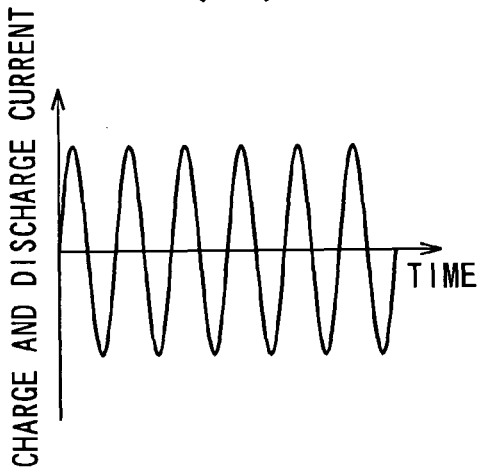
Figure 27:
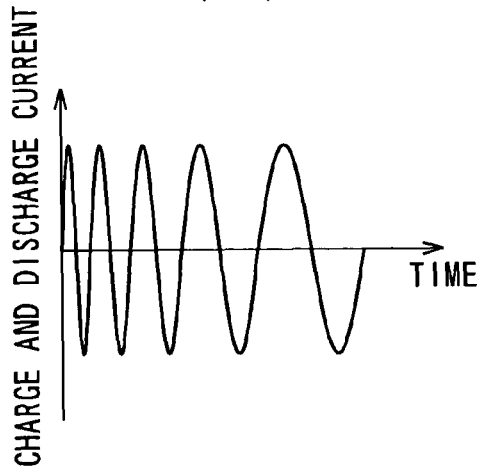
Figure 27:
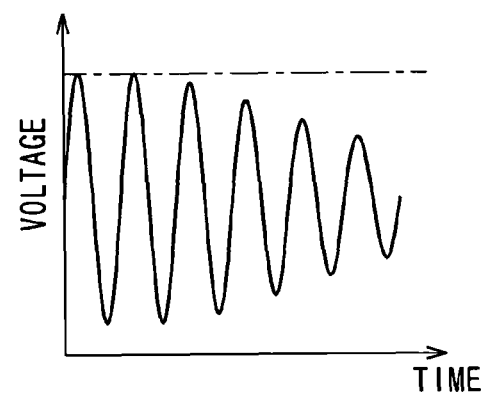
Figure 27:
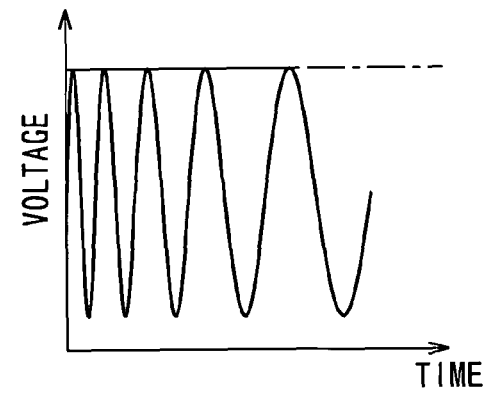
Figure 28:
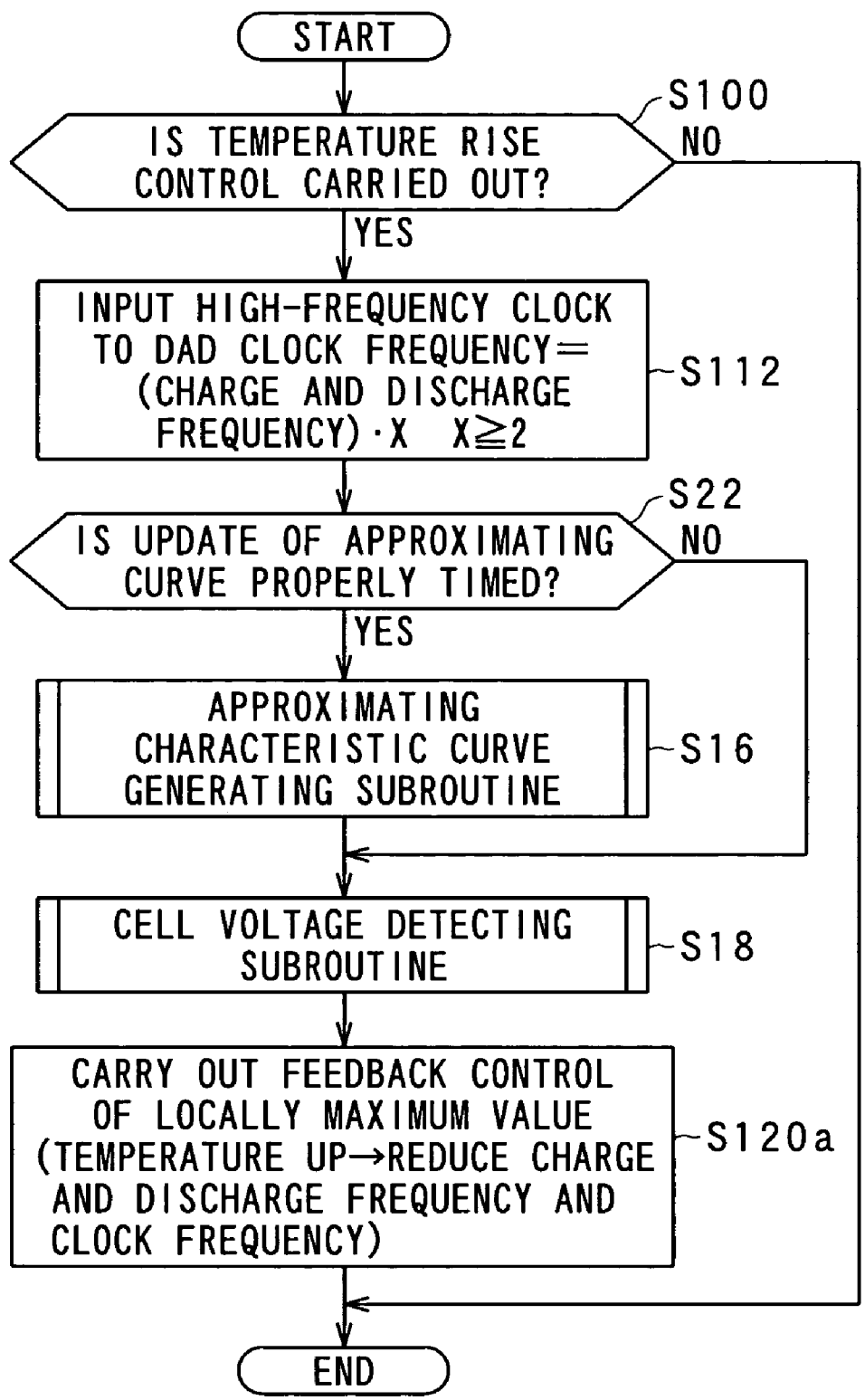
Figure 29:
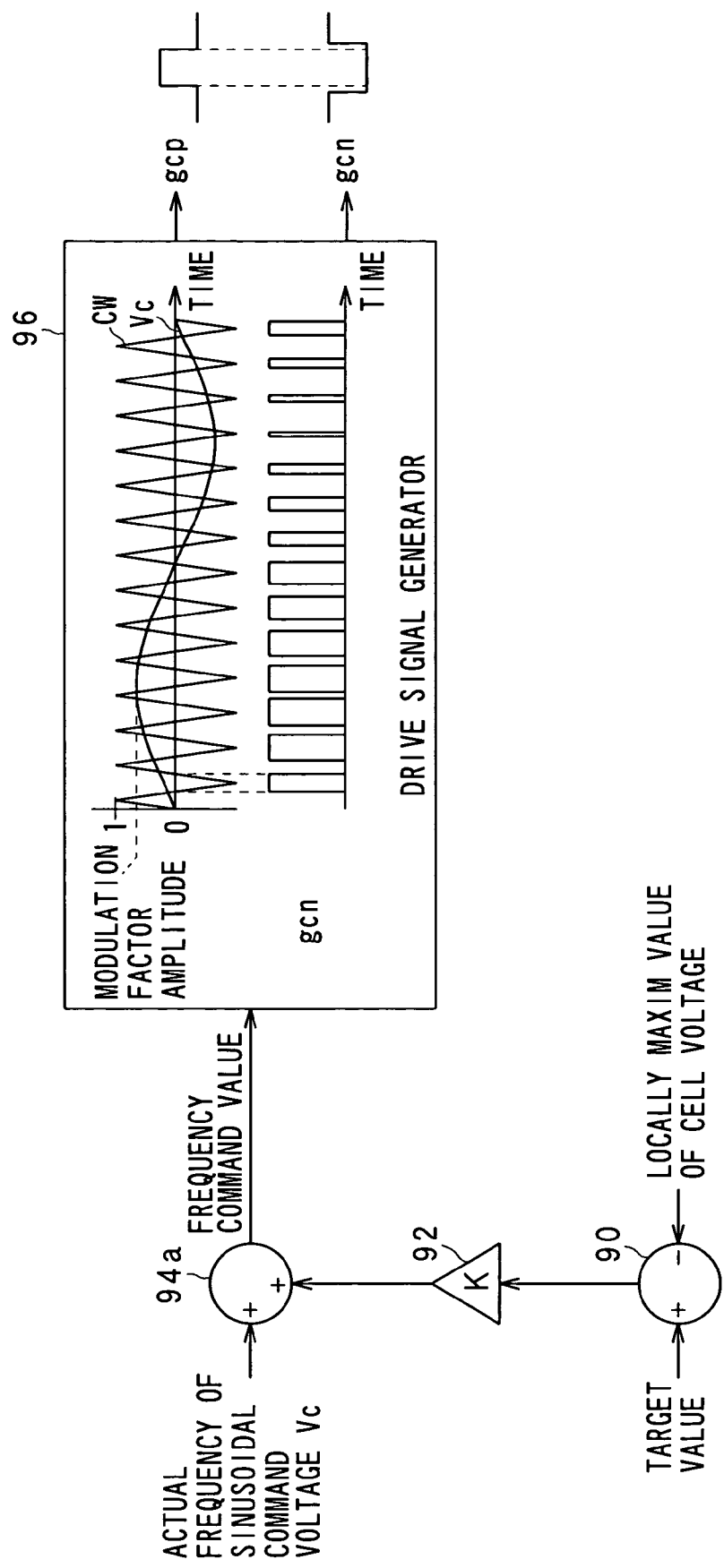
Figure 30:
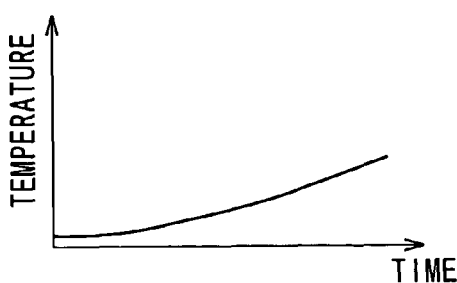
Figure 30:
Figure 30:
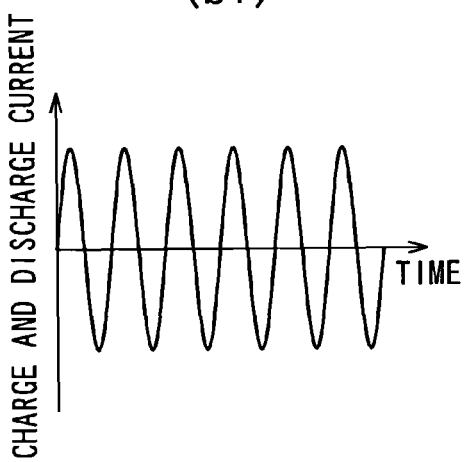
Figure 30:
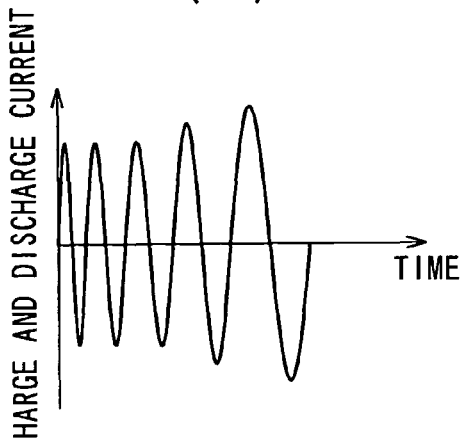
Figure 30:
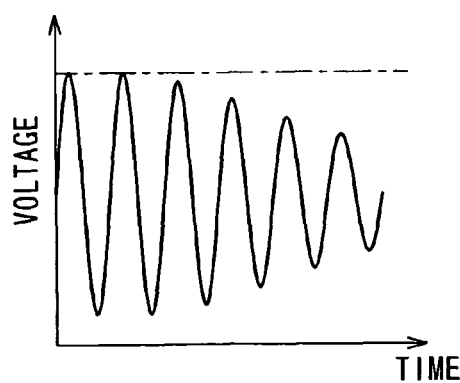
Figure 30:
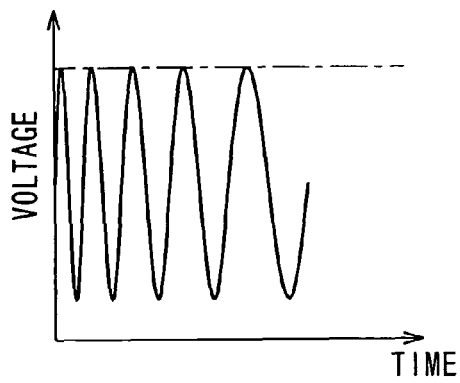
Figure 31:
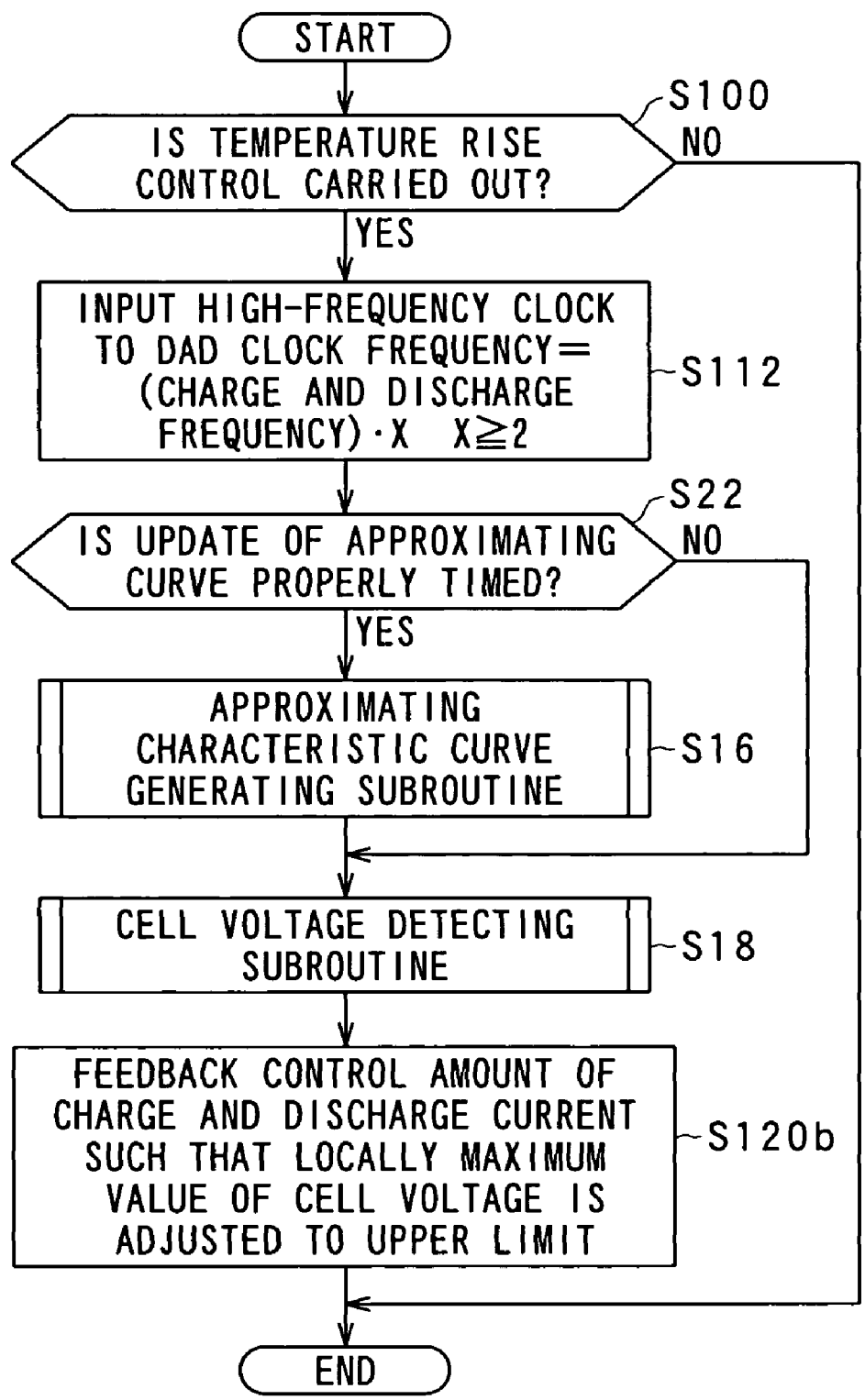
Figure 32:
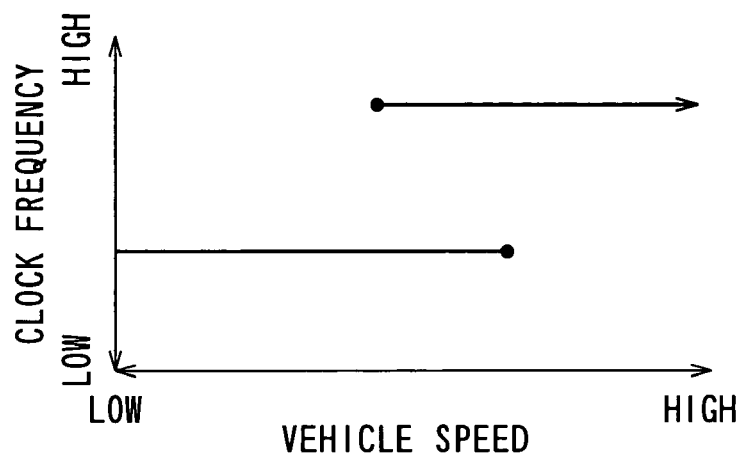
Figure 33:
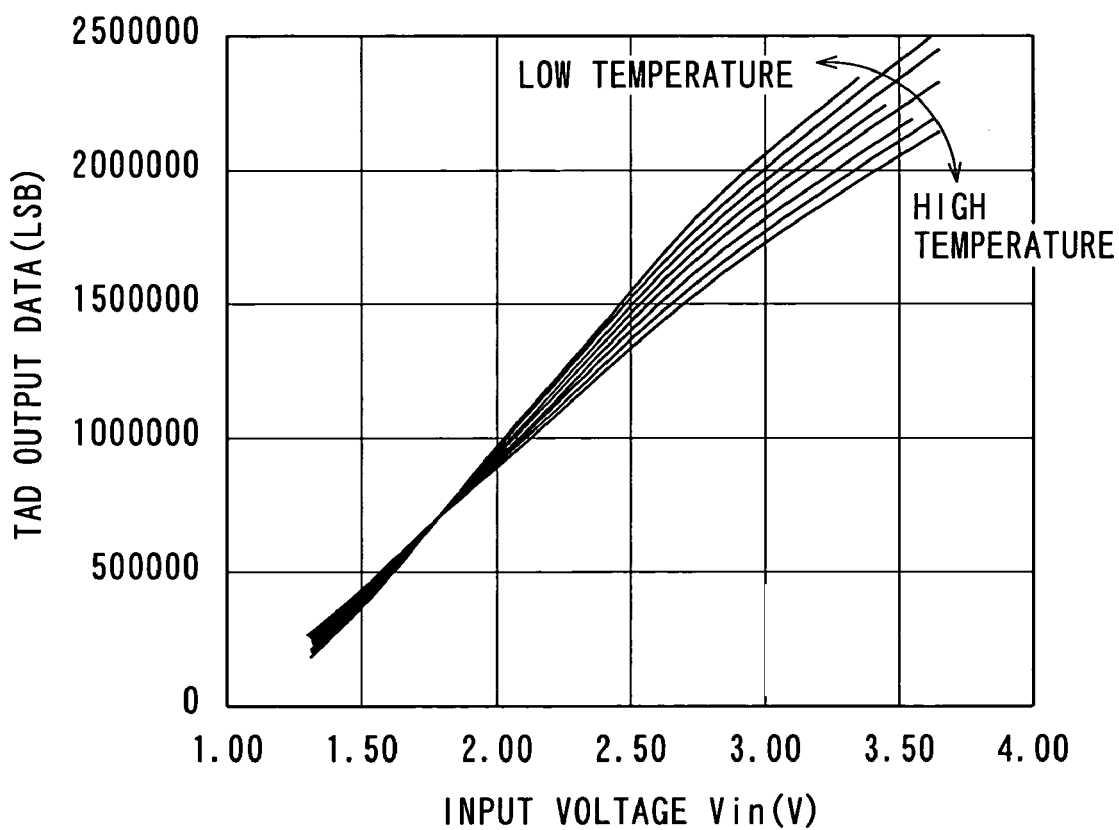

a transition of each of: a temperature of a target cells the charge and discharge current for the target cell, and the voltage across the target while no feedback control is carried out (see (a1), (b1), and (c1)); and a transition of each of the temperature of the target cell while the feedback control is carried out, the charge and discharge current for the target cell while the feedback control is carried out, and the voltage across the target cell while the feedback control is carried out according to the eighth embodiment (see (a2), (b2), and (c2));

FIG. 25 is a feedback control routine to be executed by the battery monitor system and a hybrid controller according to the eighth embodiment;

FIG. 26 is a block diagram schematically illustrating functional Modules installed in the battery monitor and the hybrid controller; these modules implement the feedback control operation in step S120 of FIG. 25 according to the eighth embodiment;

FIG. 27 is graphs schematically illustrating:

a transition of each of: a temperature of a target cells the charge and discharge current for the target cell, and the voltage across the target cell while no feedback control is carried out (see (a1), (b1), and (c1)); and a transition of each of the temperature of the target cell while the feedback control is carried out, the charge and discharge current for the target cell while the feedback control is cared out, and the voltage across the target cell while the feedback control is cared out according to the ninth embodiment (see (a2), (b2), and (c2);

FIG. 28 is a feedback control routine to be executed by the battery monitor system and a hybrid controller according to the ninth embodiment;

FIG. 29 is a block diagram schematically illustrating functional modules installed in the battery monitor and the hybrid controller; these modules implement the feedback control operation in step S120 of FIG. 25 according to the ninth embodiment;

FIG. 30 is graphs schematically illustrating:

a transition of each of: a temperature of a target cell, the charge and discharge current for the target cell, and the voltage across the target cell while no feedback control is carried out (see (a1), (b1), and (c1)); and a transition of each of the temperature of the target cell while the feedback control is carried out, the charge and discharge current for the target cell while the feedback control is carried out, and the voltage across the target cell while the feedback control is carried out according to the tenth embodiment (see (a2), (b2), and (c2));

FIG. 31 is a feedback control routine to be executed by the battery monitor system and a hybrid controller according to the tenth embodiment;

FIG. 32 is a graph schematically illustrating a relationship between a variable of the frequency of the clock and a plurality of different parameters related to the vehicle running conditions according to a modification of the present invention; and FIG. 33 is a graph schematically illustrating input-output characteristic curves of a TAD according to another modification of the present invention.

DETAILED DESCRIPTION OF EMBODIMENTS OF THE INVENTION

Embodiments of the present invention will be described hereinafter with reference to the accompanying drawings. In the embodiments, voltage detecting apparatuses according to the present invention are applied to voltage monitoring systems each installed in a hybrid vehicle.

First Embodiment

Figure 1:
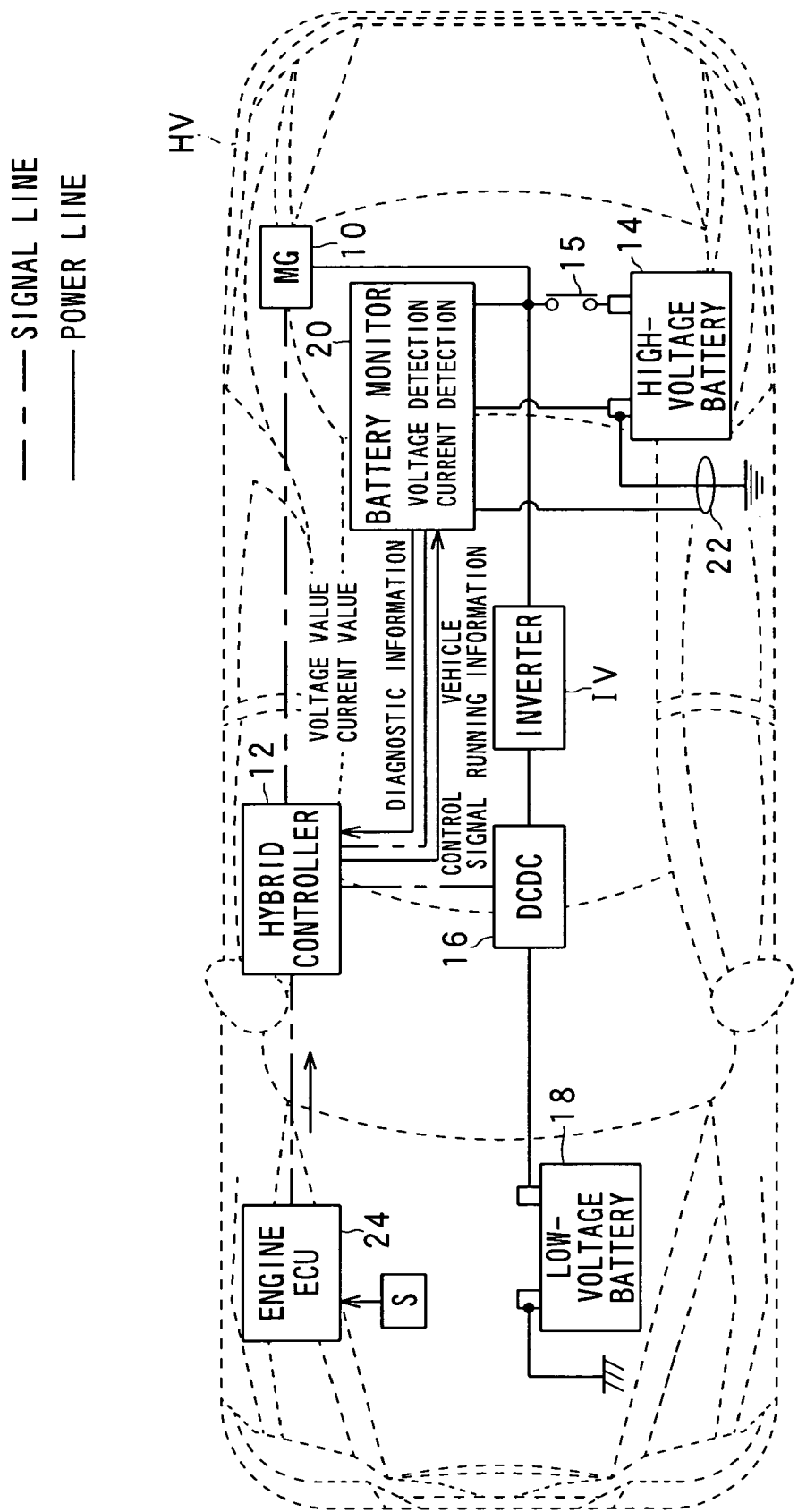
FIG. 1 is a block diagram schematically illustrating an example of the overall structure of a vehicle control system according to the first embodiment of the present invention.

Referring to the drawings, in which like reference characters refer to like parts in several views, there is illustrated in FIG. 1 an example of the overall structure of an electrical vehicle control system installed in a hybrid vehicle HV according to the first embodiment.

The vehicle control system includes a motor-generator, referred to simply as "MG", 10, a hybrid controller 12, a high-voltage battery 14, a main relay 15, a DC to DC converter 16, an inverter IV, a low-voltage battery 18, a battery monitor system 20, a current sensor 22, and an internal combustion engine control unit (engine ECU) 24.

Referring to FIG. 1, the MG 10, the hybrid controller 12, the high-voltage battery 14, the main relay 15, the DC to DC converter 16, the inverter IV, the battery monitor system 20, the current sensor 22, and the engine ECU 24 can send and receive signals thereamong via signal lines. Similarly, the MG 10, the high-voltage batter 14, the DC-DC converter 16, the inerter IV, and the low-voltage battery 18 can send and receive power thereamong via power lines.

The MG 10 is a rotary machine for generating power to be used in the hybrid vehicle HV. The hybrid controller 12 is operative to individually drive a plurality of pairs of high-side and low-side switching elements of the inverter IV to thereby generate an AC voltage based on an input DC voltage (or a boosted DC voltage). The input DC voltage (boosted DC voltage) is generated based on a DC voltage applied from the high-voltage battery 14. The generated AC voltage is applied to the MG 10. Adjustment of the AC voltage to be applied to the MG 10 adjusts an actual torque created by the MG 10 to a request torque.

The hybrid controller 12 is also operative to drive switching elements of the DC to DC converter 16 to thereby step down a voltage across the high-voltage battery 14, and apply the stepped-down voltage to the low-voltage battery 18. Note that each of the MG 10 and the DC to DC converter 16 is connected to the high-voltage battery 14 via the power lines and the main relay 15.

Specifically, a positive terminal of the high-voltage battery 14 is connected to the MG 10 and the DC to DC converter 16 via the power lines, and a negative terminal thereof is grounded.

The main relay 15 is controlled to be turned off when the MG 10 does not operate (is deactivated) on the voltage across the high-voltage battery 14, and turned on when the MG 10 operates on the voltage across the high-voltage battery 14.

The battery monitor system 20 is operative to monitor the state of the high-voltage battery 14. Specifically, the batter monitor system, abbreviated as "battery monitor", 20 is operative to receive the high battery-voltage and currents flowing into and out of the high-voltage battery 14. The currents flowing into and out of the high-voltage battery 14 include a current supplied from the MG 10 and flowing into the high-voltage battery 14, and a current flowing out of the battery 14 to either the MG 10 or the DC to DC converter 16.

Based on the received currents and voltage across the high-voltage battery 14, the battery monitor 20 is operative to monitor the state of the high-voltage battery 14.

The engine ECU 24 is operative to control the operating conditions of an engine installed in the hybrid vehicle HV.

The current sensor 22 is arranged to allow measurement of currents flowing into and out of the high-voltage battery 14. The current sensor 22 is communicable with the battery monitor 20, and operative to send, to the battery monitor 14, data indicative of currents flowing into and out of the high-voltage battery 14.

Figure 2:
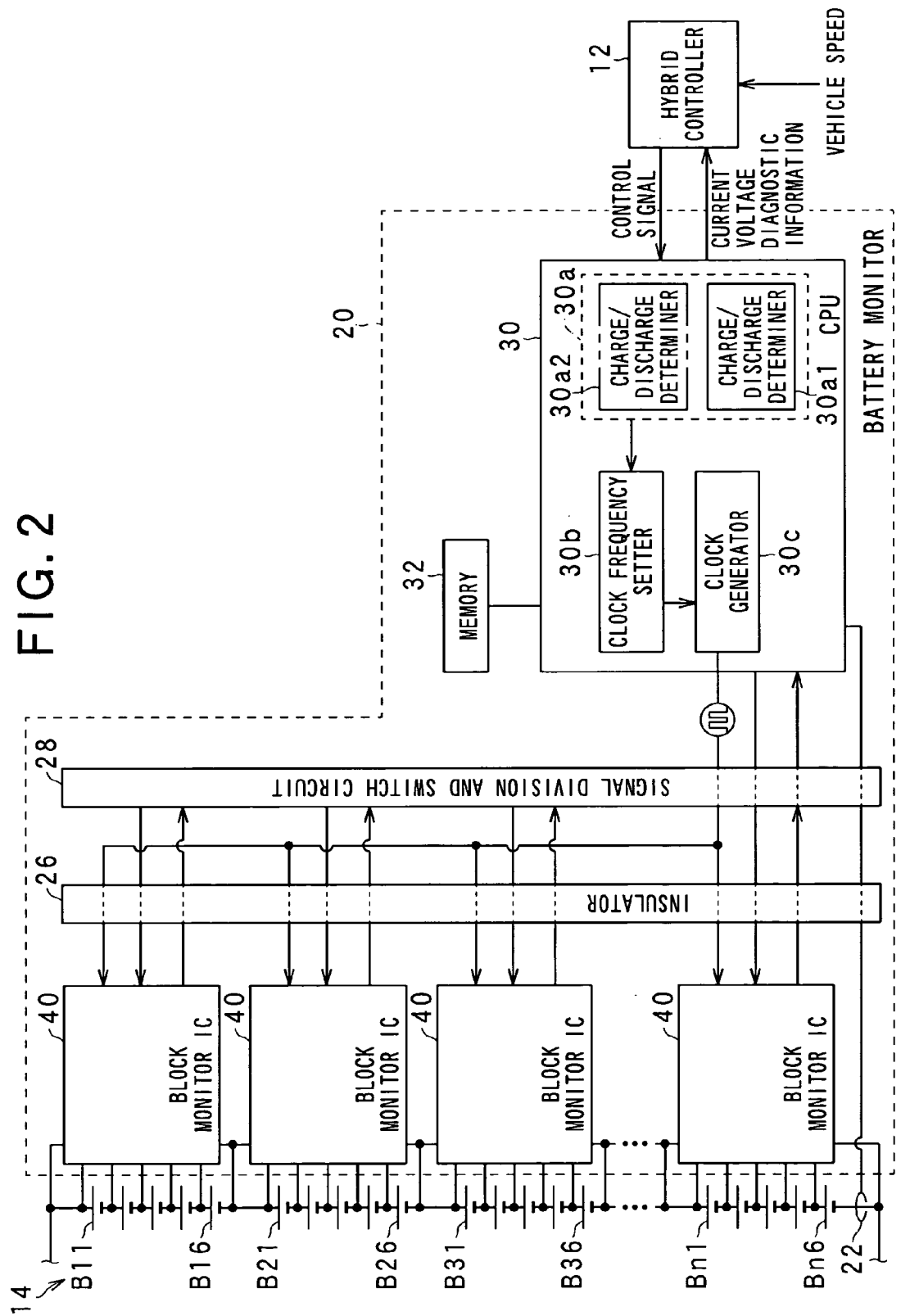
FIG. 2 is a block diagram schematically illustrating an example of the circuit structure of a battery monitor system illustrated in FIG. 1.

Referring to FIG. 2, the high-voltage battery 14 is designed as a battery pack. Specifically, the high-voltage battery 14 consists of a group of series-connected battery cells each is a secondary cell, such as lithium ion secondary cell Any one of the series-connected battery cells is represented by Bij The subscript i represents any one of 1, 2, 3, ..., n (n is an integer equal to or greater than 2), and the subscript j represents any one of 1, 2, 3, 4, 5, and 6. In other words, the high-voltage battery 14 is divided into n battery blocks (modules) B1j, B2j, ..., B(n−1)j, and Bnj of six adjacent battery cells each.

The battery monitor 20 includes a plurality of block monitor ICs (Integrated Circuits) 40, an insulator 26, a signal division and switch circuit 28, a CPU 30, and a rewritable memory 32. The number of the plurality of block monitor ICs 40 and that of the plurality of battery blocks B1j to Bnj are equal to each other.

Specifically, each cell of each of the battery blocks Bi1 to Bi6 is electrically connected to a corresponding one block monitor IC 40. Each of the block monitor ICs 40 works to monitor the state of each cell of a corresponding one of the battery blocks Bi1 to Bi6.

Each of the block monitor ICs 40 is operative to monitor the state of each cell of a corresponding one of the battery blocks Bi1 to Bi6 according to instructions sent from the CPU 30 via the insulating circuit 26 and the signal division and switch circuit 28.

Figure 3:
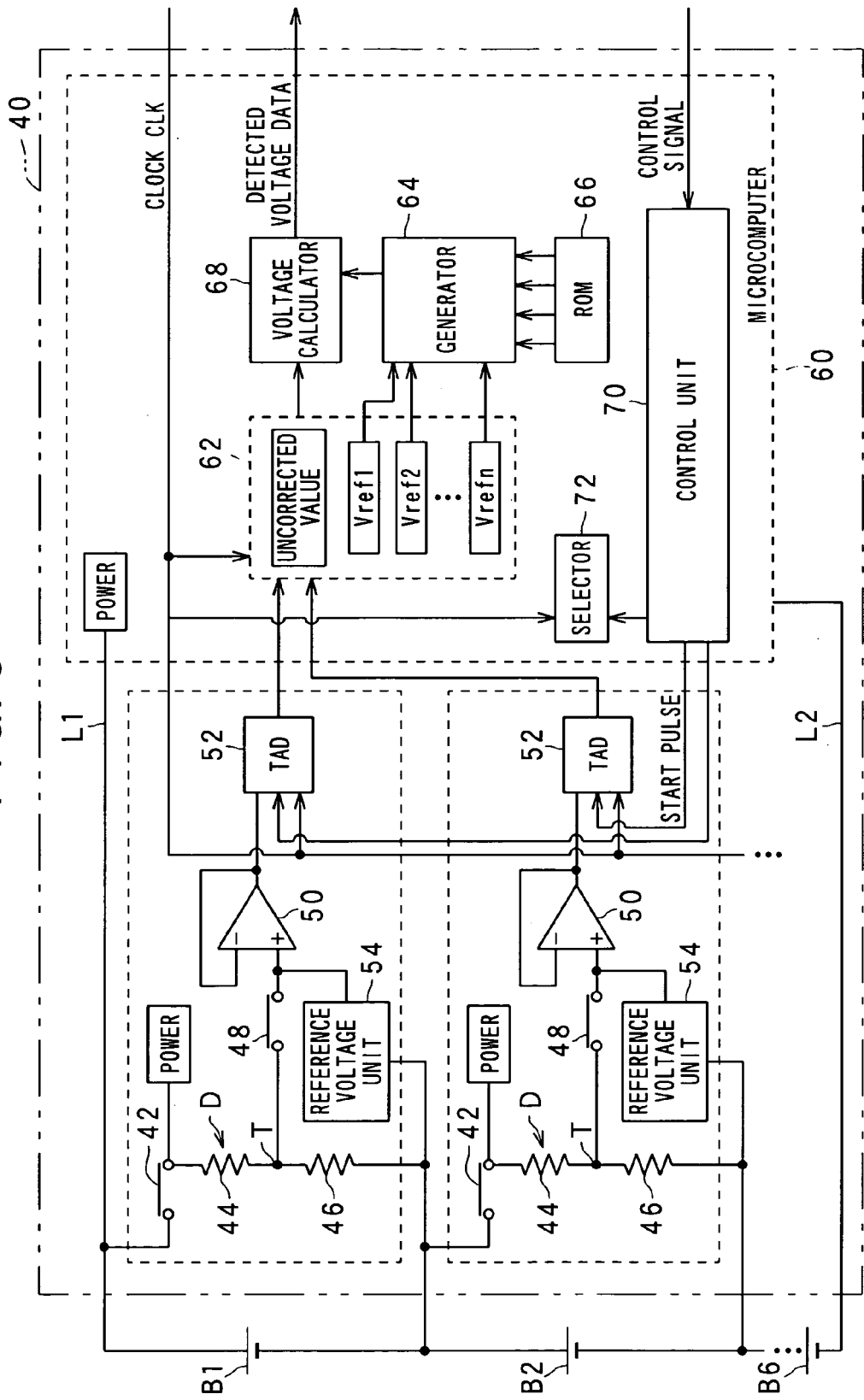
FIG. 3 is a circuit diagram schematically illustrating an example of the structure of a block monitor IC illustrated in FIG. 2.

The signal division and switch circuit 28 is operative to sequentially switch signals outputted from the CPU 30 to any one of the plurality of block monitor ICs 40. The insulator 26 is operative to establish electrical insulation between the block-monitor IC side constituting a vehicle high-voltage system and the CPU side constituting a vehicle low-voltage system in the battery monitor 20. The insulator 26 is equipped with, for example, a plurality of insulator elements, such as photo couplers, FIG. 3 illustrates an example of the schematic circuit structure of any one block monitor IC 40. In FIG. 3, six adjacent cells Bi1 to Bi6 to be monitored by a block monitor IC 40 are abbreviated as B1 to B6, respectively. Any one of the abbreviated adjacent cells B1 to B6 is referred to as Bj.

Each block monitor IC 40 is provided with six voltage dividers D each consisting of a pair of first and second resistors 44 and 46 that are connected to each other in series through an output terminal (connecting point) T. A positive terminal of the battery cell Bj is connected to a corresponding voltage divider D via a relay described hereinafter. Each of the voltage dividers D is electrically connected across a corresponding one of the six adjacent cells B1 to B6. In other words, a resistive element consisting of series-connected first and second resistors 44 and 46 is placed across each of the six adjacent cells B1 to B6.

Each of the voltage dividers D works to divide the voltage across a corresponding one (Bj) of the adjacent cells B1 to B6.

Each block monitor IC 40 is also provided with six relays 48, six voltage followers 50, six time A/D converters (TADs) 52, six reference voltage units 54, and a microcomputer 60.

The divided value of the voltage across each cell Bj by a corresponding voltage divider D is outputted from a corresponding output terminal T to be inputted to a corresponding one of the six relays 48.

Specifically, each of the relays 48 is electrically connected to the output terminal T of a corresponding one of the voltage dividers D, and to a noninverting input terminal (+) of a corresponding one of the voltage followers 50. This allows the divided value of the voltage across each of the adjacent cells B1 to B6 to be applied to a corresponding one of the voltage followers 50 via a corresponding one of the relays 48. An output of each of the reference voltage units 54 is electrically connected between an output of a corresponding one relay 48 and the non-inverting input terminal (+) of a corresponding one voltage follower 50. Each of the relays 48 is also electrically connected to the microcomputer 60.

Each of the voltage followers 50 has an output terminal and an inverting input terminal (−) short-circuited to the output terminal.

Specifically, each of the voltage followers 50 has a high input impedance that allows a current inputted to the non-inverting input terminal from the output terminal of a corresponding one of the voltage dividers D to become nearly zero. This reduces a leakage current from the output terminal of each of the voltage dividers D that is dividing the voltage across a corresponding one of the adjacent cells B1 to B6. This makes it possible to measure the divided value of the voltage across each of the adjacent cells B1 to B6 based on the resistances of the first and second resistors 44 and 46 of a corresponding one of the voltage dividers D with high accuracy.

The output terminal of each of the voltage followers 50 is electrically connected to an input terminal of a corresponding one of the TAD converters 52, these TAD converters 52 will be abbreviated as "TADs 52" hereinafter. This allows the divided value of the voltage across each of the adjacent cells B1 to B6 to be applied to the input terminal of a corresponding one of the TADs 52 as an input analog voltage signal Vin. The input analog voltage signal Vin will be referred to as "input voltage signal Vin" hereinafter.

The microcomputer 60 is electrically connected to each of the relays 48, each of the TADs 52, a line L1 electrically connected to a positive terminal of the cell B1, and a line L2 electrically connected to a negative terminal of the cell B6. The connection between the microcomputer 60 and the series-connected cells B1 to B6 allows the microcomputer 60 to operate on a power supply voltage (power) based on the series-connected cells B1 to B6.

Each of the TADs 52 is electrically connected across a corresponding one cell Bj and is configured to operate on the voltage across a corresponding one cell Bj as its power supply voltage. Specifically, a positive power supply terminal and a ground terminal of each of the TADs 52 are electrically connected to the positive terminal and the negative terminal of a corresponding one cell Bj, respectively. One voltage follower 50 also operates on the voltage across a corresponding one cell Bj as its power supply voltage.

Figure 4:
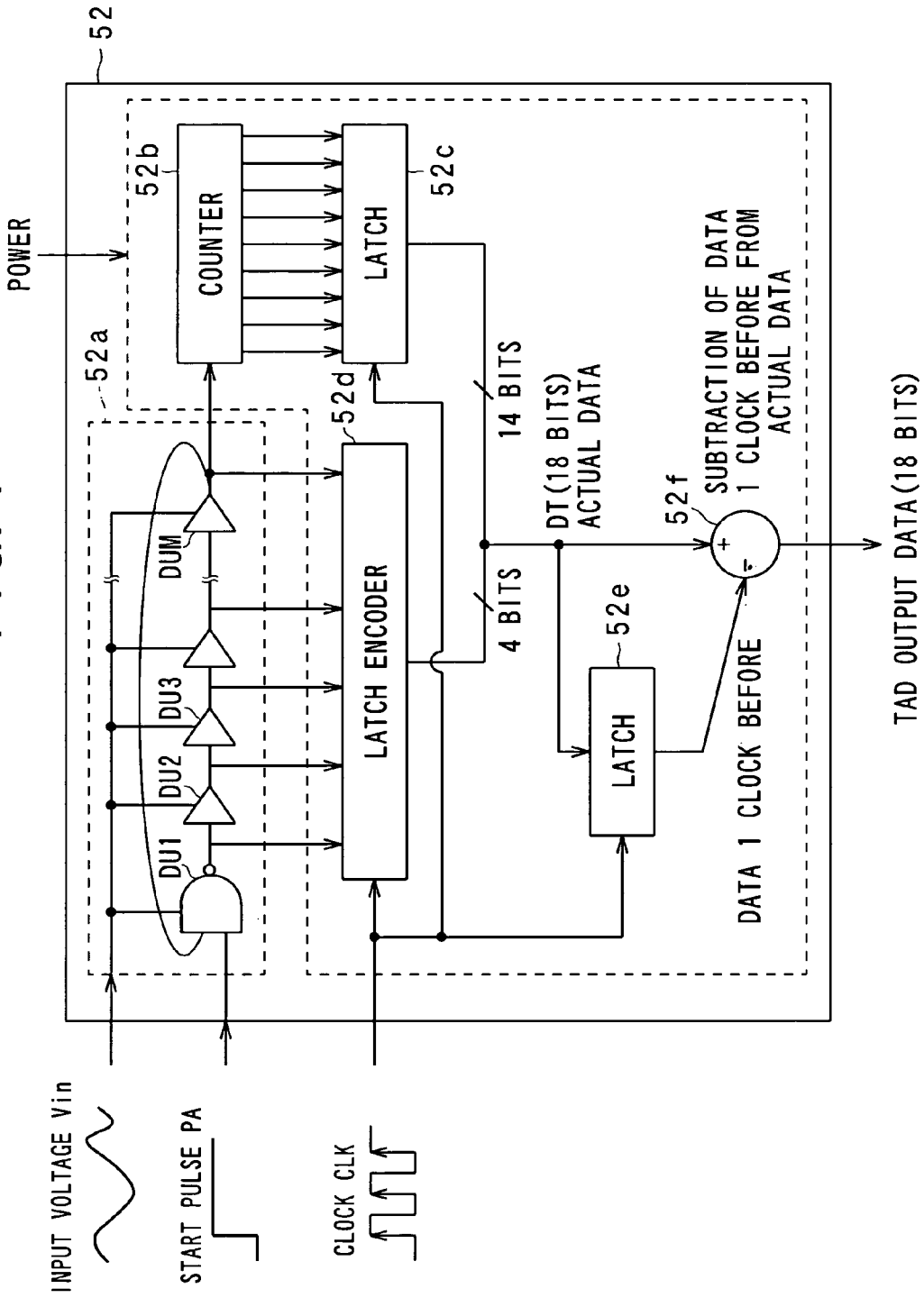
FIG. 4 is a circuit diagram schematically illustrating an example of the structure of a time A/D converter illustrated in FIG. 3.

Referring to FIG. 4, each of the TADs 52 includes, as a voltage-controlled oscillator, a ring oscillator 52a and a digital-data generator DG.

The ring oscillator 52a consists of a number of M of delay units DU that corresponds to the number M of stages in delay. The M is set to an odd number. Each of the delay units DU has a negative gain.

Specifically, as the delay units DU, a NAND gate DU1 and an even number of logical inverters DU2 to DUM are preferably used.

The NAND gate DU1 has one and the other input terminals and one output terminal, and is designed such that a start pulse PA given from the microcomputer 60 is inputted to the one input terminal (pulse input terminal) thereof. The start pulse PA serves as a trigger signal for triggering oscillation operation of the ring oscillator 52a. For example, when the start pulse PA rises from a logical low (L) to a logical high (H), the ring oscillator 52a is triggered to start oscillation operation during the start pulse PA being kept logical high.

The NAND gate DU1 and the inverters DU2 to DUM are connected in series in a ring. Specifically, the other input terminal of the NAND gate DU1 and an output terminal of the final stage of inverter DUM are connected to each other so that the NAND gate DU1 and the inverters DU2 to DUM are serially connected to have a ring-like structure, constituting the ring oscillator 52a.

The input terminal of each of the TADs 52 to which the input voltage signal Vin outputted from a corresponding one of the voltage followers 50 is applied serves as a power supply terminal thereof.

For this reason, an inverting operation time of each of the delay units DU depends on the level of the input voltage signal Vin, and therefore, the delay time of each delay unit DU depends on the level of the input voltage signal Vin.

Specifically, when an output of the last stage DUM has the logical high and the start pulse PA with the logical high is inputted to the WAND gate DU1, an output of the NAND gate DU1 is the logical low, and an output of the logical inverter DU2 is the logical high Thus, because the number of delay units DUs is an odd number, an output of the last stage DUM is the logical low, The output with the logical low is returned to be inputted to the NAND gate DU1 so that an output thereof is the logical high, and an output of the logical inverter DU2 is the logical low. Thus, an output of the last stage DUM is the logical high, in other words, the output of the last stage DUM is logically inverted.

While the start pulse PA is logical high, the logical inversion of the output of the last stage DUM is repeated so that the ring oscillator 52a oscillates.

The digital-data generator DG includes a counter 52b, a latch 52c, a latch encoder 52d, a latch 52e, and a subtractor 52f.

The counter 52b is electrically connected to the output terminal of the final stage DUM and operative to:

count the number of logical inversion of the output of the final stage DUM (ring oscillator 52a) as a count number of 14 bits.

The latch 52c is electrically connected to the counter 52b and operative to latch the count value of the counter 52b every rising edge of a clock (a series of regulator pulses) CLK applied from the CPU 30 to a sequentially selected one of the TADs 52 by the signal division and switch circuit 28. Increase of the count value between temporally adjacent rising edges of the clock CLK allows a delay time by the ring oscillator 52a to be quantified.

The latch encoder 52d is electrically connected to an output terminal of each of the delay units DU1, DU2, DU3, . . . , DUM-1. The latch encoder 52d is operative to, every rising edge of the clock CLK, receive the logical output of each of the delay units DU1 to DUM-1 and encode the received outputs to binary data of, for example, 4 bits. This allows a delay time by the ring oscillator 52a shorter than the delay time of one logical inversion to be quantified.

The output of the latch 52c and the output of the latch encoder 52d are so combined with each other as to generate binary data DT of is bits. The higher-order bits of the binary data DT is 14 bits of the binary data outputted form the latch 52c, and the lower-order bits thereof is 4 bits of the binary data outputted from the latch encoder 52d.

The latch 52e is electrically connected to each of the latch encoder 52d and the latch 52c and operative to latch the binary data DT of 18 bits every rising edge of the clock CLK.

The subtractor 52f is electrically connected to the latch 52e and each of the latch 52c and the latch encoder 52d. The subtractor 52f is operative to subtract the latched binary data DT' from actual binary digital data DT to thereby output digital data (TAD output data) of 18 bits; this latched binary data DT' is one clock cycle before the actual binary data DT.

The TAD output data represents the number of logical inversion of the output of the ring oscillator 52a in binary format with an accuracy of "1/M"; M is the number of the delay units DU1 to DUM of the ring oscillator 52a.

As described above, because the delay time of each of the delay units DU1 to DUM depends on the input voltage signal Vin, an oscillating frequency of the ring oscillator 52a depends on the level of the input voltage signal Vin. The TAD output data from each TAD 52 is therefore configured to be proportional to the level of the input voltage signal Vin.

The TAD output data from each TAD 52 is individually transmitted through the insulator 26 and the signal division and select unit 28 to the CPU 30.

Note that a relationship between the input voltage signal Vin and the TAD output data from a TAD 52 has a nonlinear characteristic, and the nonlinear characteristic depends on temperature. The nonlinear output characteristic of a TAD converter 52 may be different from that of another TAD converter 52.

For these reasons, in order to grasp accurate values of the input voltage signal Vin based on the TAD output data from each TAD 52, it is desired to obtain the relationship between the input voltage signal Vin in digital format and the TAD output data from each of the individually TADs 52. Particularly, the relationship between the input voltage signal Vin in digital format and the TAD output data from each of the individual TADs 52 is preferably devised to include the temperature dependence of a corresponding one of the individual TADs 52.

In order to achieve the requirements, each of the block monitor ICs 40 is configured to cyclically generate and update a characteristic curve approximating a reference input-output characteristic curve of each TAD 52. The reference input-output characteristic curve represents an actual input-output characteristic curve of a TAD 52, which will be referred to as TAD 52a1, at a predetermined reference temperature.

Specifically, an approximating characteristic curve to the reference input-output characteristic curve of the TAD 52a1 is generated based on a plurality of values of the TAD output data from the TAD 52a1 upon a plurality of reference voltage value (level) Vref1 to Vrefn being inputted to the TAD 52a1, respectively.

In the first embodiment, each of the block monitor ICs 40 is configured to:

cyclically generate and update the approximating characteristic curve for each of the TADs 52 based on actually inputted values of the input voltage signal Vin to a corresponding one of the TADs 52 and corresponding actually outputted values of the TAD output data from the corresponding one of the TADs 52.

For this reason, the approximating characteristic curve for each of the TADs 52 can properly reflect the output digital data thereof at an actual temperature around a corresponding one of the TADs 52; this actual temperature fluctuates.

In addition, because the approximating characteristic curves are generated and updated for the respective individual TADs 52, they can reflect individual input-output characteristic differences among the TADs 52.

More specifically, as described above, each of the block monitor ICs 40 is equipped with six reference voltage units 54 provided for six adjacent cells B1 to B6, respectively.

Figure 5:
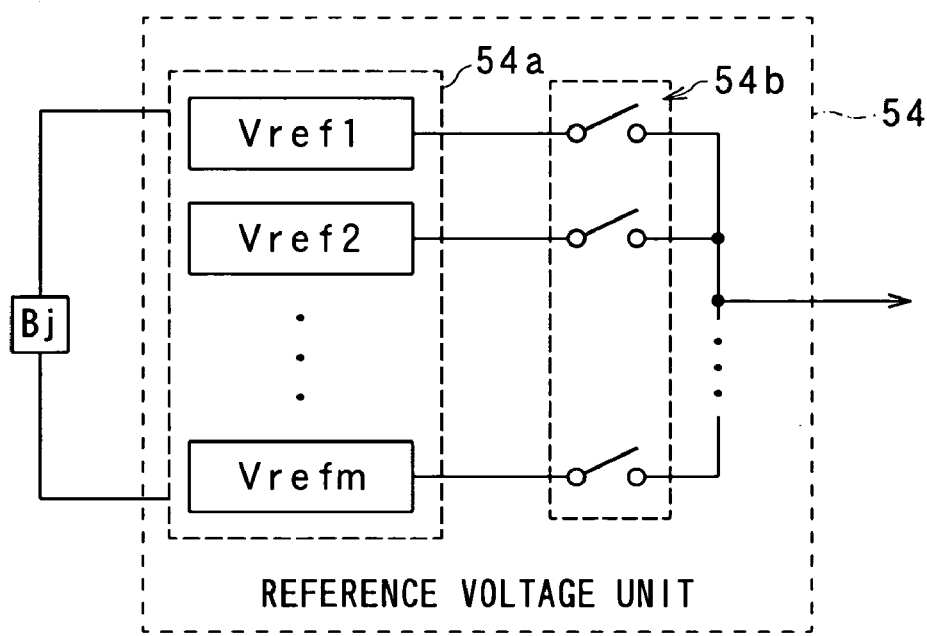
FIG. 5 is a circuit diagram schematically illustrating an example of the structure of a reference voltage unit illustrated in FIG. 3.

FIG. 5 schematically illustrates an example of the circuit structure of each of the reference voltage units 54, Referring to FIG. 5, each of the reference voltage units 54 is provided with a voltage generator 54a for generating a plurality of preset reference voltage values Vref1, Vref2, Vref3, . . . , Vrefn that are different from each other within a preset voltage range, and with a multiplexer 54b. The multiplexer 54b includes a plurality of switches 54c the number of which is identical to the number (n) of the reference voltage values Vref1, Vref2, . . . , Vrefn.

The voltage generator 54a of each of the reference voltage units 54 is electrically connected across a corresponding cell Bj. The voltage generator 54a of each of the reference voltage units 54 works to generate the plurality of reference voltage values Vref1 Vref2, Vref3, . . . , Vrefn within the preset voltage range based on the voltage across a corresponding cell Bj by, for example, stepping down the voltage thereacross.

For example, the reference voltage values Vref1, Vref2, . . . , Vrefn are in order of increasing voltage value. That is, the upper lit of the preset voltage range is the reference voltage value Vrefn, and the lower limit thereof is the reference voltage Vref1.

When a plurality of reference voltage values Vrefi (i=1, 2, 3, . . . , n) are sequentially applied to a corresponding one TAD 52 as a target TAD 52, the target TAD 52 generates a plurality of items of TAD output data corresponding to the reference voltage values Vrefi, respectively, and outputs the plurality of items of TAD output data to the microcomputer 60.

The microcomputer 60 includes a storage unit 62, an approximation characteristic curve generator (generator) 64, a rewritable ROM (Read Only Memory) 66, a voltage calculator 68, a control unit 70, and a selector 72. The elements 62, 64, 66, 68, 70, and 72 can be implemented, in the microcomputer 60, as hardware modules and/or software modules to be executed by the microcomputer 60.

The plurality of items of TAD output data from the target TAD 52 are stored in the storage unit 62. The generator 64 works to generate an approximation characteristic curve for the target TAD 52 based on the plurality of items of TAD output data stored in the storage unit 62.

Specifically, first, the generator 64 works to evaluate the reliability of the plurality of items of TAD output data stored in the storage unit 62. This evaluation aims at determining whether at least one of the reference voltage values Vrefi is improperly generated due to fluctuations of the voltage across a corresponding battery cell Bj.

For example, in the ROM 66, information relative to the preset range within which the value of the TAD output data corresponding to the inputted reference voltage value Vrefi is allowed is stored beforehand. The generator 64 works to evaluate the reliability of each item of TAD output data by determining whether each item of TAD output data for a corresponding one reference voltage value Vrefi is within the range for a corresponding one item of TAD output data.

For example, when the values of some items in the plurality of items of TAD output data are determined to be low in reliability, the generator 64 works to use the remaining items of TAD output data to thereby generate an approximate characteristic curve for the target TAD 52.

Specifically, the generator 64 is configured to determine an appropriate approximating characteristic curve for the target TAD 52 by:

associating, for each TAD 52, each of the items D1 to Dn of the TAD output data with a corresponding reference voltage value Vrefi in digital format on a preset function curve, such as a cubic function curve, to thereby generate an appropriate approximating characteristic curve for each TAD 52.

The voltage calculator 68 works to calculate, as final detected voltage data corresponding to the input voltage signal Vin, a corrected value of the TAD output data from the target TAD 52. This calculation is based on: an uncorrected value of the TAD output data therefrom when the divided value of the voltage across the corresponding cell Elk and the generated approximating characteristic curve of the target TAD 52. Then, the voltage calculator 68 works to output the final detected voltage data to the CPU 30.

The control unit 70 is operative to output the start pulse PA to each of the TADs 52 in response to control signals sent from the CPU 30 and sequentially switched by the signal division and switch circuit 28. The selector 72 is operatively connected to each of the reference voltage units 54 and each of the relays 48. The control unit 70 is operative to cause the selector 72 to:

select any one of the output voltage from the reference voltage unit 54 and the divided voltage of the voltage across the corresponding cell Bj; and select, as the output voltage of the reference voltage unit 54, any one of the reference voltage values Vref1 to Vrefn.

Figure 6:
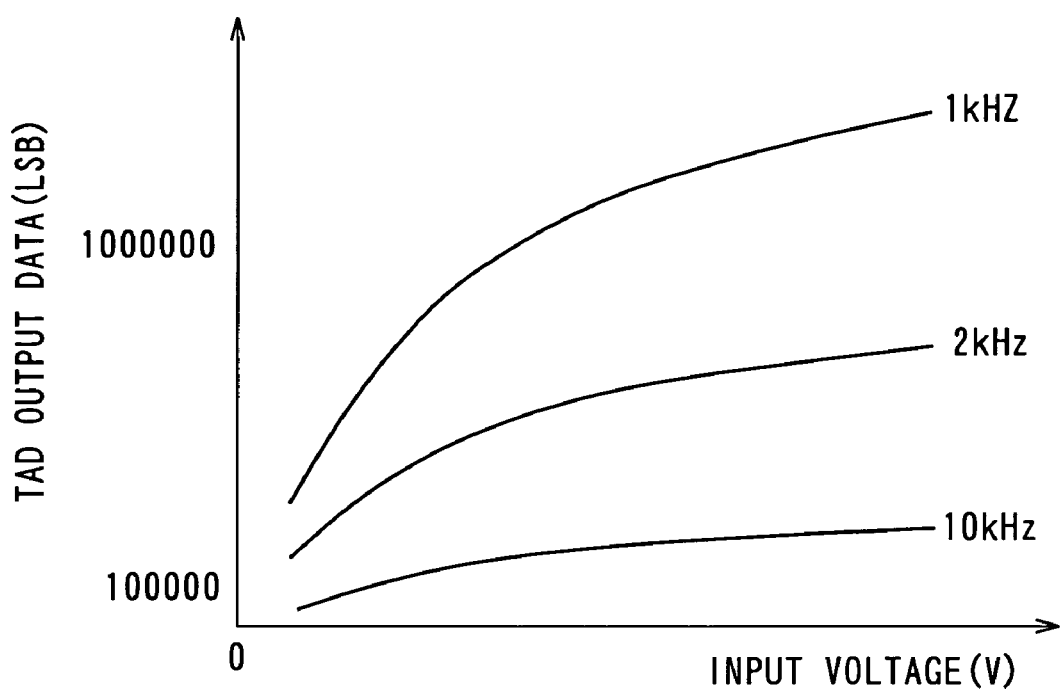
FIG. 6 is a graph schematically illustrating input-output characteristic curves of a TAD while the frequency of a clock is changed according to the first embodiment.

FIG. 6 schematically illustrates input-output characteristic curves of a TAD 52 while the frequency of the clock CLK is changed. The input-output characteristic curve(s) will be referred to as "output characteristic curve(s)" hereinafter.

As the output characteristic curves of a TAD 52, the relationships between variables of the input voltage signal Vin in units of volts (V) and those of the TAD output data in units of LSB (least Significant Bit) are plotted as nonlinear curves that vary depending on the frequency of the clock CLK.

Referring to FIG. 6, the higher the frequency of the clock CLK is, the lower the TAD output data is. In other words, the value of the TAD output data is inversely proportional to the frequency of the clock CLK, This is because the more the frequency of the clock CLK increases, the shorter the interval between adjacent rising edges of the clock CLX required to count the number of logical inversion of the output of the ring oscillator 52a is. This causes reduction of the number of logical inversion to be counted by the counter 52b.

Thus, each TAD 92 is configured such that, the more the frequency of the clock CLK increases, the more reduced the TAD-output data detection time and the resolution of detection of the TAD-output data are.

In contrast, the more the frequency of the clock CLK increases, the more reduced the number of bits in the TAD output voltage effective to express the input voltage signal Vin is. This reduces the processing load required to car out the voltage detecting processes based on the TAD output data from the TAD 52.

The CPU 30 according to the first embodiment is therefore configured to determine, based on the output characteristics of the TAD 52 with respect to the frequency of the clock CLK the frequency of the clock CLK so as to meet the order of priorities of the requirement to reduce the voltage-detection time of each cell Bij of the high-voltage battery 14 and the requirement to increase the resolution of detection of the voltage across each cell Bij.

The order of priorities of the requirement to reduce the TAD-output data detection time and the requirement to increase the resolution of detection of the TAD-output data will be described hereinafter.

Figure 7:
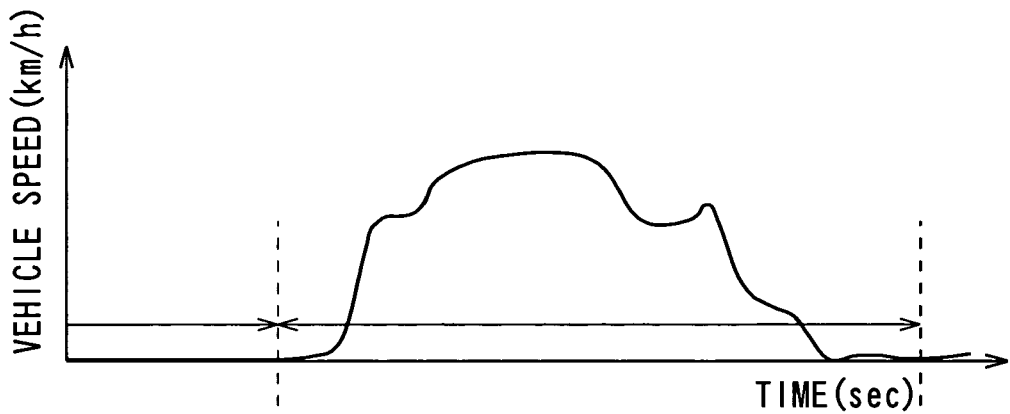
FIG. 7 is graphs schematically illustrating variations in the state of a high-voltage battery illustrated in FIG. 2 according to the first embodiment.
Figure 7:
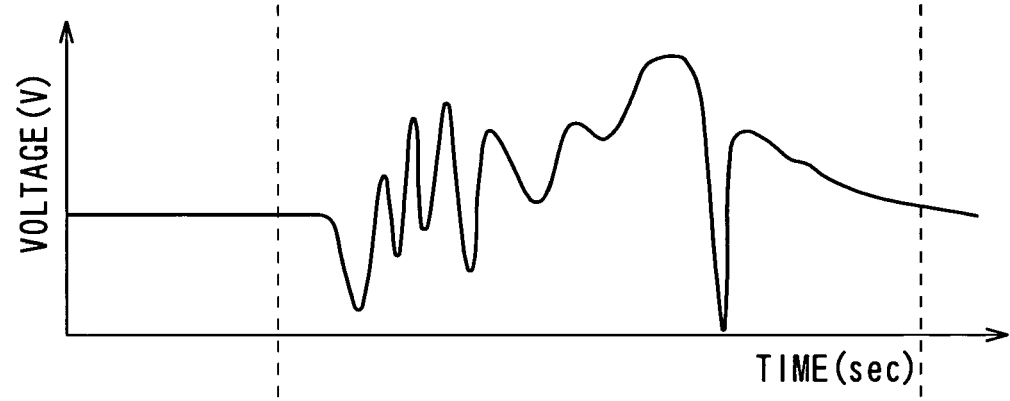
Figure 7:
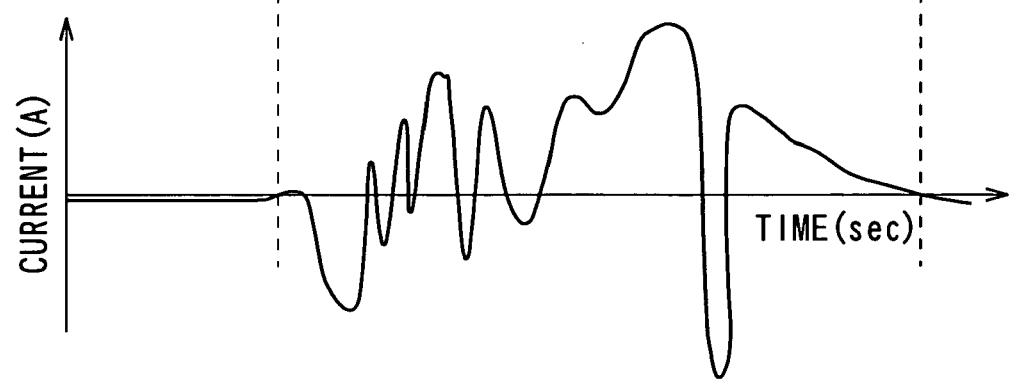

FIG. 7 schematically illustrates variations in the state of the high-voltage battery 14. Specifically, (a) of FIG. 7 represents the change in the state of the speed [km/h] of the hybrid vehicle mV over time [sec], and (b) of FIG. 7 represents the change in the voltage [V] of the high-voltage battery 14 over time [sec]. In addition, (c) of FIG. 7 represents the change [Amperes: A] in currents flowing into and out of the high-voltage battery 14 over time [sec].

As illustrated in FIG. 7, when the hybrid-vehicle speed is zero, the voltage of the high-voltage battery 14 and the currents flowing into and out of the high-voltage battery 14 are stable, and the currents flowing into and out of the high-voltage battery 14 is substantially zero.

In contrast, when the hybrid-vehicle speed is greater than zero, the currents flowing into and out of the high-voltage battery 14 fluctuates widely, causing the voltage of the high-voltage battery 14 to fluctuate widely.

Figure 8:
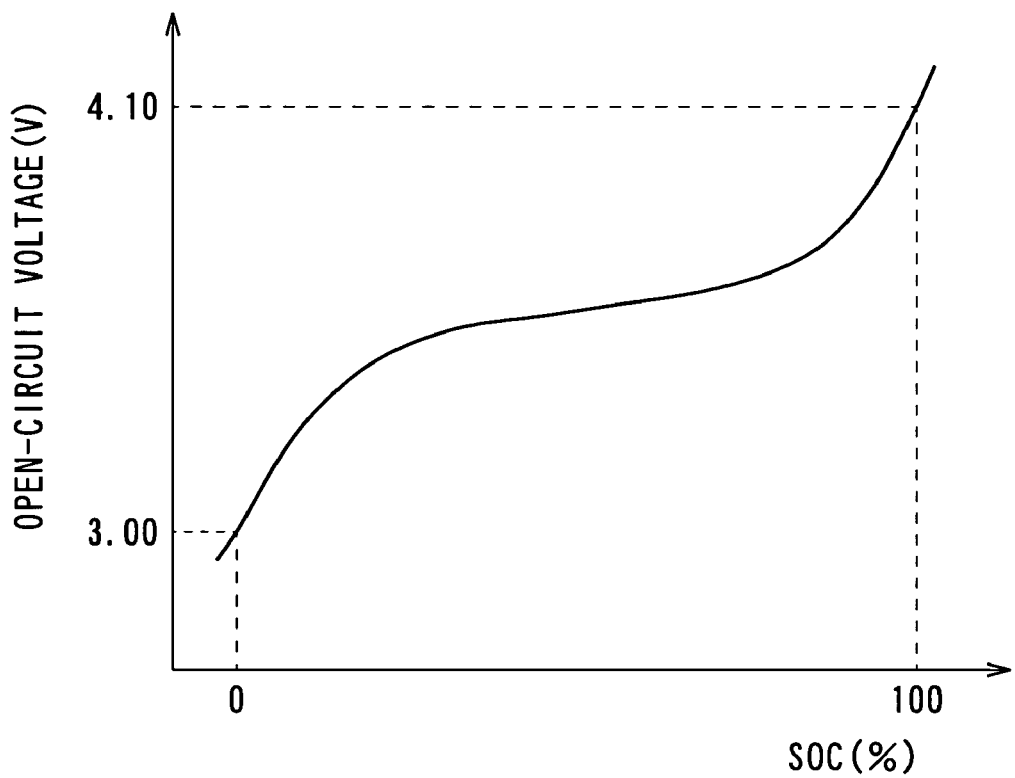
FIG. 8 is a graph schematically illustrating a relationship between a variable of an SOC and a variable of an open-circuit voltage according to the first embodiment.

In order to properly grasp the SOC (State Of Charge) of the high-voltage battery 14, it is convenient to detect an open-circuit voltage of the high-voltage battery 14 when its terminals are opened. This is because the open-circuit voltage of a battery and the SOC thereof have one-to-one correspondence therebetween (see FIG. 8).

In contrast, when large currents flow into and out of the high-voltage battery 14, the open-circuit voltage of the high-voltage battery 14 can be estimated based on the large currents flowing into and out of the high-voltage battery 14 and an internal resistance thereof. However, it may be difficult to detect, based on the SOC, the voltage of the high-voltage battery 14 due to polarization and the like. Note that the SOC of the high-voltage battery 14 means a physic quantity obtained by quantifying the discharging capability thereof. More specifically, the SOC of the high-voltage battery 14 means a physical quantity obtained by quantifying the ratio of the actual charge in the battery 14 to the full charge thereof.

When the speed of the hybrid vehicle HV is equal to or lower a specified speed α, such as substantially zero, the currents flowing into and out of the high-voltage battery 14 are substantially zero, which allows the voltage of the high-voltage battery 14 and the SOC thereof to have one-to-one correspondence therebetween. For this reason, in this case, the requirement to detect the SOC of the high-voltage battery 14 with high accuracy increases. In other words, the priority of the requirement to increase the resolution of detection of the voltage across each cell Bij is more important than the requirement to reduce the voltage-detection time of each cell Bij.

Otherwise, when the speed of the hybrid vehicle HV is greater than the specified speed α, such as zero, the currents flowing into and out of the high-voltage battery 14 can become greater. This makes it difficult to detect the SOC of the high-voltage battery 14 with the use of the open-circuit voltage thereof. In this case, because the voltage of the high-voltage batter 14 fluctuates widely, the priority level of the requirement to reduce the voltage-detection time of each cell 34 of the high-voltage battery 14 is higher than that of the requirement to increase the resolution of detection of the voltage across each cell Bij.

Moreover, under large currents flowing into and out of the high-voltage battery 14, overcharge and/or over-discharge of each cell Bij may occur. For is reason, it is required to monitor whether overcharge and/or over-discharge of each cell Bij occurs.

Particularly, when each cell Bij consists of a lithium ion secondary cell, because overcharge and/or over-discharge of lithium ion secondary cells can easily reduce the reliability thereof, the priority level of the requirement to reduce the voltage-detection time of each cell Bij of the high-voltage battery 14 is extremely high. Achievement of only the purpose of determining whether overcharge or over-discharge occurs in at least one cell Bij of the high-voltage battery 14 does not need a higher resolution of detection of the voltage across each cell Bij.

Figure 9:
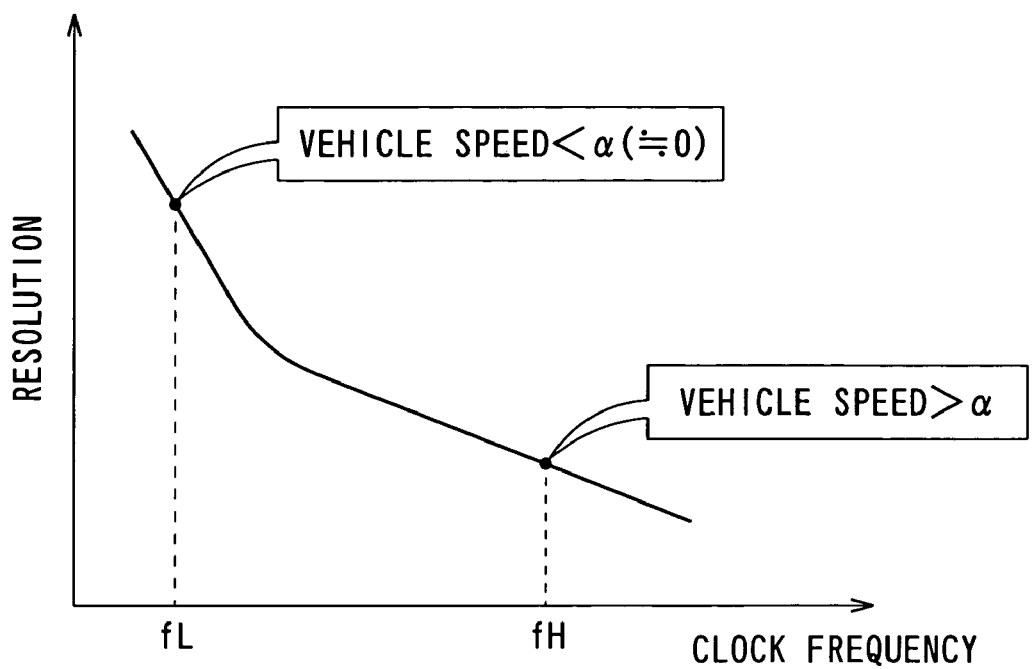
FIG. 9 is a graph schematically illustrating a relationship between a variable of the frequency of a clock and a variable of a resolution of detection of a voltage across each cell according to the first embodiment.

In view of the circumstances set forth above, the batter monitor 20 is configured to set the frequency of the clock CLK to a preset low frequency value fL when the speed of the hybrid vehicle HV is equal to or lower than the specified speed α, such as substantially zero, thus giving more priority to the increase in the resolution of detection of the voltage across each cell Bij than the reduction in the voltage-detection time of each cell Bij (see FIG. 9).

Otherwise, when the speed of the hybrid vehicle HV is greater than the specified speed α, the battery monitor 20 is configured to set the frequency of the clock CLK to a preset high frequency value fH higher than the low frequency value fL, thus giving more priority to the reduction in the voltage-detection time of each cell Bij than the increase in the resolution of detection of the voltage across each cell Bij (see FIG. 9).

This clock-frequency control meets both:

the requirement to increase the resolution of detection of the voltage across each cell Bij when it has more priority than the requirement to reduce the voltage-detection time of each cell Bij; and the requirement to reduce the voltage-detection time of each cell Bij when it has more priority than the requirement to increase the resolution of detection of the voltage across each cell Bij.

Next, a voltage detecting routine to be executed by the battery monitor 20 according to the first embodiment will be described hereinafter. The voltage detecting routine is designed to be repeatedly executed by the batter monitor 20 at a preset cycle in accordance with a voltage detecting program stored in the battery monitor 20.

Figure 10:
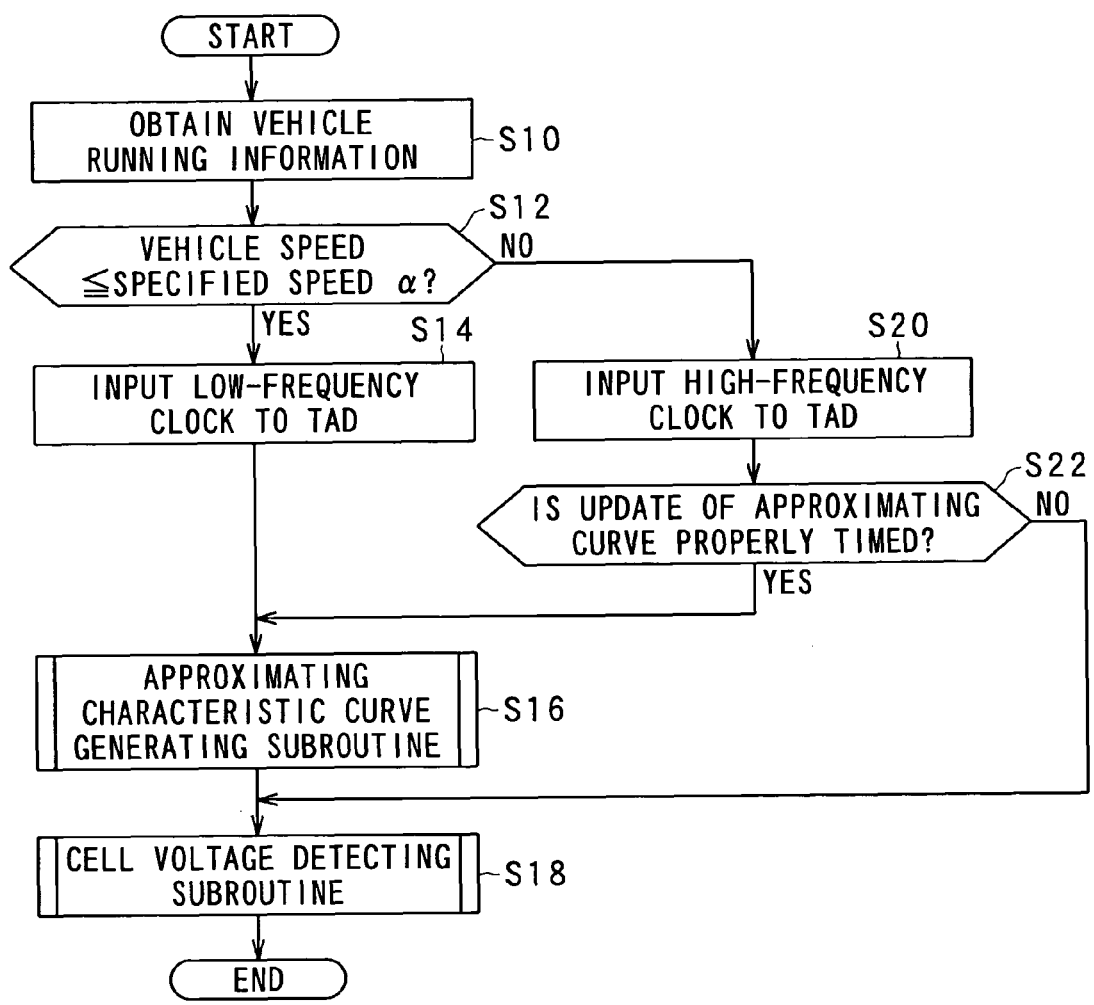
FIG. 10 is a flowchart schematically illustrating a voltage detecting routine to be executed by the battery monitor system according to the first embodiment.

When launching the voltage detecting routine, the battery monitor 20 obtains a signal indicative of an actual speed of the hybrid vehicle HV as an example of vehicle running information in step S10 of FIG. 10. For example, the signal indicative of the speed of the hybrid vehicle HV is measured by a vehicle speed sensor S and periodically or continuously sent therefrom to the battery monitor 20 via the engine ECU 24.

Next, the battery monitor 20 determines whether the actual speed of the hybrid vehicle HV is equal to or lower than the specified speed a in step S12. The operation in step S12 is to determine whether the priority level of the requirement to reduce the voltage-detection time of each cell Bij of the high-voltage battery 14 is higher than that of the requirement to increase the resolution of detection of the voltage across each cell Bij.

Upon determining that the speed of the hybrid vehicle is equal to or lower than the specified speed α (YES in step S12), the battery monitor 20 sets, to the low frequency value fL, the frequency of the clock CLK to be given to each TAD 52 in step S14. Next, in step S16, the battery monitor 20 carries out an approximating characteristic curve generating subroutine to thereby generate an approximating characteristic curve for each TAD 52 set fort above.

Thereafter, in step S18, the battery monitor 20 carries out a cell voltage detecting subroutine to thereby measure a value of the voltage across each cell Bij set forth above.

Otherwise, upon determining that the speed of the hybrid vehicle is greater than the specified speed α (NO in step S12), the battery monitor 20 sets, to the high frequency value AH the frequency of the clock CLK to be given to each TAD 52 in step S20. Next, in step S22, the battery monitor 20 determines whether update (generation) of the approximating characteristic curve is properly timed.

The operation in step S22 is provided in the voltage detecting routine in consideration that) to detect the voltage across each cell Bij with the approximating characteristic curve for each TAD 52 being updated, a longer period is required.

Specifically, when the speed of the hybrid vehicle HV is greater than the specified speed α, the reduction in the voltage-detection time of each cell Bij has a greater priority, and therefore, it is desired to limit the update (detection) of the approximating characteristic curve.

For example, in step S22, when the number of sequential execution of the voltage detecting routine with the frequency of the clock CLK being set to the high frequency value fH is equal to or greater than a preset value, the battery monitor 20 determines that update (generation) of the approximating characteristic curve is properly timed (YES in step S22). Then, the battery monitor 20 proceeds to step S16.

Otherwise, when the number of sequential execution of the voltage detecting routine with the frequency of the clock CLK being set to the high frequency value fH is lower than the preset value, the battery monitor 20 determines that update (generation) of the approximating characteristic curve is not properly timed (NO in step S22). Then, the battery monitor 20 proceeds to step S18 while skipping step S16, and carries out the cell voltage detecting subroutine based on a previously generated approximating characteristic curve at the frequency of the clock CLK being set to the high frequency value fH.

Note that the operations in steps S10 to S14 and S20 are carried out, for example, in the CPU 30. For example, referring to FIG. 2, the CPU 30 functionally comprises a resolution determiner 30a, a clock frequency setter 30b, and a clock generator 30c. The resolution determiner 30a consists of a running state determiner 30a1. The running state determiner 30a1 carries out the operations in steps S10 and S12, and the clock frequency setter 30b and the clock generator 30c carry out the operations in steps S14 and S20, respectively.

The operations in steps S16, S18, and S22 are carried out in, for example, each of the block monitor ICs 40. Specifically, the controller 70, the selector 72, the storage unit 62, the ROM 66, and the generator 64 carry out the operation in step S16. The controller 70, the selector 72, the storage unit 62, and the voltage calculator 68 carry out the operation in step S18.

Figure 11:
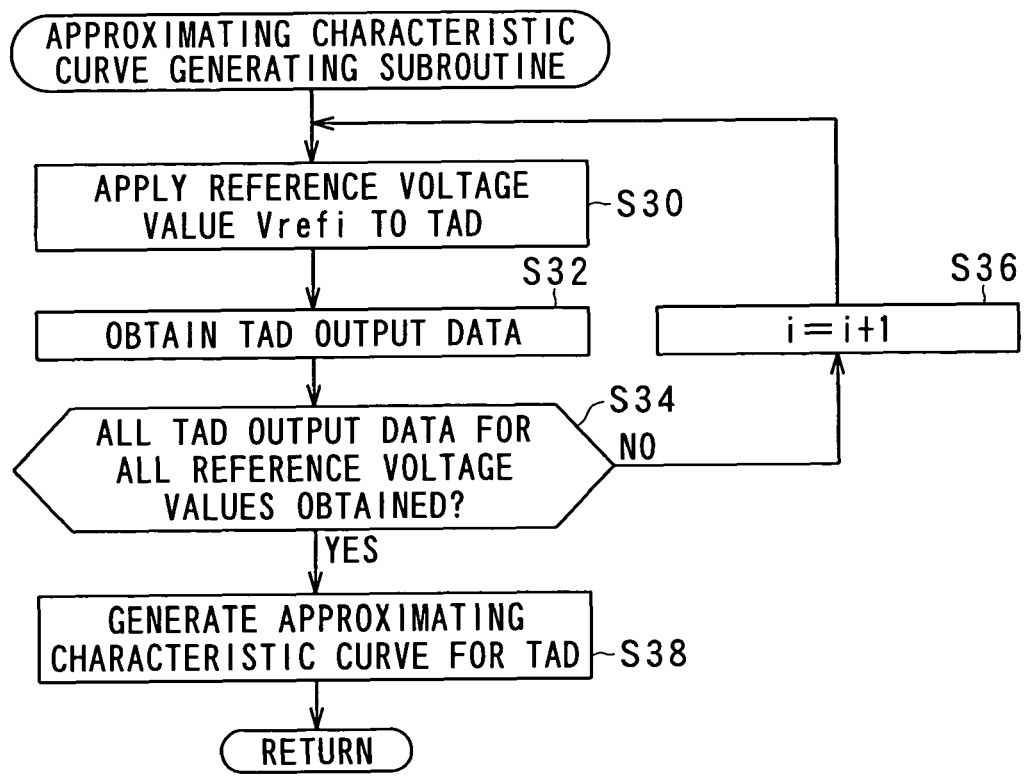
FIG. 11 is a flowchart schematically illustrating a subroutine of step S16 illustrated in the voltage detecting routine illustrated in FIG. 10.

Next, operations to be executed by a block monitor IC 40 for the cell Bij in the approximating characteristic curve generating subroutine of step S16 will be fully described in accordance with FIG. 11.

In the subroutine of step S16, the block monitor IC 40 for the cell Bij controls each relay 48 to select the output voltage of a corresponding one reference voltage unit 54 based on a reference voltage value Vrefi (index i=1, 2, ..., m) in step S30. This applies the output voltage of the corresponding one reference voltage unit 54 to the noninverting input terminal of a corresponding one voltage follower 50 in step S30.

At the moment immediately after shifting to the subroutine of step S16 from the main routine, the block monitor IC 40 sets the index "i" to "1" to thereby select the reference voltage Vref1 as the reference voltage value Vrefi in step S300

Next, the block monitor IC 40 obtains an item Di of the TAD output data from each TAD 52 upon the reference voltage value Vrefi outputted from a corresponding one voltage follower 50 being inputted to each TAD 52 in step S32. In step S32, the block monitor IC 40 stores the item of the TAD output data from each TAD 52 in the storage unit 62 in step S32.

Subsequently, in step S34, the block monitor IC 40 determines whether:

all of the reference voltage values Vref1 to Vrefn have been applied to each TAD 52 through a corresponding one voltage follower 50 (first condition); and the items D1 to Dn of the TAD output data from each TAD 52 upon the respective voltage values Vref1 to Vrefn being inputted to each TAD 52 have been obtained (second condition).

When it is determined that at least one of the first and second conditions is not satisfied (the determination in step S34 is NO), the block monitor IC 40 increments the index "i" by 1 to thereby select the reference voltage Vref2 as the reference voltage value Vrefi in step S36. Thereafter, the block monitor IC 40 returns to step S30, and repeats the operations in steps S30 to S36. This allows the items of the TAD output data from each TAD 52 upon the reference voltage values Vref2, Vref3, ..., outputted from a corresponding one voltage follower 50 being inputted to each TAD 52 to be sequentially obtained.

Thus, when the item Dn of the TAD output data from each TAD 52 upon the reference voltage value Vrefn outputted from a corresponding one voltage follower 50 being inputted to each TAD 52 is obtained, the first and second conditions are satisfied (the determination in step S34 is YES).

Next, in step S38, the block monitor IC 40 determines whether the items D1 to Dn of the TAD output data from each TAD 52 for the respective reference voltage values Vref1 to Vrefn are high in reliability.

Upon determining all items D1 to Dn of the TAD output data from each TAD 52 are high in reliability, the block monitor IC 40 calculates, based on each of the reference voltage values Vref1 to Vrefn and the items D1 to Dn of the TAD output data from each TAD 52, an approximating characteristic curve for each TAD 52.

Otherwise, upon determining some items of the TAD output data from each TAD 52 are high in reliability, the block monitor IC 40 calculates, based on some items of TAD output data for leach TAD 52 and some reference voltage values corresponding to some items of TAD output data, an approximating characteristic curve for each TAD 52. In the first embodiment, all items D1 to Dn of the TAD output data from each TAD 52 are assumed to be high in reliability.

Next, in step S38, for each TAD 52, the block monitor IC 40 associates each of the items D1 to Dn of the TAD output data with a corresponding reference voltage value Vrefi in digital format on a preset function curve, such as a cubic function curve to thereby generate an approximating characteristic curve for each TAD 52. The block monitor IC 40 stores the approximating characteristic curve for each TAD 52 in the storage unit 62 in step S38.

Figure 12:
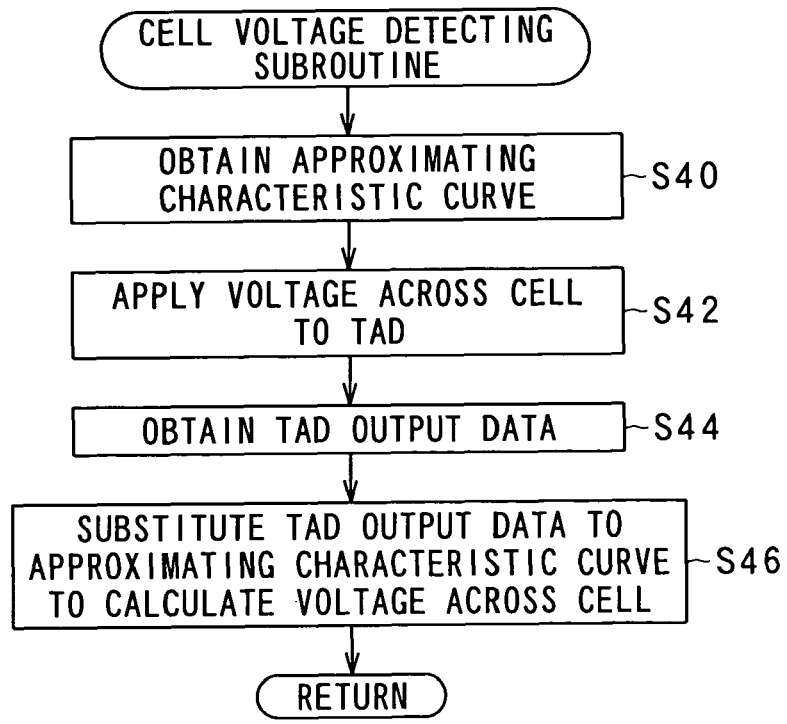
FIG. 12 is a flowchart schematically illustrating a subroutine of step S18 illustrated in the voltage detecting routine illustrated in FIG. 10.

Next, operations to be executed by a block monitor IC 40 for the cell Bj in the cell voltage detecting subroutine of step S18 will be fly described in accordance with FIG. 12.

In the subroutine of step S18, in step S40, the block monitor IC 40 obtains the approximating characteristic curve for each TAD 52 generated in step S16 and stored in the storage unit 62.

In step S40, when the clock CLK with the high frequency value fH is inputted to each TAD 52 and the determination in step S22 of the main routine is NO, the block monitor IC 40 obtains the approximating characteristic curve for each TAD 52 previously stored in the storage unit 62. The approximating characteristic curve for each TAD 52 previously stored in the storage unit 62 has been generated when the clock CLK with the high frequency value fH is inputted to each TAD 52.

Next, the block monitor IC 40 controls each relay 48 to select the voltage at a corresponding output terminal T in step S42. This applies the divided value of the voltage across each cell Bij to the non-inverting input terminal of a corresponding one voltage follower 50 in step S42.

Thereafter, the block monitor IC 40 obtains the item of the TAD output data from each TAD 52 upon the divided value of the voltage across a corresponding cell Bij outputted from a corresponding one voltage follower 50 being inputted to each TAD 52 in step S44.

Subsequently, in step S46, the block monitor IC 40 substitutes, in the approximating characteristic curve for each TAD 52, the item of the TAD output data from each TAD 52 upon the divided value of the voltage across a corresponding cell Bij being inputted to each TAD 52. This calculates the voltage across a corresponding cell Bij in digital format for each TAD 52; this voltage across a corresponding cell Bij in digital format is associated with the item of f the TAD output data from each TAD 52 on the approximating characteristic curves for each TAD 52.

As fully described above, the battery monitor 20 according to the first embodiment is configured to:

determine whether the priority level of the requirement to reduce the voltage-detection time of each cell Bij of the high-voltage battery 14 is higher than that of the requirement to increase the resolution of detection of the voltage across each cell Bij; and variably set the frequency of the clock CLK to be applied to each TAD 52 based on the result of the determination.

This achieves the first advantage of achieving higher-speed detection of the voltage across each cell Bij with higher accuracy.

The battery monitor 20 according to the first embodiment is configured to determine, based on the speed of the hybrid vehicle, whether the priority level of the reduction in the voltage-detection time of each cell Bij of the high-voltage battery 14 is higher than the increase in the resolution of detection of the voltage across each cell Bij. This achieves the second advantage of improving the reliability of the priority-level determination.

The battery monitor 20 according to the first embodiment is configured to generate information, such as an approximating characteristic curve, indicative of a relationship between the input voltage signal Vin in digital format and the TAD output data for each TAD 52. When a divided value of the voltage across the battery Bij by the first and second resistors 44 and 46 is inputted to a TAD 52, the battery monitor 20 is configured to calculate digit data of the input voltage signal Vin based on the information and TAD output data outputted from the TAD 52. The configuration achieves the third advantage of obtaining the digital data of the input voltage signal Vin with high accuracy.

The battery monitor 20 according to the first embodiment is configured to set:

the frequency of generation of the approximating characteristic curve when the determination that the priority level of the increase in the cell-voltage detected resolution is higher than that of the reduction in the cell-voltage detection time is higher than the frequency of generation of the determination that the priority level of the reduction in the cell-voltage detection time is higher than that of the increase in the cell-voltage detected resolution.

The configuration achieves the fourth advantage of preventing the increase in the time required to detect the voltage across each cell Bij when the hybrid vehicle is running at a high speed.

Second Embodiment

A battery monitor according to the second embodiment of the present invention will be described hereinafter with reference to FIG. 13.

The structure of the battery monitor according to the second embodiment is substantially identical to that of the battery monitor according to the first embodiment except for the following different points. So, like parts between the battery monitors according to the first and second embodiments, to which like reference characters are assigned, are omitted or simplified in description.

A voltage detecting routine to be executed by the battery monitor 20 according to the second embodiment will be described hereinafter. The voltage detecting routine is designed to be repeatedly executed by the batter monitor 20 at a preset cycle in accordance with a voltage detecting program stored in the battery monitor 20.

Figure 13:
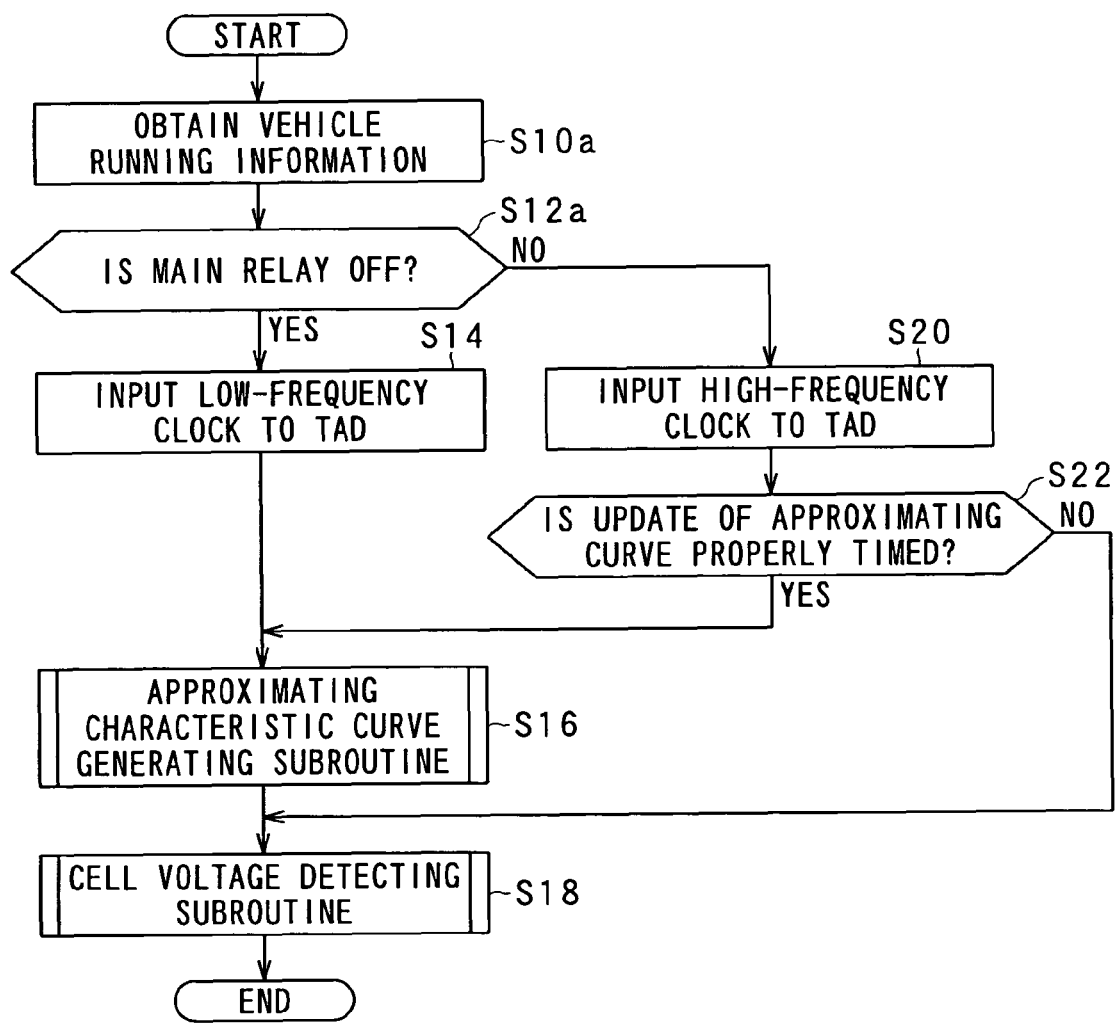
FIG. 13 is a flowchart schematically illustrating a voltage detecting routine to be executed by the battery monitor system according to the second embodiment.

Like operations between the voltage detecting routines illustrated in FIGS. 10 and 13, to which like reference characters are assigned, are omitted or simplified in description.

When launching the voltage detecting routine illustrated in FIG. 13, the battery monitor 20 obtains information indicative of an operating state of the main relay 15 in step S10a.

Based on the obtained information, the battery monitor 20 determines whether the main relay 15 is opened or closed in step S12a. This operation in step S12a is to determine whether electric loads, such as the MG 10, are driven by the high-voltage battery 14.

Upon determining that the main relay 15 is opened, the battery monitor 20 proceeds to step S14, and otherwise, proceeding to step S20.

Specifically, when it is determined that the main relay 1S is opened (is in off state), the battery monitor 20 inputs, to each TAD 52, the clock CLK with the low frequency value fL. Otherwise, when it is determined that the main relay 15 is closed (is in on state), the battery monitor 20 inputs, to each TAD 52, the clock CLK with the high frequency value fH.

The remaining operations of the battery monitor 20 according to the second embodiment are substantially identical to those of the battery module 20 according to the first embodiment.

Specifically the battery monitor 20 according to the second embodiment is configured to determine that the increase in the cell-voltage detected resolution is higher in priority than the reduction in the cell-voltage detection time when electric loads, such as the MG 10, are not driven by the high-voltage battery 14 so that no overcharge and/or over-discharge of each cell Bij occur.

This achieves, in addition to the first, third, and fourth advantages, the fifth advantage of determining that the priority level of the increase in the cell-voltage detected resolution is higher than that of the reduction in the cell-voltage detection time when currents flowing into and out of the high-voltage battery 14 are assumed to be low, such as substantially zero.

The battery monitor 20 according to the second embodiment is configured to carry out the determination based on the information of the open and close condition of the main relay 15. This achieves, in addition to the first, third, and fourth advantages, the seventh advantage of determining whether the priority level of the increase in the cell-voltage detected resolution is higher than that of the reduction in the cell-voltage detection time based on whether electrical loads are driven by the high-voltage battery 14.

Third Embodiment

A battery monitor according to the third embodiment of the present invention will be described hereinafter with reference to FIGS. 14 and 15.

The structure of the battery monitor according to the third embodiment is substantially identical to that of the battery monitor according to the first embodiment except for the following different points. So, like parts between the battery monitors according to the first and third embodiments, to which like reference characters are assigned, are omitted or simplified in description.

The resolution determiner 30a consists of a charge/discharge determiner 30a2 in place of or in addition to the running state determiner 30a1.

A voltage detecting routine to be executed by the battery monitor 20 according to the third embodiment will be described hereinafter. The voltage detecting routine is designed to be repeatedly executed by the batter monitor 20 at a preset cycle in accordance with a voltage detecting program stored in the battery monitor 20.

Figure 14:
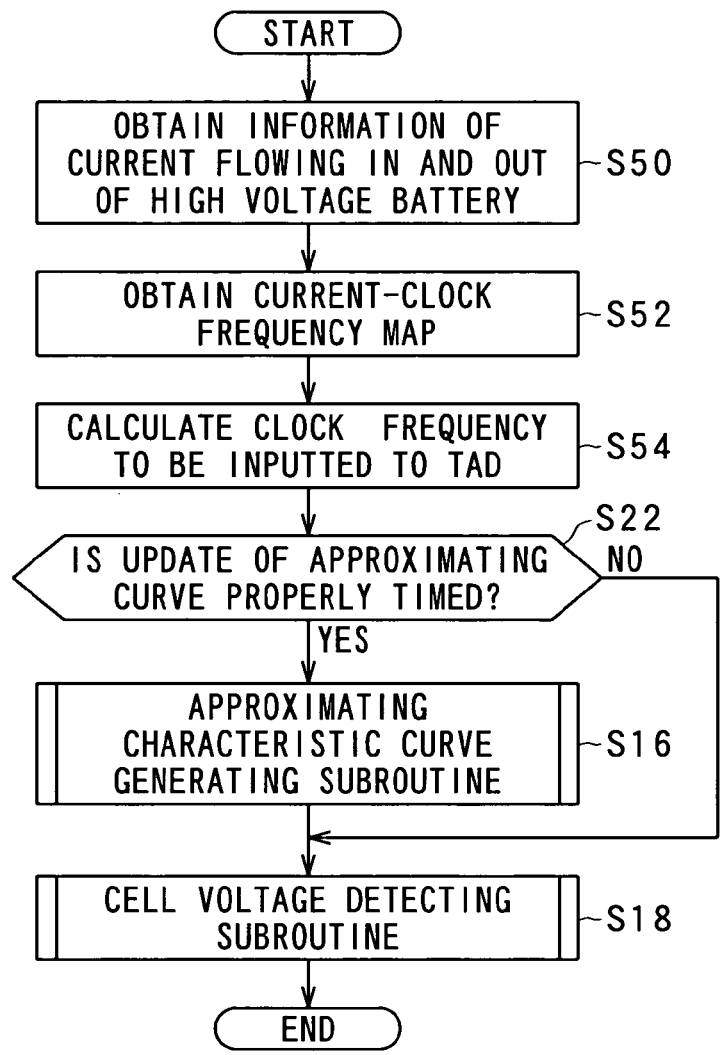
FIG. 14 is a flowchart schematically illustrating a voltage detecting routine to be executed by the battery monitor system according to the third embodiment.

Like operations between the voltage detecting routines illustrated in FIGS. 10 and 14, to which like reference characters are assigned, are omitted or simplified in description.

When launching the voltage detecting routine illustrated in FIG. 14, the battery monitor 20 obtains information indicative of currents flowing into and out of the high-voltage battery 14 in step S50. For example, in step S50, the battery monitor 20 receives the data indicative of currents flowing into and out of the high-voltage battery 14 sent from the current sensor 22 in step S50.

Next, the battery module 20 obtains a first map representing a relationship between a variable of the frequency of the clock CLK and a variable of an absolute value of currents flowing into and out of the high-voltage battery 14. The first map illustrated in, for example, graph format in FIG. 15 can be designed as a data table stored in the memory 32 or embedded in the voltage detecting program corresponding to the voltage detecting routine illustrated in FIG. 14.

Figure 15:
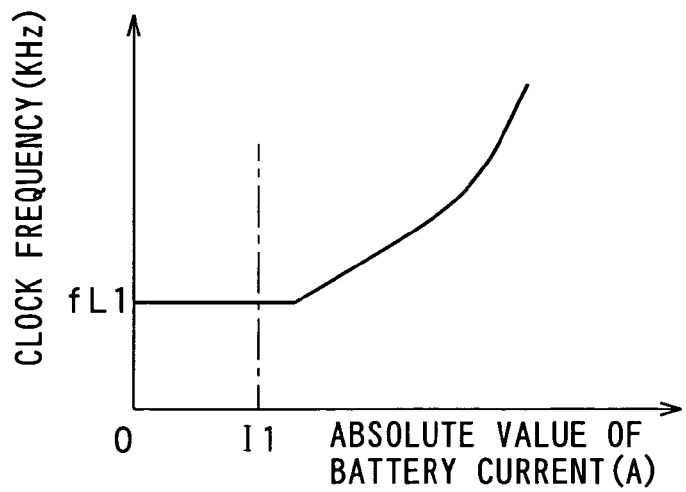
FIG. 15 is a graph schematically illustrating a first map representing a relationship between a variable of the frequency of the clock and a variable of an absolute value of currents flowing into and out of the high-voltage battery according to the third embodiment.

Referring to FIG. 15, the first map is designed such that, the more an absolute value [Amperes] of currents flowing into and out of the high-voltage battery 14 are increased, the higher the frequency [Hertz] of the clock CLK is. Note that, when an absolute value of currents flowing into and out of the high-voltage battery 14 is equal to or lower than a specified value I1, such as zero, the frequency of the clock CLK is fixed at a preset low frequency value fL1.

Next, the battery monitor 20 references the first map using the information indicative of an absolute value of currents flowing into and out of the high-voltage battery 14 to thereby obtain a value of the frequency of the clock CLK corresponding to the obtained information in step S54.

After the operation in step S54, the battery monitor 20 carries out the operations in steps S22, S16, and S18 set form above.

Note that the operation in step S50 is carried out by the charge/discharge determiner 30a2.

The remaining operations of the battery monitor 20 according to the third embodiment are substantially identical to those of the battery module 20 according to the first embodiment.

Specifically the battery monitor 20 according to the third embodiment is configured to determine that the priority level of the increase in the cell-voltage detected resolution is higher than that of the reduction in the cell-voltage detection time when an absolute value of currents flowing into and out of the high-voltage battery 14 is lower than the specified value I1.

This achieves, in addition to the first, third, and fourth advantages, the seventh advantage of properly determining that the priority level of the increase in the cell-voltage detected resolution is higher than that of the reduction in the cell-voltage detection time when an absolute value of currents flowing into and out of the high-voltage battery 14 is lower than the specified value I1.

Fourth Embodiment

A battery monitor according to the fourth embodiment of the present invention will be described hereinafter with reference to FIG. 16.

The structure of the battery monitor according to the fourth embodiment is substantially identical to that of the batter monitor according to the third embodiment except for the following different points. So, like parts between the battery monitors according to the third and fourth embodiments, to which like reference characters are assigned, are omitted or simplified in description.

The battery monitor according to the fourth embodiment is configured to variably set the frequency of the clock CLK to any one of the low frequency value fL and the high frequency value fH based on the amount of currents flowing into and out of the high-voltage battery 14. In addition, the battery monitor according to the fourth embodiment is configured to provide a hysteresis period for waiting the clock-frequency switching from one of the low and high frequency values fL and fH to the other thereof. This aims at preventing hunting; this hunting means frequent switches the frequency of the clock CLK.

A voltage detecting routine to be executed by the battery monitor 20 according to the fourth embodiment will be described hereinafter. The voltage detecting routine is designed to be repeatedly executed by the batter monitor 20 at a preset cycle in accordance with a voltage detecting program stored in the battery monitor 20.

Figure 16:
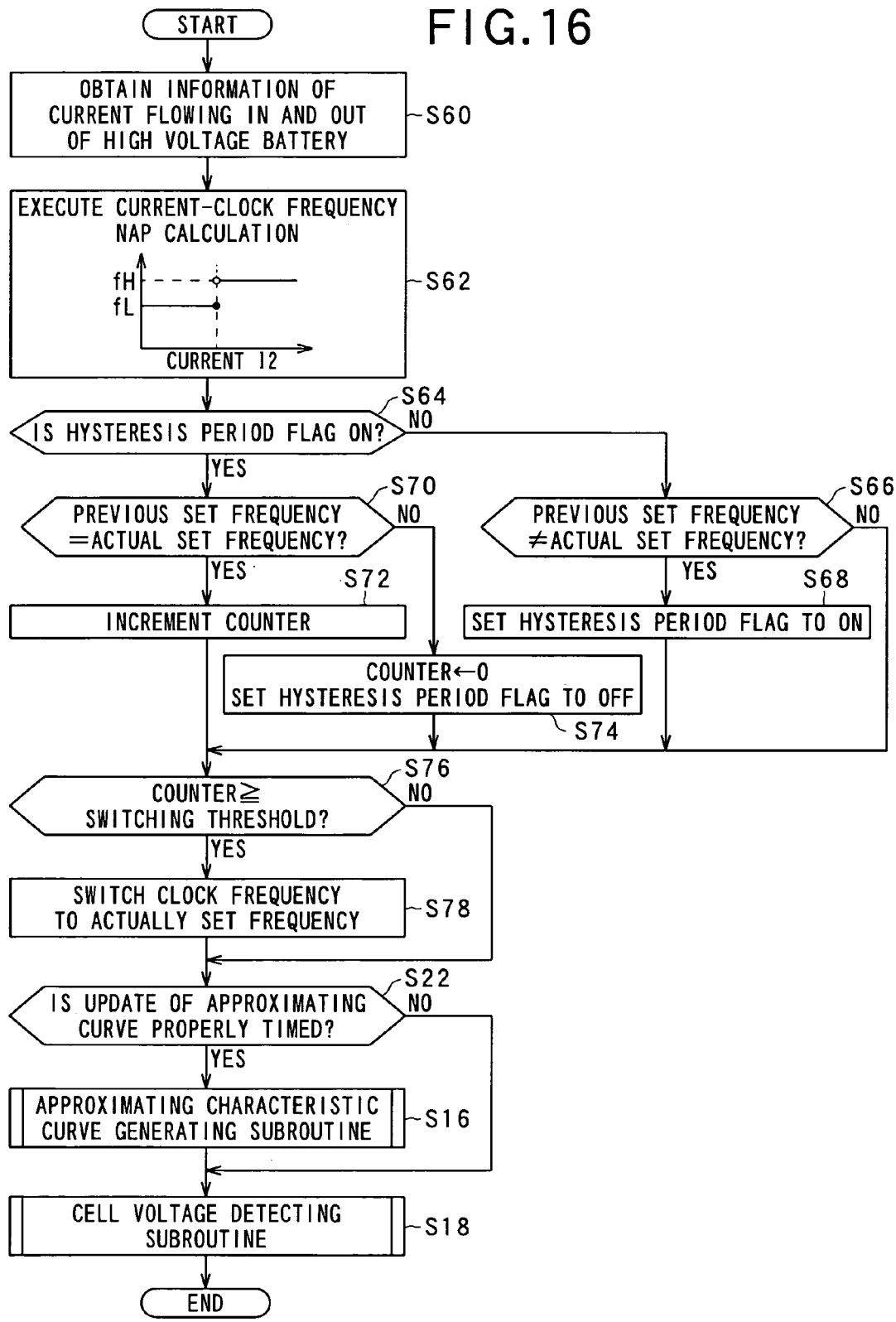
FIG. 16 is a flowchart schematically illustrating a voltage detecting routine to be executed by the battery monitor system according to the fourth embodiment.

Like operations between the voltage detecting routines illustrated in FIGS. 10 and 16, to which like reference characters are assigned, are omitted or simplified in description.

When launching the voltage detecting routine illustrated in FIG. 16, the battery monitor 20 obtains the amount of currents flowing into and out of the high-voltage battery 14 based on the data indicative of currents flowing into and out of the high-voltage battery 14 measured by the current sensor 22 in step S60.

In step S62, the battery module 20 obtains a second map representing a relationship between a variable of the frequency of the clock CLK and a variable of an absolute value of currents flowing into and out of the high-voltage battery 14. The second map illustrated in, for example, graph format in FIG. 16 can be designed as a data table stored in the memory 32 or embedded in the voltage detecting program corresponding to the voltage detecting routine illustrated in FIG. 16.

Referring to FIG. 16, the second map is designed such that, when the absolute value of currents flowing into and out of the battery 14 is equal to or lower than a specified value I2, the frequency of the clock CLK is set to the low frequency value fL, and when the absolute value of currents flowing into and out of the battery 14 is higher than the specified value I2, the frequency of the clock CLK is set to the high frequency value In step S62, the battery monitor 20 references the second map using the obtained amount of currents flowing into and out of the high-voltage battery 14 to thereby set any one of the low frequency value fL and the high frequency value fH corresponding to the obtained amount of currents flowing into and out of the high-voltage battery 14.

In step S64, the battery monitor 20 determines whether a hysteresis period flag in software or hardware is ON; is hysteresis period flag, whose initial value is OFF" represents whether to wait the clock-frequency switching from one of the low and high frequency values fL and fH to the other thereof.

Upon determining that the hysteresis period flag is OFF (No in step S64), the battery monitor 20 proceeds to step S66. In step S66, the battery monitor 20 determines whether a previously set frequency of the clock CLK based on the second map in step S62 of a previous routine is different from an actually set frequency of the clock CLK based on the second map in step S62 of an actual routine. The operation in step S66 is to determine the timing at which the switching of the frequency of the clock pulse CLK is instructed based on the actually set frequency.

Upon determining that the previously set frequency of the clock CLK based on the second map in step S62 of the previous routine is different from the actually set frequency of the clock CLK based on the second map in step S62 of the actual routine (YES in step S66), the battery monitor 20 sets the hysteresis period flag to ON in step S68, proceeding to step S76.

Otherwise, upon determining that the hysteresis period flag is ON (YES in step S64), the battery monitor 20 proceeds to stop S70. In step S70, the battery monitor 20 determines whether a previously set frequency of the clock CLK based on the second map in step S62 of a previous routine is equal to an actually set frequency of the clock CLK based on the second map in step S62 of an actual routine. The operation in step S70 is to determine whether the frequency switching of the clock CLK has been continuously instructed since the operation in step S62 of the previous routine.

Otherwise, upon determining that the previously set frequency of the clock CLK based on the second map in step S62 of the previous routine is equal to the actually set frequency of the clock CLK based on the second map in step S62 of the actual routine (YES in step S70), the battery monitor 20 determines that the frequency switching of the clock CLK has been continuously instructed since the operation in step S62 of the previous routine. Then, in step S72, the battery monitor 20 increments a count value of a counter whose initial value is set to zero; this counter is so prepared beforehand in the battery monitor 20 in software and/or hardware as to represent a period for which the frequency switching has been continued.

Otherwise, upon determining that the previously set frequency of the clock CLK based on the second map in step S62 of the previous routine is not equal to the actually set frequency of the clock CLK based on the second map in step S62 of the actual routine (NO in step S70), the battery monitor 20 determines that the frequency switching of the clock CLK is suddenly instructed. Then, in step S74, the battery monitor 20 initializes the count value of the counter, and sets the hysteresis period flag to OFF, proceeding to step S76.

In step S76, the battery monitor 20 determines whether the count value of the counter is equal to or greater than a switching threshold. The operation in step S76 is to determine whether the frequency switching is instructed again immediately after the frequency of the clock CLK is switched according to the continuous instruction of the frequency switching.

Upon determining that the count value of the counter is equal to or greater than the switching threshold (YES in step S76), the battery monitor 20 switches the frequency of the clock CLK to the actually set frequency based on the second map in step S62 of the actual routine in step S78.

After completion of the operation in step S78 or when the negative determination is made in step S76, the batter monitor 20 carries out the operations in steps S22, S16, and S18.

The remaining operations of the battery monitor 20 according to the fourth embodiment are substantially identical to those of the battery module 20 according to the first embodiment.

Specifically the battery monitor 20 according to the fourth embodiment is configured to determine whether to switch the frequency of the clock CLK based on previous frequency-setting histories. This achieves, in addition to the first, third, fourth, and seventh advantages, the eighth advantage of variably setting the frequency of the clock CLK while properly preventing hunting.

The battery monitor 20 according to the fourth embodiment is configured to switch the frequency of the clock CLK to the actually set frequency when a hysteresis period is equal to or greater than a specified period corresponding to the switching threshold. The hysteresis period means a period for which the determined result (fH or fL) of the priority level in step S62 has been continued since the change of determined result from one of the value fH and fL to the other thereof.

This achieves, in addition to the first, third, fourth, and seventh advantages, the ninth advantage of properly preventing hunting even if the priority level is quantified using a parameter widely variable in a minute time scale, such as the amount of currents flowing into and out of the battery 14. The hunting means frequent switches the frequency of the clock CLK.

Fifth Embodiment

A battery monitor according to the fifth embodiment of the present invention will be described hereinafter with reference to FIGS. 17 to 19.

The structure of the battery monitor according to the fifth embodiment is substantially identical to that of the battery monitor according to the third embodiment except for the following different points. So, like parts between the battery monitors according to the third and fifth embodiments, to which like reference characters are assigned, are omitted or simplified in description.

Figure 17:
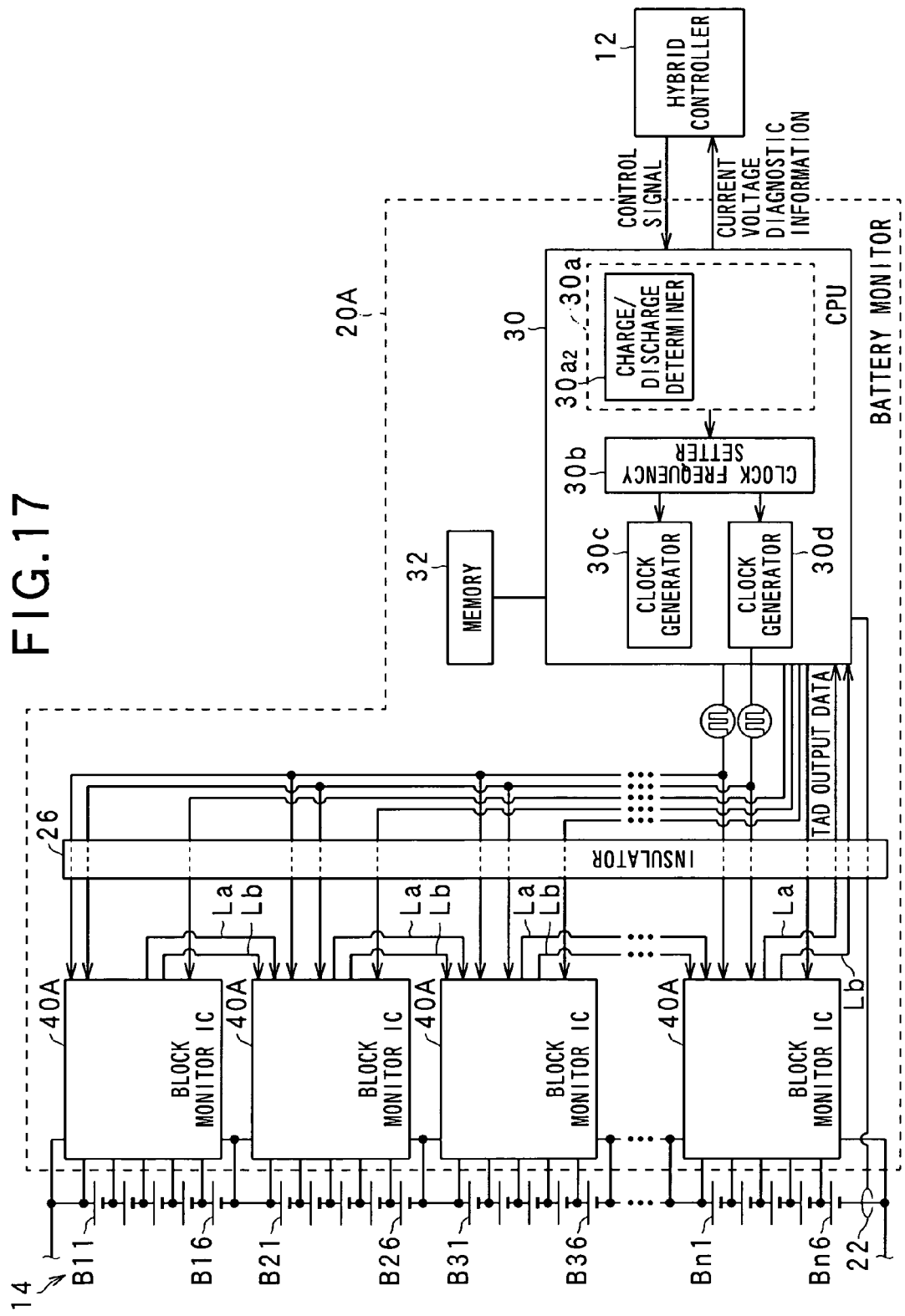
FIG. 17 is a block diagram schematically illustrating an example of the circuit structure of a battery monitor system according to the fifth embodiment of the present invention.

Referring to FIG. 17, a battery monitor 20A according to the fifth embodiment is provided with no signal division and switch unit 28 so that the clock CLK and the control signals sent from the CPU 30 are transmitted to each of block monitor ICs 40A via the insulator 26.

Each of the block monitor ICs 40A according to the fifth embodiment is configured to send, to a block monitor IC 40A adjacent thereto at a lower potential side via signals lines La and Lb, the TAD output data detected thereby and TAD output data sent from a block monitor IC 40A adjacent thereto at a higher potential side.

The block monitor IC 40A with the lowest potential is configured to:

receive all pieces of the TAD output data sent from all of the higher-potential side block monitor ICs 40A; and send the received pieces of the TAD output data and the TAD output data detected thereby to the CPU 30 via signal lines La and Lb and the insulator 26.

This allows the number of the insulator elements required for the output of the TAD output data from each block monitor IC 40A to the CPU 30 to be reduced as compared with the battery monitor 20 configured such that each of the block IC monitors 40A individually outputs the TAD output data detected thereby to the CPU 30.

Note that, as a method of transmitting signals from a higher potential block monitor IC 40A to a lower potential block monitor IC 40A, well known techniques, such as techniques disclosed in Japanese Patent Application Publication No. 2007-278913, can be used.

In addition, the battery monitor 20A is provided with a pair of clock generators 30c and 30d. The clock generators 30c and 30d are operative to simultaneously output clocks with different frequencies.

This corresponds to the fact that each block monitor IC 40 according to the fifth embodiment is provided with six pairs of TADs 52A and 52B. Each pair of TADs 52A and 52B are operative to detect the voltage across a corresponding cell Bj.

Figure 18:
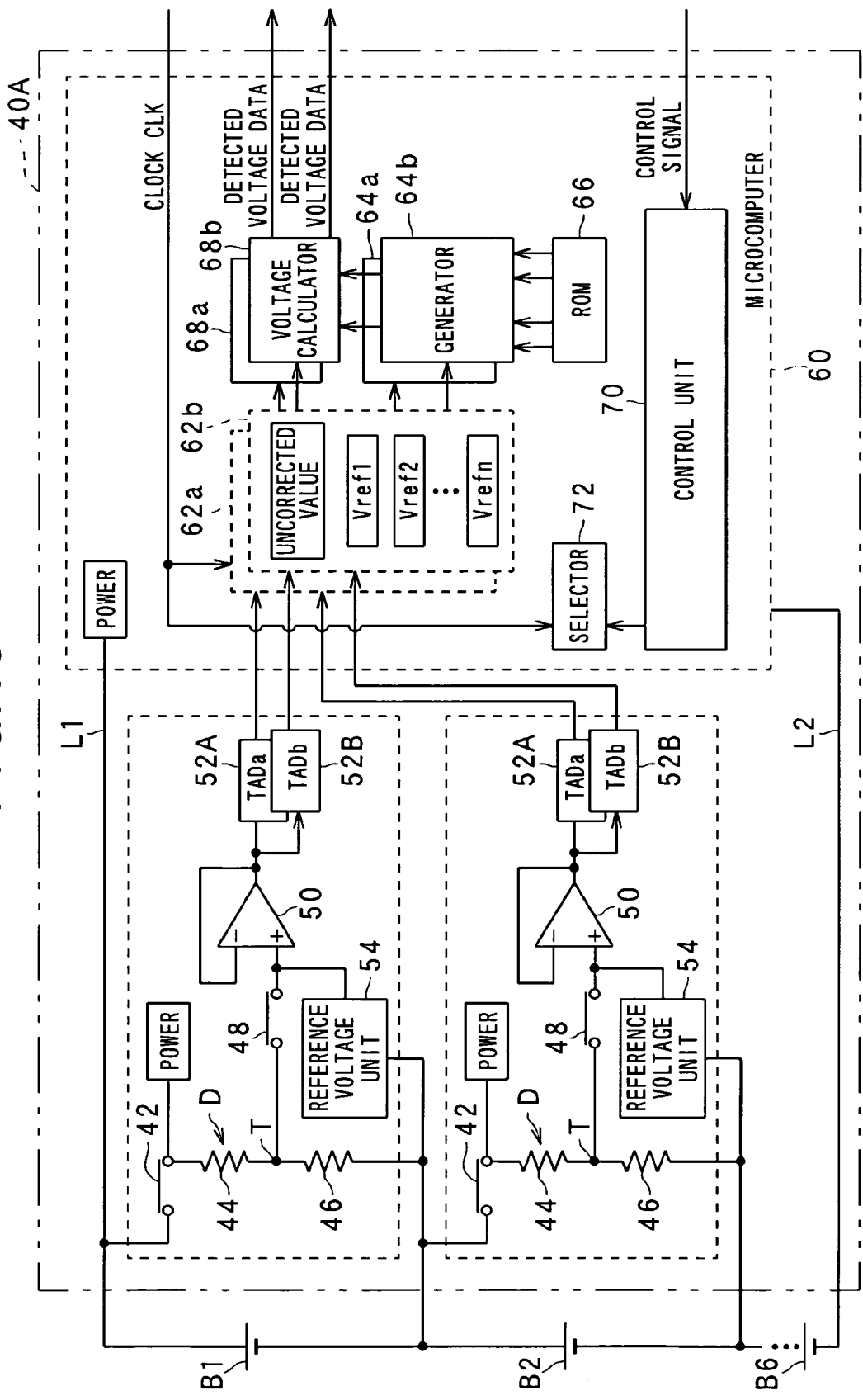
FIG. 18 is a circuit diagram schematically illustrating an example of the structure of a block monitor IC illustrated in FIG. 17.

Referring to FIG. 18, a microcomputer 60A of each block monitor IC 40 is provided with a pair of storage units 62a and 62b, a pair of approximation characteristic curve generators (generators) 64a and 64b, and a pair of voltage calculators 68a and 68b. The storage unit 62a, the generator 64a, and the voltage calculator 68a correspond to each of the TADs 52A, and the storage unit 62b, the generator 64b, and the voltage calculator 68b correspond to each of the TADs 52B.

The configuration of the battery monitor 20A is adapted to diagnose whether an abnormality occurs in each of the TADs 52A and 52B of each pair.

Next, an abnormal diagnostic routine to be executed by the battery monitor 20A according to the fifth embodiment will be described hereinafter. The abnormal diagnostic routine is designed to be repeatedly executed by the batter monitor 20A at a preset cycle in accordance with an abnormal diagnostic program stored in the battery monitor 20A.

Figure 19:
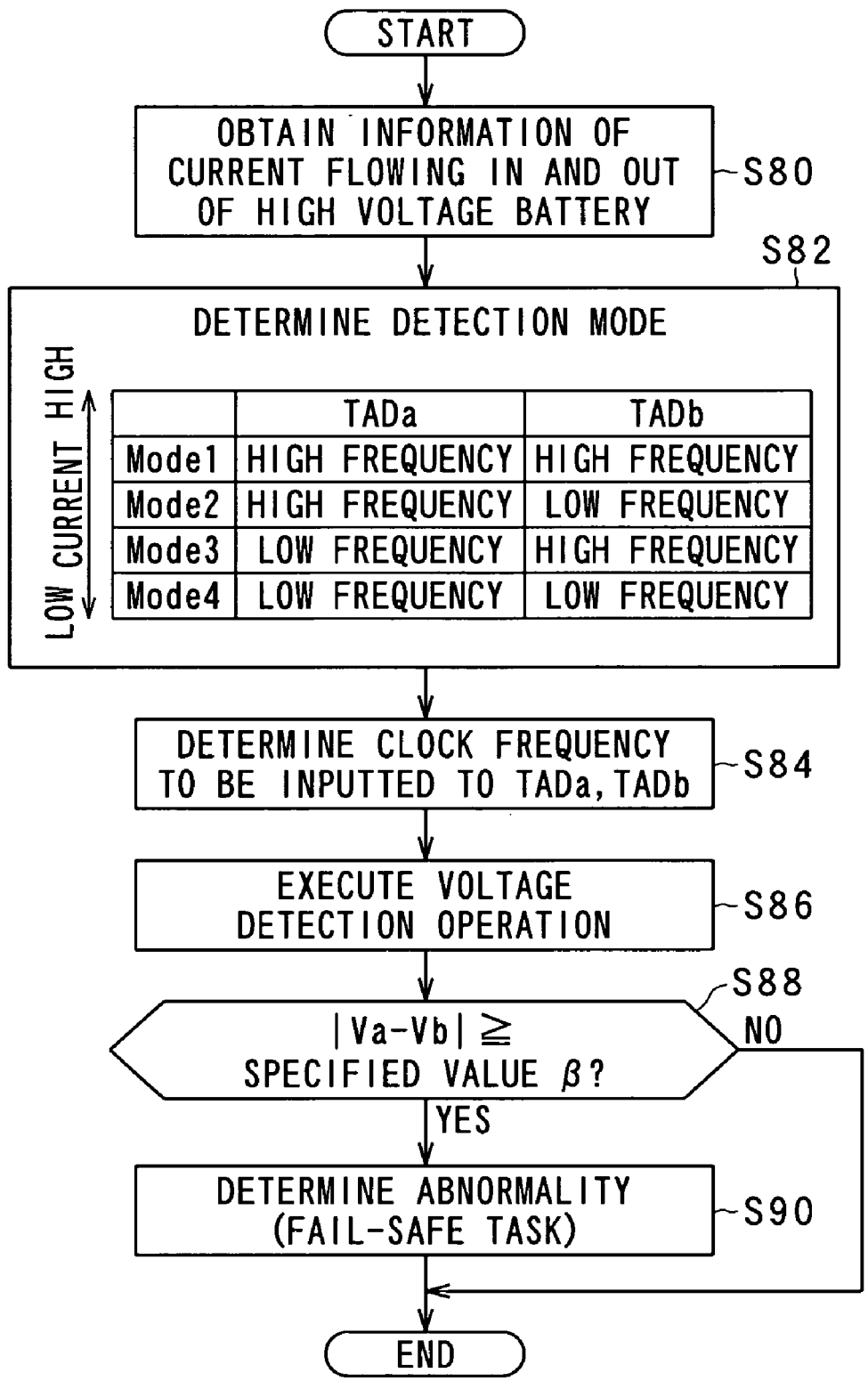
FIG. 19 is a flowchart schematically illustrating an abnormal diagnostic routine to be executed by the battery monitor system according to the fifth embodiment.

Referring to FIG. 19, when launching the abnormal diagnostic routine, the battery monitor 20A obtains information indicative of currents flowing into and out of the high-voltage battery 14 in step S80 like step S80.

Next, in step S82, the battery monitor 20A determines any one of previously prepared four voltage detection modes Mode 1, Mode 2, Mode 3, and Mode 4.

The Mode 1 causes the battery monitor 20A to apply the clock CLK with the high frequency value in to each of the TADs 52A and 52B of each pair.

The Mode 2 causes the battery monitor 20A to apply the clock CLK with the high frequency value fH to the TAD 52A of each pair, and the clock CLK with the low frequency fL to the TAD 52B of each pair.

The Mode 3 causes the battery monitor 20A to apply the clock CLK with the high frequency value fH to the TAD 52B of each pair, and the clock CLK with the low frequency fL to the TAD 52A of each pair.

The Mode 4 causes the battery monitor 20A to apply the clock CLK with the low frequency value fL to each of the TADs 52A and 52B of each pair.

In the fifth embodiment, when an absolute value of currents flowing into and out of the high-voltage battery 14 based on the measured data by the current sensor 22 is lower to be equal to a first preset value of, for example, substantially zero, the battery monitor 20A selects the Mode 4 in the four modes.

When an absolute value of currents flowing into and out of the high-voltage battery 14 based on the measured data by the current sensor 22 is lower than a second preset value but higher than the first preset value, the battery monitor 20A selects the Mode 3 in the four modes.

When an absolute value of currents flowing into and out of the high-voltage battery 14 based on the measured data by the current sensor 22 is lower than a third preset value but higher than the second preset value, the battery monitor 20A selects the Mode 2 in the four modes.

When an absolute value of currents flowing into and out of the high-voltage battery 14 based on the measured data by the current sensor 22 is higher than the third preset value, the battery monitor 20A selects the Mode 1 in the four modes.

Next, in step S84, the battery monitor 20A determines the frequency of the clock CLK to be applied to each of the TADs 52A and 52B of each pair in accordance with the selected mode.

In step S86, the batter monitor 20A carries out a voltage detecting operation corresponding to the operations in steps S14, S16, and S18 when the clock CLK with the low frequency fL is applied to the TAD 52A and/or 52B of each pair. In step S86, the battery monitor 20A carries out a voltage detecting operation corresponding to the operations in steps S20, S22, S16, and S18 when the clock CLK with the high frequency fH is applied to the TAD 52A and/or 52B of each pair.

This results in that:

TAD output data Va from each TAD 52A upon the divided value of the voltage across a corresponding cell Bij being inputted to each TAD 52A is transmitted to the microcomputer 60A; and TAD output data Vb from each TAD 52B upon the divided value of the voltage across a corresponding cell Bij being inputted to each TAD 52B is transmitted to the microcomputer 60A.

In other words, the TAD output data Va and the TAD output data Vb for each pair of the TADs 52A and 5213 are transmitted to be received by the microcomputer 60A.

In step S88, the battery monitor 20A calculates an absolute value of the difference between the TAD output data Va and the TAD output data Vb of each pair, and determines, for each pair, whether the calculated absolute value is equal to or greater than a specified value β. The operation in step S88 is to determine whether an abnormality occurs in the battery monitor 20A.

Upon determining that the calculated absolute value is equal to or greater than the specified value β (YES in step S88), the battery monitor 20A proceeds to step S90. In step S90, the battery monitor 20A determines that an abnormality occurs therein, and, preferably, carries out at least one of well-known fail-safe tasks for addressing the battery monitor 20A.

Otherwise upon determining that the calculated absolute value is lower than the specified value β (NO in step S88), or upon completing the operation in step S90, the battery monitor 20A terminates the abnormal diagnostic routine. Note that the operation in step S88 need not be carried out every execution of the abnormal diagnostic routine.

For example, when the Mode 2 or Mode 3 is selected, the battery monitor 20A can car out the operation in step S88 only when the TAD output data of one of the TADs 52A and 523 of each pair is transmitted to be received by the battery monitor 20A; to the one of the TADs 52A and 52B of each pair, the clock CLK with the low frequency fL is inputted. This is because the voltage detection time using the clock CLK with the high frequency value fH is different from that using the clock CLK with the low frequency value fL.

This prevents the voltage detection time using the clock CLK with the high frequency value in from extending.

The remaining operations of the battery monitor 20A according to the fifth embodiment are substantially identical to those of the battery module 20 according to the first embodiment.

Specifically the battery monitor 20A according to the fifth embodiment is provided with a pair of TADs 52A and 52B for each cell Bij and able to make difference the frequency of the clock to be applied to the TAD 52A and that of the clock to be applied to the TAD 52B. This achieves, in addition to the first, third, fourth, and seventh advantages, the following tenth advantage. The tenth advantage makes difference between:

the order of the priority levels of the increase in the cell-voltage detected resolution and the reduction in the cell-voltage detection time in the voltage detecting process using the TAD 52A; and the order of the priority levels of the increase in the cell-voltage detected resolution and the reduction in the cell-voltage detection time in the voltage detecting process using the TAD 52B.

The battery monitor 20A according to the fifth embodiment is configured to diagnose an abnormality occurs therein when a level of the difference between the TAD output data as a detected result of each cell Bij using the TAD 52A and the TAD output data as a detected result of a corresponding cell using the TAD 52B.

This achieves, in addition to the first, third, fourth, and seventh advantages, the eleventh advantage of diagnosing whether an abnormality occurs in the battery monitor 20A.

Sixth Embodiment

A battery monitor according to the sixth embodiment of the present invention will be described hereinafter with reference to FIGS. 20 and 21.

The structure of the battery monitor according to the sixth embodiment is substantially identical to that of the battery monitor according to the first embodiment except for the following different points. So, like parts between the battery monitors according to the firth and sixth embodiments, to which like reference characters are assigned, are omitted or simplified in description.

For example, as described in Japanese Patent Application Publication No. 2007-12568, power allowed to be input to and outputted from the high-voltage battery 14 greatly reduces with reduction in the temperature of the high-voltage battery 14. In order to address such a problem, the vehicle control system according to the so embodiment is configured to increase the temperature of the high-voltage battery 14 when it is low.

Figure 20:
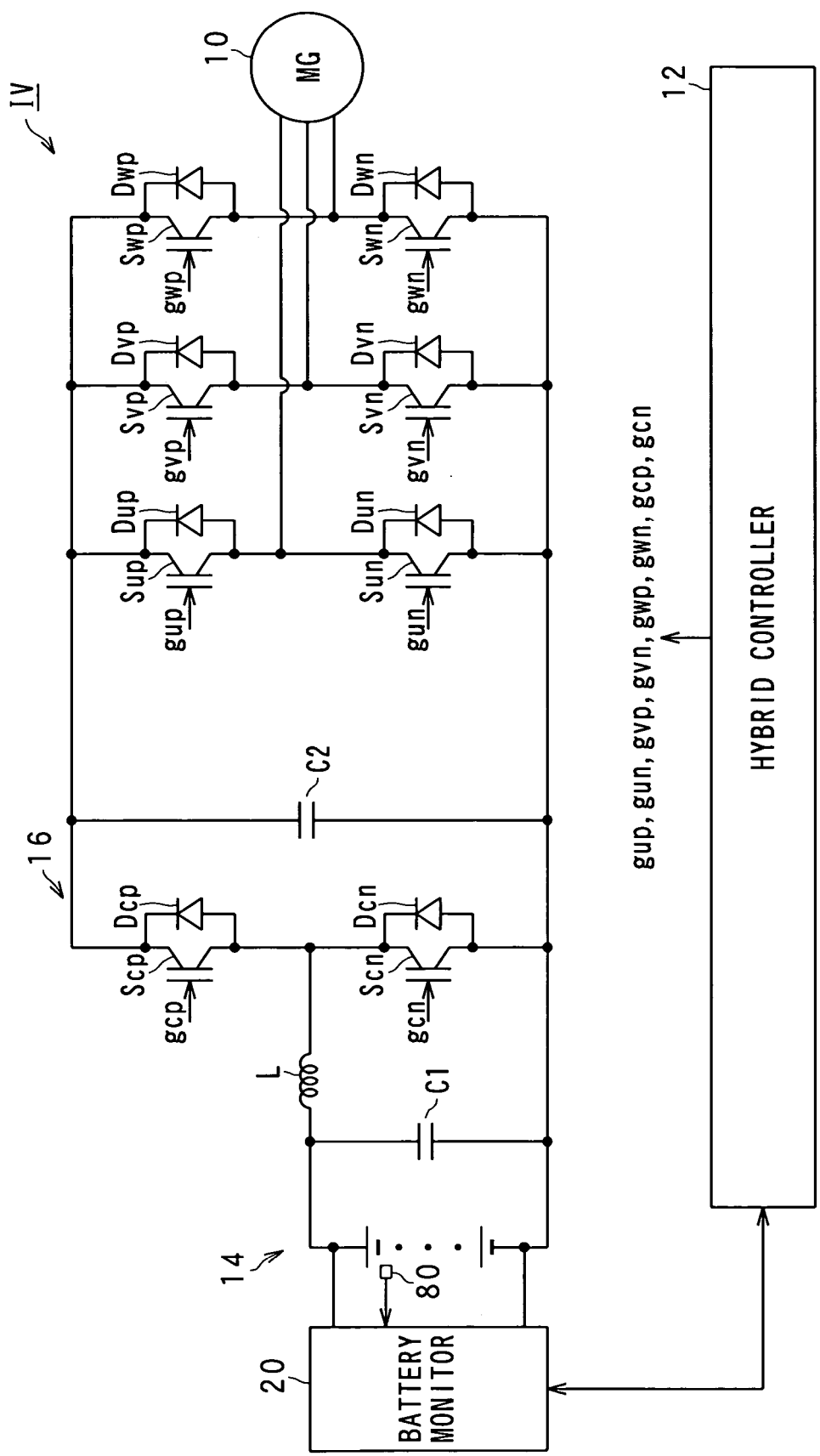
FIG. 20 is a circuit diagram schematically illustrating an example of the structure of a part of the vehicle control system according to the sixth embodiment of the present invention.

FIG. 20 schematically illustrates part of the vehicle control system including the battery monitor system 20, the DC to DC converter 16, the inverter IV, and the MG 10.

The MG 10 and the high-voltage battery 14 can establish electrical connection therebetween via the inverter IV and the DC to DC converter 16.

The DC to DC converter 16 includes a coil L, a capacitor C1, a capacitor C2, a pair of series-connected switching elements Scp and Scn, and a pair of flywheel diodes Dcp and Dcn.

One electrode of the capacitor C1 is connected to the positive terminal of the high-voltage battery 14, and the other thereof to the negative terminal of the high-voltage battery 14. One end of the coil L is connected to both the positive terminal of the high-voltage battery 14 and the one electrode of the capacitor C1.

In the sixth embodiment, as the switching elements Scp and Son, IGBTs (Insulated Gate Bipolar Transistors) are respectively used. The flywheel diodes Dcp and Dcn are connected in antiparallel to the switching elements Scp and Scn, respectively. The other end of the coil L is connected to a point at which the switching elements Scp and Scn are electrically connected in series.

The capacitor C2 is connected in parallel to the pair of high- and low-side switching elements Scp and Scn.

The high-voltage battery 14 has a nominal voltage of, for example, 288 V.

For example, when the vehicle control system operates in a power-running control mode, the switching elements Scp and Scn of the DC to DC converter 16 are driven on and off. This converts a voltage across the battery 14 into a higher voltage using electromagnetic energy stored in the coil L by the on and off switchings of the switching elements Scp and Scn. For example, when a voltage across the battery 14, referred to as "battery voltage", is 288 V, the DC to DC converter 16 works to convert the battery voltage of 288 V into 666 V.

In addition, when the vehicle control system operates in a regenerative control mode during the hybrid vehicle being decelerated, the MG 10 serves as a generator to thereby convert mechanical power based on the rotation of the MG 10 into electrical power. The electrical power is converted by the inverter IV into DC power. The switching elements Scp and Scn of the DC to DC converter 16 are driven on and off. This converts a voltage across the capacitor C2 based on the converted DC power into a lower voltage based on voltage drop across the coil L by the on and off switchings of the switching elements Scp and Scn. The lower voltage stepped down from the voltage across the capacitor C2 is charged in the battery 14.

The inverter IV is designed as a three-phase inverter when the MG 10 is designed as a three-phase rotary machine.

The inverter IV is provided with a first pair of series-connected is high- and low-side switching elements Sup and Sun, a second pair of series-connected high- and low-side switching elements Svp and Svn, and a third pair of series-connected high- and low-side switching elements Swp and Swn. The inverter IV is also provided with flywheel diodes Dup, Dun, Dvp, Dvn, Dwp, and Dwn electrically connected in antiparallel to the switching elements Sup, Sun, Svp, Svn, Swp, and Swn, respectively.

In the sixth embodiment, as the switching elements Sup, Sun, Svp, Svn, Swp, and Swn, IGBTs are respectively used.

The first to third pairs of switching elements are parallely connected to each other in bridge configuration.

A connecting point through which the switching elements Sup and Sun of the first pair are connected to each other in series is connected to an output lead extending from one end of a U-phase winding of the MG 10. Similarly, a connecting point through which the switching elements Svp and Svn of the second pair are connected to each other in series is connected to an output lead extending from one end of a V-phase winding of the MG 10. Moreover, a connecting point through which the switching elements Swp and Swn of the third pair are connected to each other in series is connected to an output lead extending from one end of the W-phase winding. The other ends of the U-, V-, and W-phase windings are connected to each other in, for example, star configuration.

One end of the series-connected switching elements of each of the first, second, and third pairs, such as the drain of the corresponding high-side switching element, is connected to the positive terminal of the battery 14 via a positive terminal of the inverter IV, the switching element Dcp and the coil L. The other end of the series-connected switching elements of each of the first, second, and third pairs, such as the source of the corresponding low-side switching element, is connected to the negative terminal of the battery 14 via a negative terminal of the inverter IV.

In other words, the battery 14 is parallel connected to the first, second, and third pairs of upper- and lower-armed switching elements.

The hybrid controller 12 is equipped with gate drivers (not shown). The switching elements Scp, Scn, Sup, Sup, Sun, Svp, Svn, Swp, and Swn have control terminals, such as the gates, connected to the gate drivers, respectively.

The hybrid controller 12 is operative to generate:
 a drive signal gcp for driving the switching element Scp;
 a drive signal gcn for driving the switching element Scn;
 a drive signal gup for driving the switching element Sup;
 a drive signal gun for driving the switching element Sun;
 a drive signal gvp for driving the switching element Svp;
 a drive signal gvn for driving the switching element Svn;
 a drive signal gwp for driving the switching element Swp; and
 a drive signal gwn for driving the switching element Swn.

Each of the drive signals gcp, gcn, gup, gun, gvp, gun, gwp, and gwn is a pulse signal with a controllable duty cycle (controllable pulse width, or controllable on duration).

Specifically, the hybrid controller 12 is operative to cause each of the gate drivers to apply a corresponding one of the drive signals gcp, gcn, gup, gun, gvp, gvn, gwp, and gwn to a corresponding one of the switching elements Scp, Scn, Sup, Sun, Svp, Svn, Swp, and Swn. This allows a corresponding one of the switching elements Scp, Scn, Sup, Sun, Svp, Svn, Swp, and Swn to be driven on during the pulse width (on-duration) of a corresponding one of the drive signals gcp, gcn, gup, gun, gvp, gvn, gwp, and gwn.

Particularly, the battery monitor 20 sends, to the hybrid controller 12, a temperature-rising instruction when the temperature of the battery 14 based on a measured value by a temperature sensor 80 located close to the battery 14 is low.

The hybrid controller 12 is programmed to carry out, in response to receiving the temperature-rising instruction from the battery monitor 20, temperature rise control.

Specifically, as the temperature rise control; the hybrid controller 12 works to adjust the drive signals gcp and gcn to thereby oscillate an output voltage of the DC to DC converter 16 in the form of, for example, a pseudo sinusoidal wave. With the oscillation of the output voltage of the DC to DC converter, energy stored in the capacitor C2 is changed, Charges corresponding to the changes of the electrical energy stored in the capacitor C2 are transferred between the capacitor C2 and the battery 14.

This allows power to be cyclically charged and discharged into and out of the battery 14 so that a charging and discharging current with respect to the battery 14 oscillate. The oscillating charging and discharging current flows through an internal resistance of the battery 14, this results in generating heat in the battery 14. The generated heat causes the high-voltage battery 14 to rise in temperature.

However, the charge and discharge of the battery 14 set forth above may cause the voltage across the high-voltage battery 14 to oscillate. This may cause a locally maximum value of the voltage across the battery 14 to over rise and/or a locally minimum value thereof to over decrease. Thus, the battery monitor 20 according to the sixth embodiment is desired to monitor the voltage across each cell Bij in order to prevent a locally maximum value of the voltage across the battery 14 from over rising and/or a locally minimum value thereof from over decreasing.

Thus, the battery monitor 20 according to the sixth embodiment is configured to monitor the voltage across each cell Bij in the following manner during the temperature rise control.

A voltage detecting routine to be executed by the battery monitor 20 according to the sixth embodiment will be described hereinafter. The voltage detecting routine is designed to be repeatedly executed by the batter monitor 20 at a preset cycle in accordance with a voltage detecting program stored in the battery monitor 20.

Figure 21:
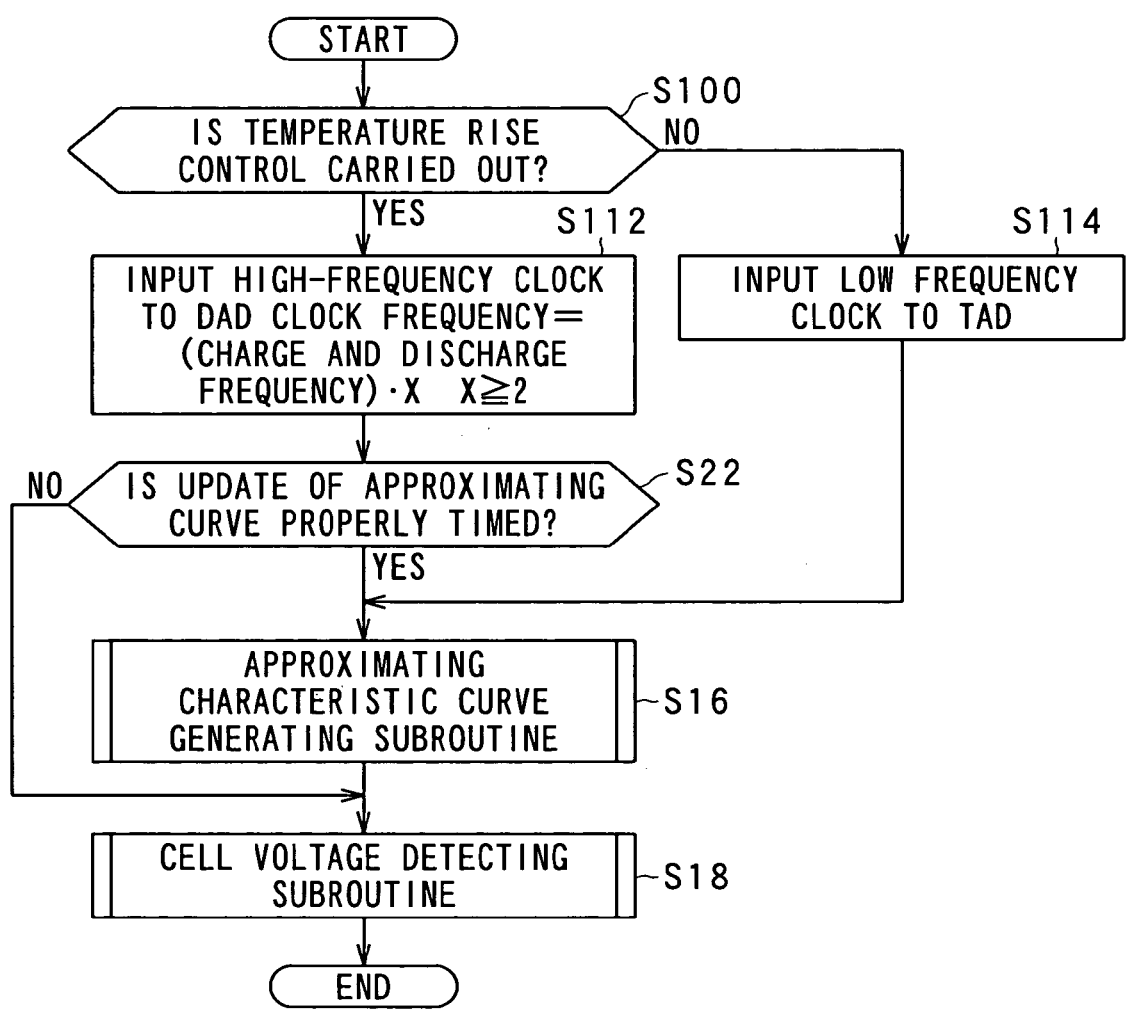
FIG. 21 is a flowchart schematically illustrating a voltage detecting routine to be executed by the battery monitor system according to the sixth embodiment.

Like operations between the voltage detecting routines illustrated in FIGS. 10 and 21, to which like reference characters are assigned, are omitted or simplified in description.

When launching the voltage detecting routine illustrated in FIG. 21, the battery monitor 20 determines whether the hybrid controller 12 carries out the temperature rise control in step S100. The operation in step S100 is to determine whether the reduction in the cell-voltage detection time is higher in priority than the increase in the cell-voltage detected resolution.

Upon determining that the hybrid controller 12 carries out the temperature rise control (YES in step S100), the battery monitor 20 proceeds to step S112.

In step S112, the battery monitor 20 determines that the reduction in the cell-voltage detection time is higher in priority than the increase in the cell-voltage detected resolution, thus setting the frequency of the clock CLK to a high frequency value; this high frequency value is within a preset range. The preset range is based on a frequency range of the charge and discharge current for the high-voltage battery 14 used by the temperature rise control.

For example, when the frequency range of the charge and discharge current for the high-voltage battery 14 used by the temperature rise control is set to the range from 500 Hz to 1 kHz, the preset range for the frequency of the clock CLK is set to be X-times over the range from 500 Hz to 1 kHz. The X is a constant equal to or greater than 2 so as to meet sampling theorem for the variation in the voltage across the battery 14.

In the sixth embodiment, the frequency of the clock CLK is within the preset range from 1 kHz to 10 kHz. This can easily set the frequency of the clock CLK.

After completion of the operation in step S112, the battery monitor 20 carries out the operations in steps S22, S16, and S18 set forth above.

In contrast, upon determining that the hybrid controller 12 does not carry out the temperature rise control (NO in step S100), the battery monitor 20 determines that the increase in the cell-voltage detected resolution is higher in priority than the reduction in the cell-voltage detection time. Thus, in step S114, the battery monitor 20 sets the frequency of the clock CLK to a low frequency value, and thereafter, carries out the operations in steps S22, S16, and S18 set forth above.

The remaining operations of the battery monitor 20 according to the sixth embodiment are substantially identical to those of the battery module 20 according to the first embodiment.

Specifically the battery monitor 20 according to the sixth embodiment is configured to determine that the reduction in the cell-voltage detection time is higher in priority than the increase in the cell-voltage detected resolution while the temperature rise control is subjected to the high-voltage battery 14, in other words, the charge and discharge of the high-voltage battery 14 is carried out.

This achieves, in addition to the first, third, and fourth advantages, the twelfth advantage of properly monitoring whether the voltage across the battery 14 is over increased and/or over reduced while the voltage across the batter 14 can greatly vary.

The battery monitor 20 according to the sixth embodiment is configured to set the frequency of the clock CLK to be equal to or greater than the double of the frequency of the charge and discharge current for the battery 14 while the temperature rise control is subjected to the high-voltage battery 14. This achieves, in addition to the first, third, and fourth advantages, to properly monitor the variation in the voltage across the battery 14 because the frequency of the clock CLK meets sampling theorem for the variation in the voltage across the battery 14.

Seventh Embodiment

Figure 22:
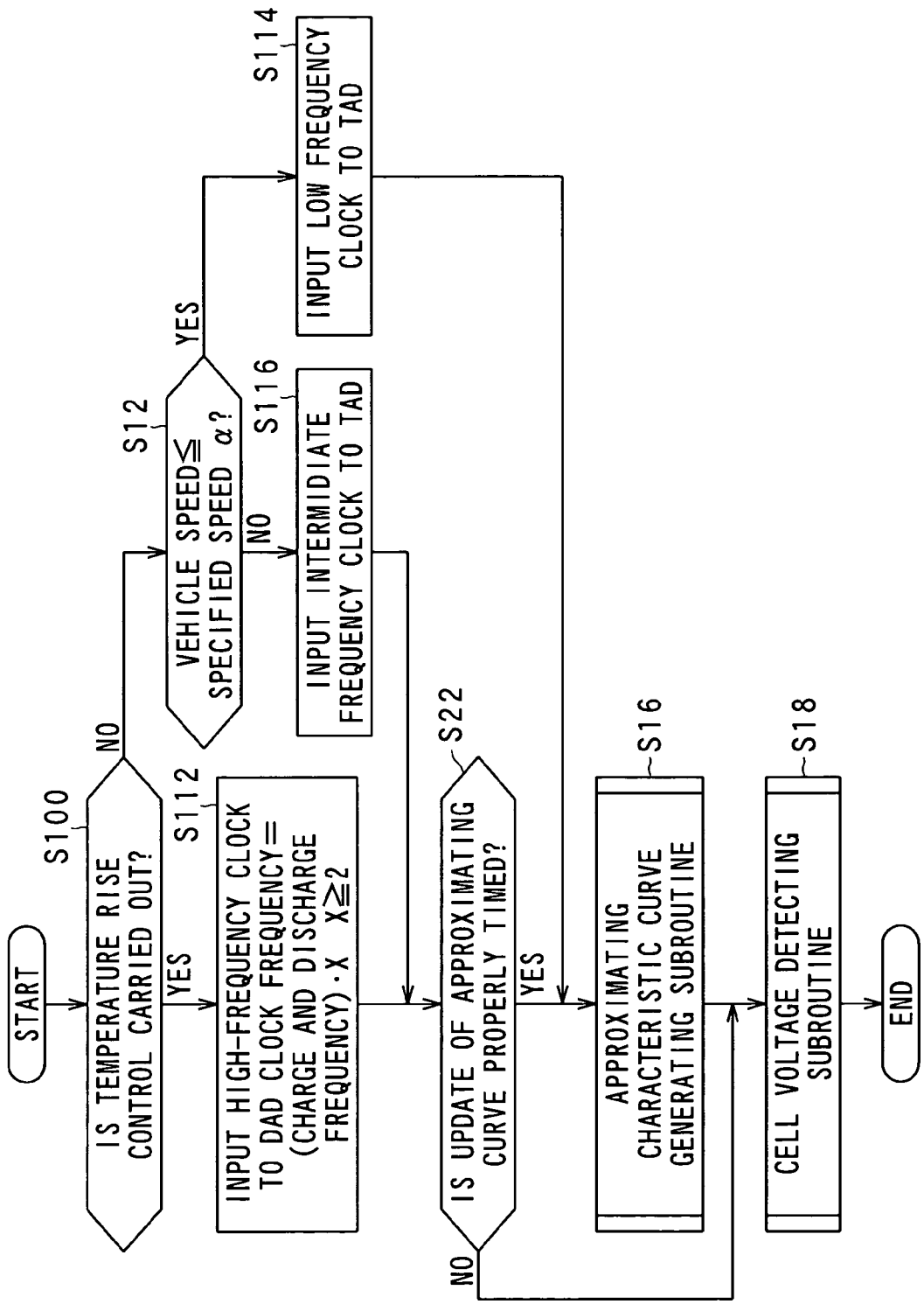
FIG. 22 is a flowchart schematically illustrating a voltage detecting routine to be executed by the battery monitor system according to the seventh embodiment.

A battery monitor according to the seventh embodiment of the present invention will be described hereinafter with reference to FIG. 22.

The structure of the battery monitor according to the seventh embodiment is substantially identical to that of the battery monitor according to the sixth embodiment except for the following different points. So, like parts between the battery monitors according to the sixth and seventh embodiments, to which like reference characters are assigned, are omitted or simplified in description.

A voltage detecting routine to be executed by the battery monitor 20 according to the seventh embodiment will be described hereinafter. The voltage detecting routine is designed to be repeatedly executed by the batter monitor 20 at a preset cycle in accordance with a voltage detecting program stored in the battery monitor 20, Like operations between the voltage detecting routines illustrated in FIGS. 21 and 22, to which like reference characters are assigned, are omitted or simplified in description.

Upon determining that the hybrid controller 12 does not carry out the temperature rise control (NO in step S100), the battery monitor 20 determines whether the actual speed of the hybrid vehicle HV is equal to or lower than the specified speed α in step S12.

Upon determining, that the speed of the hybrid vehicle is equal to or lower than the specified speed α (YES in step S12), the battery monitor 20 sets the frequency of the clock CLK to a low frequency value, proceeding to step S16.

Otherwise, upon determining that the speed of the hybrid vehicle is greater than the specified speed α (NO in step S12), the battery monitor 20 sets the frequency of the clock CLK to an intermediate frequency value, proceeding to step S22. The intermediate frequency is set to be lower than the frequency value set in step S112 and greater than the low frequency value set in step S114. Preferably, the intermediate frequency be substantially set to the high frequency value fH or thereabout.

The remaining operations of the battery monitor 20 according to the seventh embodiment are substantially identical to those of the battery module 20 according to the sixth embodiment.

Specifically the battery monitor 20 according to the seventh embodiment is configured to:

determine that the reduction in the cell-voltage detection time is higher in priority than the increase in the cell-voltage detected resolution while the vehicle speed exceeds the specified speed α; and determine that the reduction in the cell-voltage detection time with the vehicle speed exceeding the specified speed α is lower in priority than the reduction in the cell-voltage detection time with the temperature rise control being subjected to the battery 14.

Eight Embodiment

A battery monitor according to the eighth embodiment of the present invention will be described hereinafter with reference to FIGS. 23 to 26

As described above, in the temperature rise control of the battery 14, it is desired to monitor the voltage across the battery 14 so as to prevent the voltage across the battery 14 from being over increased and/or being over reduced. The width in variation of the voltage across the battery 14 depends on the internal resistance of a cell Bij.

Figure 23:
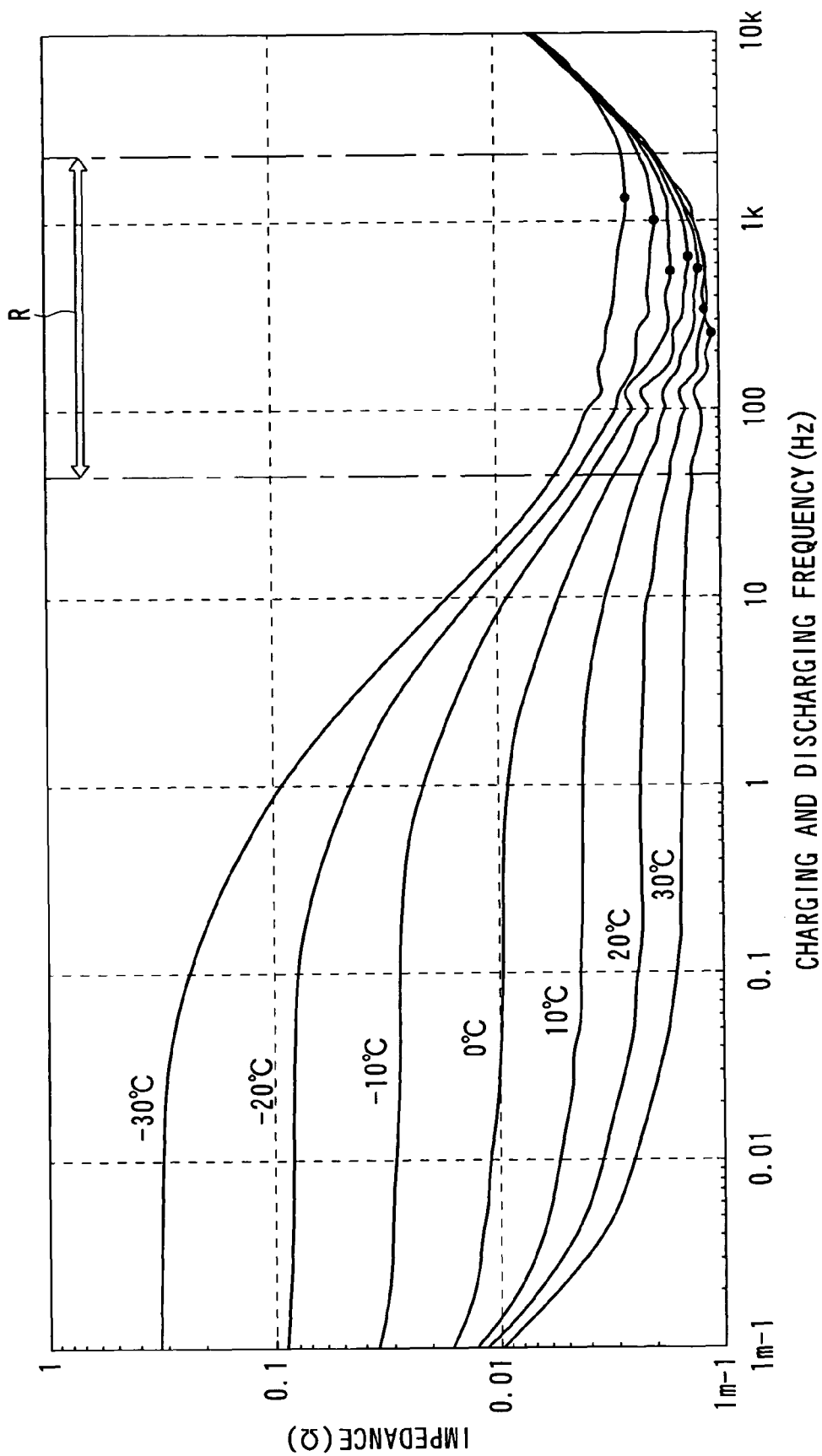
FIG. 23 is a graph schematically illustrating that an internal resistance (impedance) of a cell varies with variation in each of the temperature of the cell and the frequency of the charge and discharge current for the cell according to the eighth embodiment.

Referring to FIG. 23, the internal resistance (impedance) of a cell Bij varies with variation in each of the temperature of the cell Bij and the frequency of the charge and discharge current.

Specifically, the higher the temperature of the cell Bij is, the lower the impedance of the cell Bij is. For this reason, when the charge and discharge of the battery 14 is carried out independently of the variation in the impedance of the cell Bij, the charge and discharge of the battery 14 does not necessarily increase the temperature of the battery 14; this will be described hereinafter with reference to (a1), (b1), and (c1) of FIG. 24.

Figure 24:
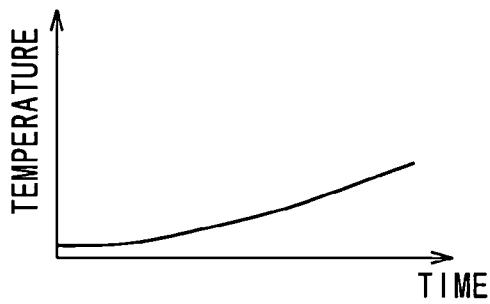
FIG. 24 is graphs schematically illustrating.
Figure 24:
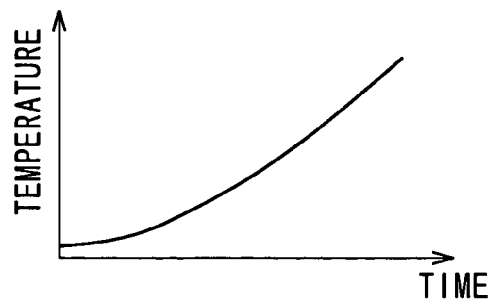
Figure 24:
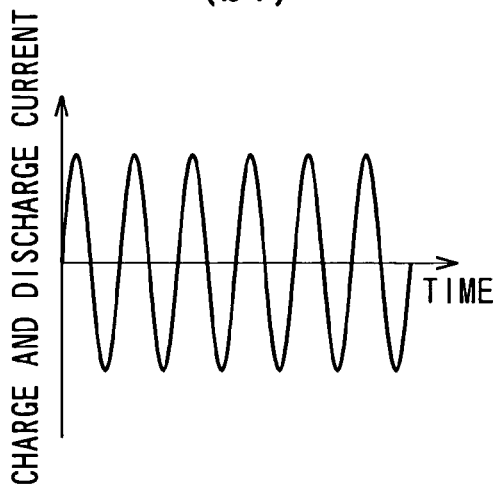
Figure 24:
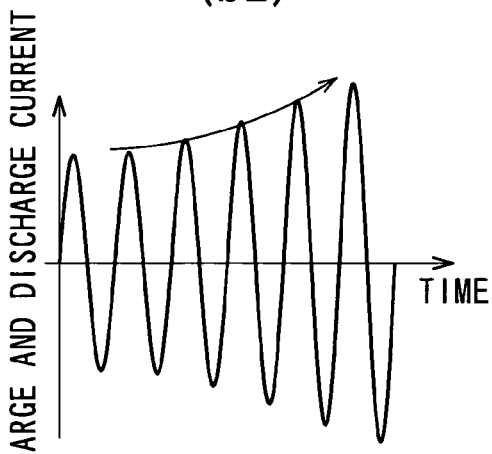
Figure 24:
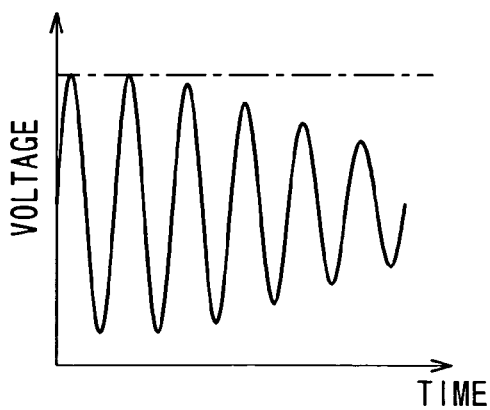
Figure 24:
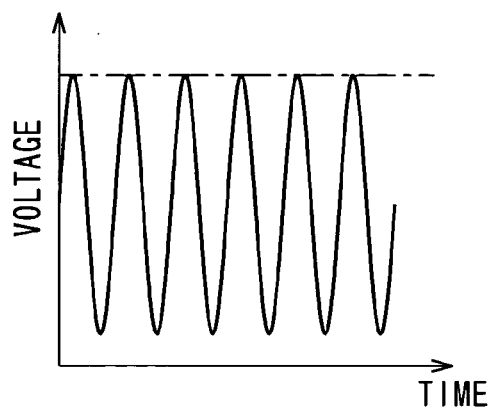

(a1) of FIG. 24 schematically illustrates, in graph format, a transition of the temperature of a cell Bij as a target cell. (b1) of FIG. 24 schematically illustrates a transition of the charge and discharge current for the target cell Bij in graph format. (c1) of FIG. 24 schematically illustrates a transition of the voltage across the target cell Bij. The dashed line in (c1) of FIG. 24 represents an upper limit for the voltage across the target cell Bij. When the voltage across the target cell Bij is maintained to be lower than the upper limit, the reliability of the target cell Bij is maintained at a high level, Referring to (a1), (b1), and (c1) of FIG. 24, an increase in the temperature of the target cell Bij reduces the internal resistance thereof. For this reason, even if the amplitude of the cyclic charge and discharge current is fixed (see (b1) of FIG. 24), the amplitude of the voltage across the target cell Bij is reduced. This is because the amount of voltage drop across the internal resistance decreases with reduction in the internal resistance of the target cell Bij.

For this reason, when the amount of the charge and discharge current for the target cell Bij is so determined at the start of the temperature rise control as to maintain the voltage across the target cell Bij at a level equal to or lower than the upper limit, the voltage across the target cell Bij increases a margin for the upper limit with increase in the temperature of the target cell Bij. Note that the amount of heat to be generated in the target Bij is in proportion to the product of the internal resistance and the square of the charge and discharge current. For this reason, an increase in the amount of the charge and discharge current increases the amount of heat to be generated in the target cell Bij, thus immediately increasing the temperature of the target cell Bij.

In view of the circumstances set forth above, the battery monitor 20 according to the eighth embodiment is configured to carry out feedback control of a locally maximum value of the voltage across each cell Bij with each cell Bij being subjected to the charge and discharge to thereby adjust the locally maximum value to the upper limit.

(a2) of FIG. 24 schematically illustrates, in graph format, a transition of the temperature of a cell Bij as a target cell while the feedback control of a locally maximum value of the voltage across the target cell Bij is cared out. (b2) of FIG. 24 schematically illustrates a transition of the charge and discharge current for the target cell Bij in graph format while the feedback control of a locally maximum value of the voltage across the target cell Bij is carried out. (c2) of FIG. 24 schematically illustrates a transition of the voltage across the target cell Bij while the feedback control of a locally maxim value of the voltage across the target cell Bij is carried out.

Referring to (a2), (b2), and (c2) of FIG. 24, even if the internal resistance is reduced with increase in the temperature across the target cell Bij, a locally maximum value of the voltage across the target cell Bij is feedback controlled to be adjusted to the upper limit. This allows the amount of the charge and discharge current to increase with increase in the temperature of the target cell Bij. Note that the increase in the amount of the charge and discharge current means the increase in the amplitude of the charge and discharge current. In other words, the increase in the amount of the charge and discharge current means the increase in an absolute value of currents flowing into and out of the target cell Bij per unit of time.

A routine of the locally-maximum value feedback control to be cooperatively executed by the battery monitor 20 and the hybrid controller 12 according to the eighth embodiment will be described hereinafter. The routine of the locally-maximum value feedback control is repeatedly executed by the batter monitor 20 and the hybrid controller 12 at a preset cycle in accordance with a feedback control program stored in each of the battery monitor 20 and the hybrid controller 12.

Like operations between the routines illustrated in FIGS. 21 and 25, to which like reference characters are assigned, are omitted or simplified in description.

In the feedback control routine, when the operation in step S18 is completed with the temperature rise control being subjected to the battery 14, the battery monitor 20 and the hybrid controller 12 proceed to step S120.

In step S120, the battery monitor 20 and the hybrid controller 12 cooperatively control the amount of the charge and discharge current to thereby carry out feedback control of a locally maximum value of the TAD output data from each TAD 52 such that the locally maximum value is adjusted to the upper limit.

FIG. 26 schematically illustrates functional modules installed in the battery monitor 20 and the hybrid controller 12; these modules implement the feedback control operation in step S120.

The battery monitor 20 includes a deviation calculator 90, a multiplier 92, and a modulation factor setter 94. The hybrid controller 12 includes a drive signal generator 96.

The deviation calculator 90 works to calculate a value by subtracting a target value from a locally maximum value, and output the calculated result to the multiplier 92. Note that the target value be preferably set to a value lower than the upper limit by a preset value with consideration given to minute fluctuations of the voltage across the target cell Bij.

The multiplier 92 works to multiply an output value of the deviation calculator 90 by a gain, such as a positive gain, K, and outputs the result to the modulation factor setter 94. The modulation factor setter 94 works to add an actual modulation factor to an output value of the multiplier 92 to thereby calculate a modulation-factor command value. Note that the modulation factor is defined as a ratio of an amplitude of a sinusoidal command voltage Vc for the oscillated output voltage of the DC to DC converter 16 to the output voltage of the DC to DC converter 16.

The drive signal generator 96 works to prepare, based on the modulation-factor command value, a triangular (or saw-tooth) carrier wave with an amplitude; the ratio of the amplitude of the sinusoidal command voltage Vc to the amplitude of the triangular carrier.

The drive signal generator 96 also works to compare in magnitude the sinusoidal command voltage Vc with the triangular carrier wave to thereby generate the drive signals gcp and gcn.

For example, in FIG. 26, the waveform of the drive signal gcn is illustrated. The drive signal gcn consists of a train of a plurality of pulses each of which has a modulated width representing a corresponding portion of the sinusoidal command voltage Vc being greater than that of the triangular carrier wave.

More specifically, the duty cycle of the drive signal gcn for switching element Scn is modulated by PWM control from the center of 50% to thereby charge and discharge the battery 14.

Similarly, the drive signal gcp consists of a train of a plurality of pulses (not shown) each of which has a modulated width representing a corresponding portion of the triangular carrier wave being greater than the sinusoidal command voltage Vc.

When one of the drive signal gcp is changed from off state to on state and the other of the drive signal gcn is changed from on state to off state, a dead time is provided to prevent both of the drive signals gcp and gcn from simultaneously being on state.

The drive signals gcp and gcn are applied to the switching elements Sap and Scn, respectively, to thereby drive the switching elements Scp and Scn such that the output voltage of the DC to DC converter 16 is oscillated in the form of a sinusoidal wave in the same manner as the sinusoidal command voltage Vc.

The greater the modulation factor is, the greater the amplitude of the oscillated output voltage of the DC to DC converter 16 is, resulting in increasing the amplitude of the charge and discharge current for the battery 14. Note that the modulation-factor command value outputted from the modulation-factor setter 94 serves as the actual modulation factor when the feedback control routine will be carried out at the next cycle.

That is, the hybrid controller 12 and the battery monitor 20 are operated as an integrating controller to adjust a locally maximum value to the target value. This can learn the modulation factor depending on the increase in the temperature of the target cell Bij as feedback manipulated variable, making it possible to cause a locally maximum value of the voltage across the battery 14 to immediately follow the target value.

After the completion of the operation in step S120, the battery monitor 20 and the hybrid controller 12 terminate the feedback control of a locally maximum value of the voltage across the target cell Bij.

The remaining operations of the battery monitor 20 and the hybrid controller 12 according to the eighth embodiment are substantially identical to those of the battery module 20 according to the sixth embodiment.

Specifically the battery monitor 20 and the hybrid controller 12 according to the eighth embodiment are configured to increase the amount of the charge and discharge current for each cell Bij according to the increase in the temperature of each cell Bij on the condition that the voltage across each cell Bij is equal to or lower than the upper limit. This achieves, in addition to the first, third, fourth, twelfth, and thirteenth advantages, the fourteenth advantage of properly carrying out the temperature rise control.

The battery monitor 20 and the hybrid controller 12 according to the eighth embodiment are configured to adjust the modulation factor to thereby feedback control a locally maximum value of the voltage across each cell Bij to be adjusted to the target value. This increases the amount of the charge and discharge current for each cell Bij. This achieves, in addition to the first, third, fourth, twelfth, and thirteenth advantages, the fifteenth advantage of increasing the amplitude of the charge and discharge current for each cell Bij as much as possible while adjusting the voltage across each cell Bij to be equal to or lower than the upper limit.

Ninth Embodiment

A battery monitor according to the ninth embodiment of the present invention will be described hereinafter with reference to FIGS. 27 and 28.

(a2) of FIG. 27 schematically illustrates, in graph format, a transition of the temperature of a cell Bij as a target cell while feedback control of a locally maximum value of the voltage across the target cell Bij according to the ninth embodiment is carried out. (b2) of FIG. 27 schematically illustrates a transition of the charge and discharge current for the target cell Bij in graph format while the feedback control of a locally maximum value of the voltage across the target cell Bij according to the ninth embodiment is carried out. (c2) of FIG. 27 schematically illustrates a transition of the voltage across the target cell Bij while the feedback control of a locally maximum value of the voltage across the target cell Bij according to the ninth embodiment is carried out. Note that (a1), (b1), and (c1) of FIG. 24 are illustrated in FIG. 27 as (a1), (b1), and (c1) for comparison.

As illustrated in (a2), (b2), and (c2) of FIG. 27, the battery monitor 20 and the hybrid controller 12 according to the ninth embodiment are configured to reduce the frequency of the charge and discharge current.

Specifically, the battery monitor 20 and the hybrid controller 12 are configured to use the frequency of the charge and discharge current for the battery 14 as a manipulated variable to feedback control of a locally maximum value of the voltage across each cell Bij to be adjusted to the target value. This is based on the fact that, as illustrated in FIG. 23, when the frequency of the charge and discharge current is equal to or lower than a predetermined frequency within, for example, the range R from tens of hertz to several kilohertz, the internal resistance (impedance) of a cell Bij increases with reduction in the frequency of the charge and discharge current.

Particularly, in the ninth embodiment, the hybrid controller 12 is configured to ca out the temperature rise control of each cell Bij at a maximum frequency region within a range in which the internal resistance increases with reduction in the frequency of the charge and discharge current for the battery 14. This allows the hybrid controller 12 is configured to carry out the temperature rise control of each cell Bij at a frequency region within which the internal resistance is reduced as low as possible.

For this reason, reduction in the frequency of the charge and discharge current increases the internal resistance to thereby increase the amount of heat to be generated by each cell Bij. Note that the amount of heat to be generated by each cell Bij is in proportion to the product of the internal resistance and the square of the charge and discharge current set forth above. For this reason, the advantage of increasing the amount of heat by reducing the frequency of the charge and discharge current is smaller than that of increasing the amount of heat by increasing the amount of the charge and discharge current according to the eighth embodiment.

However, reduction in the frequency of the charge and discharge current can reduce the frequency of the clock to be inputted to each TAD 52 while maintaining the cell-voltage detected resolution.

A routine of the locally-maximum value feedback control to be cooperatively executed by the batter monitor 20 and the hybrid controller 12 according to the ninth embodiment will be described hereinafter. The routine of the locally-maximum value feedback control is repeatedly executed by the batter monitor 20 and the hybrid controller 12 at a preset cycle in accordance with a feedback control program stored in each of the batter monitor 20 and the hybrid controller 12.

Like operations between the routines illustrated in FIGS. 25 and 28, to which like reference characters are assigned, are omitted or simplified in description.

In the feedback control routine, when the operation in step S18 is completed with the temperature rise control being subjected to the battery 14, the battery monitor 20 and the hybrid controller 12 proceed to step S120a.

In step S120a, the battery monitor 20 and the hybrid controller 12 cooperatively control the frequency of the charge and discharge current to thereby carry out feedback control of a locally maximum value of the TAD output data from each TAD 52 such that the locally maximum value is adjusted to the upper limit.

FIG. 29 schematically illustrates functional modules installed in the battery monitor 20 and the hybrid controller 12; these modules implement the feedback control operation in step S120a. Like modules illustrated in FIGS. 26 and 29, to which like reference characters are assigned, are omitted or simplified in description.

In the ninth embodiment, the battery monitor 20 includes a frequency setter 94a in place of the modulation factor setter 94.

The multiplier 92 works to multiply an output value of the deviation calculator 90 by, for example, a negative gain K, and outputs the result to the modulation factor setter 94, The modulation factor setter 94a works to add an actual modulation factor to an output value of the multiplier 92 to thereby calculate a modulation-factor command value, Note that the modulation factor is defined as a ratio of an amplitude of a sinusoidal command voltage Vc for the oscillated output voltage of the DC to DC converter 16 to the output voltage of the DC to DC converter 16.

The frequency setter 94a works to add an actual frequency of the sinusoidal command voltage Vc to an output value of the multiplier 92 to to thereby calculate a frequency command value.

The drive signal generator 96 works to prepare, based on the frequency command value, a triangular (or saw-tooth) carrier wave with an amplitude; the ratio of the amplitude of the sinusoidal command voltage Vc to the amplitude of the triangular carrier.

The drive signal generator 96 also works to compare in magnitude the sinusoidal command voltage Vc with the triangular carrier wave to thereby generate the drive signals gcp and gcn.

The drive signals gcp and gcn are applied to the switching elements Scp and Scn, respectively, to thereby drive the switching elements Scp and Scn such that the output voltage of the DC to DC converter 16 is oscillated in the form of a sinusoidal wave in the same manner as the sinusoidal command voltage Vc.

The frequency of the sinusoidal command voltage Vc set by the drive signal setter 96 is manipulated to be reduced with increase in the temperature of each cell Bij. The reduction in the frequency of the charge and discharge current allows the frequency of the clock CLK to drop in step S120a.

The remaining operations of the battery monitor 20 and the hybrid controller 12 according to the ninth embodiment are substantially identical to those of the battery module 20 according to the sixth embodiment.

Specifically the battery monitor 20 and the hybrid controller 12 according to the ninth embodiment are configured to reduce the frequency of the sinusoidal command voltage Vc for the output voltage of the DC to DC converter 16 depending on the reduction in the temperature of each cell Bij. This achieves, in addition to the first, third, fourth, twelfth, and thirteenth advantages, the sixteenth advantage of compensating the reduction in the internal resistance with increase in the temperature of each cell Bij, thus increasing the amount of heat to be generated by the internal resistance. In addition, the configuration reduces the priority level of the reduction in the voltage-detection time of each cell Bij is lower than the increase in the resolution of detection of the voltage across each cell Bij, making it possible to reduce processing load for the battery monitor 20 to carry out the voltage detecting processes.

The battery monitor 20 and the hybrid controller 12 according to the eighth embodiment are configured to adjust the frequency of the charge and discharge current for each cell Bij to thereby feedback control a locally maximum value of the voltage across each cell Bij to be adjusted to the target value. This achieves, in addition to the first, third, fourth, twelfth, and thirteenth advantages, the seventeenth advantage of increasing the amplitude of the charge and discharge current for each cell Bij as much as possible while adjusting the voltage across each cell Bij to be equal to or lower than the upper limit.

Tenth Embodiment

A battery monitor according to the tenth embodiment of the present invention will be described hereinafter with reference to FIGS. 30 and 31.

(a2) of FIG. 30 schematically illustrates, in graph formats a transition of the temperature of a cell Bij as a target cell while feedback control of a locally maximum value of the voltage across the target cell Bij according to the tenth embodiment is carried out. (b2) of FIG. 30 schematically illustrates a transition of the charge and discharge current for the target cell Bij in graph format while the feedback control of a locally maximum value of the voltage across the target cell Bij according to the tenth embodiment is carried out. (c2) of FIG. 30 schematically illustrates a transition of the voltage across the target cell Bij while the feedback control of a locally maximum value of the voltage across the target cell Bij according to the tenth embodiment is carried out. Note that (a1), (b1), and (c1) of FIG. 24 are illustrated in FIG. 30 as (a1), (b1), and (c1) for comparison.

As illustrated in (a2), (b2), and (c2) of FIG. 30, the battery monitor 20 and the hybrid controller 12 according to the tenth embodiment are configured to increase the amount of the charge and discharge current and to change the frequency of the charge and discharge current. This is based on the fact that, as illustrated in FIG. 23, a value of the frequency of the charge and discharge current at which the internal resistance becomes minimum varies depending on the temperature of each cell Bij.

As described above, the amount of heat to be generated by each cell Bij is in proportion to the product of the internal resistance and the square of the charge and discharge current for each cell Bij, and the greater the internal resistance is, the more the increase in the charge and discharge current is difficult.

For these reasons, minimization of the internal resistance of each cell Bij maximizes the amount of heat to be generated by each cell Bij. Thus, in the tenth embodiment, the battery monitor 20 and the hybrid controller 12 according to the tenth embodiment are configured to change the frequency of the charge and discharge current according to the temperature of each cell Bij so as to maximize the amount of heat to be generated by each cell Bij.

A routine of the locally-maximum value feedback control to be cooperatively executed by the battery monitor 20 and the hybrid controller 12 according to the tenth embodiment will be described hereinafter. The routine of the locally-maximum value feedback control is repeatedly executed by the batter monitor 20 and the hybrid controller 12 at a preset cycle in accordance with a feedback control program stored in each of the battery monitor 20 and the hybrid controller 12.

Like operations between the routines illustrated in FIGS. 25 and 31, to which like reference characters are assigned, are omitted or simplified in description.

In the feedback control routine, when the operation in step S18 is completed with the temperature rise control being subjected to the battery 14, the battery monitor 20 and the hybrid controller 12 proceed to step S120b.

In step S120b, the battery monitor 20 and the hybrid controller 12 cooperatively carry out feedback control of a locally maximum value of the TAD output data from each TAD 52 to be adjusted to the upper limit on the condition that the amount of heat to be generated by each cell Bij becomes maximum.

Specifically, the battery monitor 20 and the hybrid controller 12 cooperatively control the amount of the charge and discharge current for each cell Bij such that a locally maximum value of the voltage across each cell Bij is adjusted to the upper limit while controlling the frequency of the charge and discharge current so as to reduce the locally maximum value as low as possible.

The remaining operations of the battery monitor 20 and the hybrid controller 12 according to the tenth embodiment are substantially identical to those of the battery module 20 according to the sixth embodiment.

Specifically the battery monitor 20 and the hybrid controller 12 according to the tenth embodiment are configured to increase the amount of the charge and discharge current for each cell Bij such that a locally maximum value of the voltage across each cell Bij is adjusted to the upper limit while controlling the frequency of the charge and discharge current so as to reduce the locally maximum value as low as possible. This achieves the eighteenth advantage of maximizing the amount of heat to be generated by each cell Bij on the condition that the voltage across each cell Bij is equal to or lower than the upper limit.

The first to eighteenth embodiments and their modifications can be changed and/or modified within the scope of the present invention.

In the fifth embodiment, each of the block monitor ICs 40A is configured to send, to a block monitor IC 40A adjacent thereto at a lower potential side via signals lines La and Lb, the TAD output data detected thereby and TAD output data sent from a block monitor IC 40A adjacent thereto at a higher potential side.

The block monitor IC 40A with the lowest potential is configured to:

receive all pieces of the TAD output data sent from all of the higher-potential side block monitor ICs 40A; and send the received pieces of the TAD output data and the TAD output data detected thereby to the CPU 30 via signal lines La and Lb and the insulator 26.

The clock CLK and the control signals sent from the CPU 30 are transmitted to each of block monitor ICs 40A via the insulator 26.

The CPU 30 can send the clock CLK and the control signals to a block monitor IC with the highest potential. Each of the block monitor ICs 40A including the block monitor IC with the highest potential is configured to send, to a block monitor IC 40A adjacent thereto at a lower potential side via signals lines La and Lb, the TAD output data detected thereby, TAD output data sent from a block monitor IC 40A adjacent thereto at a higher potential side, the clock CLK, and the control signals. Note that, as a method of transmitting signals from a higher potential block monitor IC 40A to a lower potential block monitor IC 40A, well known techniques, such as techniques disclosed in Japanese Patent Application Publication No, 2007-278913, can be used.

In the fifth embodiment, each of the bock monitor ICs 40A can output the detected voltage to the CPU 30 via the insulator 26.

In each of the first to fourth embodiments, each of the block monitor ICs 40 can be configured to send, to a block monitor IC 40 adjacent thereto at a lower potential side via signals lines La and Lb, signals the TAD output data detected thereby. This reduces the number of the insulator elements of the insulator 26.

In the fifth embodiment, when a pair of TADs 52A and 52B is provided for each cell Bij in order to only diagnose whether an abnormality occurs in the battery monitor 20, the two voltage detection modes Mode 2 and Mode 3 can be omitted. Any one of the mode signals Mode 2 and Mode 3 can be provided for each cell Bij.

In the fifth embodiment, three or more TADs can be provided for each cell Bij. In this modification, the clock CLKs for the respective three or more TADs 52 can be different from each other. This can make difference:

the orders of the priority levels of the increase in the cell-voltage detected resolution and the reduction in the cell-voltage detection time in the voltage detecting process for the respective three or more TADs 52.

Each of the three or more TADs can therefore detect the voltage of a corresponding cell Bij based on the order of the priority levels determined for a corresponding TAD.

In the fifth embodiment and its modifications, a plurality of ring oscillators 52a are provided for each cell Bij, but only one ring oscillator can be provided for each cell Bij. In this medication, a plurality of digital data generators DG can be provided for each cell Bij so that they share the only one ring oscillator. This can output a plurality of different items of TAD output data for the same target cell.

In the fourth embodiment, the frequency of the clock CLK can be set any one of the high frequency value and the low frequency value, but the present invention is not limited thereto. The frequency of the clock CLK can be set any one of three or more different frequency values. In this modification, a hysteresis period for waiting the clock-frequency switching from one of the different frequency values to another one thereof can be provided for preventing hunting.

In the fourth embodiment, the frequency of the clock CLK is switched to the actually set frequency when a hysteresis period is equal to or greater than a specified period corresponding to the switching threshold. The hysteresis period means a period for which the determined result (fH or fL) of the priority level in step S62 has been continued since the change of determined result from one of the value fH and fL to the other thereof. The present invention is not limited to the switching method according to the fourth embodiment.

For example, as illustrated in FIG. 32, a parameter, such as the speed of the hybrid vehicle HV, required to switch the frequency of the clock CLK from a higher value to a lower value and a parameter required to switch the frequency of the clock CLk from a higher value to a lower value can be different from each other. This method can be applied to switch the frequency of the clock CLk from any one of three or more frequency values different from each other to another one thereof.

In each of the first to tenth embodiments, when the frequency of the clock is low, the approximating characteristic curve is updated every time the voltage detecting routine is carried out so as to increase the accuracy of detecting the voltage across each cell Bij. Because the output characteristic of each TAD is kept unchanged for a short period, the approximating characteristic curve can be updated once every time a set of a plurality of the voltage detecting routines are carried out. In this modification, the approximating update period for the low clock frequency can be preferably shorter than that for the high clock frequency. As a method of increasing the accuracy of detecting the voltage across each cell Bij, using the approximating characteristic curve according to each of the first to tenth embodiments is described, but the present invention is not limited thereto.

Specifically, it is possible to carry out processes to correct in temperature the TAD output data from each TAD so as to compensate an error contained in the TAD output data; this error is due to the input-output characteristics of each electronic component used to detect the voltage across each cell Bij except for each TAD, such as resistors 44 and 46.

In this case, the frequency of update of the amount of correction in temperature for the TAD output data when the increase in the cell-voltage detected resolution is higher in priority than the reduction in the cell-voltage detection time is higher than the frequency of update of the amount of correction in temperature for the TAD output data when the increase in the cell-voltage detected resolution is lower in priority than the reduction in the cell-voltage detection time.

Note that, in order to correct in temperature the TAD output data from each TAD 52, the temperature of each TAD 52 can be detected using an input-output characteristic curves of each TAD 52 depending on temperature illustrated in FIG. 33.

FIG. 33 schematically illustrates input-output characteristic curves of a TAD 52. The input-output characteristic curve (s) will be referred to as "output characteristic curve(s)" hereinafter.

Referring to FIG. 33, as the output characteristic curves of the TAD 52, the relationships between variables of the input voltage signal Vin in units of voltage (V) and those of the TAD output data in units of LSB (least Significant Bit) are plotted as nonlinear curves that vary depending on temperature.

A method of determining whether the increase in the cell-voltage detected resolution is higher in priority than the reduction in the cell-voltage detection time is not limited to a method using whether the speed of the hybrid vehicle HV is substantially zero.

For example, as a parallel hybrid vehicle, a vehicle in which the vehicle control system is installed can be is configured such that the internal combustion engine installed therein is mainly used as a power source except for acceleration. In this case, even if the speed of the vehicle is equal to or greater than zero, when the vehicle speed is constant, currents flowing into and out of the high-voltage battery can be low.

In such a case, it can be possible to determine that the increase in the cell-voltage detected resolution is higher in priority than the reduction in the cell-voltage detection time with the vehicle speed being constant.

When the vehicle control system installed in the hybrid vehicle HV operates in a mode in which the MG 10 does not work to generate any one of power and torque, it can be possible to determine that the increase in the cell-voltage detected resolution is higher in priority than the reduction in the cell-voltage detection time when the vehicle control system operates in the mode.

A method of determining whether the increase in the cell-voltage detected resolution is higher in priority than the reduction in the cell-voltage detection time is not limited to various methods using: the vehicle running conditions, currents flowing into and out of the battery 14, and/or information indicative of whether electrical loads are connected to the battery 14. For example, when a period required to detect the voltage across each cell Bij is greater than a preset period, it is possible to determine that the increase in the cell-voltage detected resolution is higher in priority than the reduction in the cell-voltage detection time. In this case, the hybrid controller 12 can be configured to temporally set currents transferring between the MG 10 and the battery 14 to zero, making it possible to detect an open-circuit voltage of the battery 14 with high accuracy.

In each of the sixth to tenth embodiments, the approximating characteristic curve is updated at a preset timing during the temperature rise control for the battery 14 being carried out, but the present invention is not limited thereto. Specifically, when the priority level of the reduction in the cell-voltage detection time is extremely high when the temperature rise control for the battery 14 is carried out, it is possible to detect the voltage across each cell Bij using a previously prepared approximating characteristic curve for each TAD 52 without updating it.

In each of the sixth and seventh embodiments, the frequency of the clock CLK is set to a maxim value when the temperature rise control for the battery 14 is carried out, but the present invention is not limited thereto. When there are situations in which the priority level of the reduction in the cell-voltage detection time may be extremely high, it is possible to set the frequency of the clock CLK to a maximum value under these states.

In each of the eighth to tenth embodiments, in the temperature rise control for each cell Bij, the duty cycle of the drive signal gcn for switching element Scn is modulated by PWM control from the center of 50% to thereby charge and discharge the battery 14, but the present invention is not limited thereto. The duty cycle of the drive signal gcn for switching element Scn can be modulated by PWM control from the center of a preset percents value higher or lower than 50% to thereby charge and discharge the battery 14 according to the requirement for a higher voltage or lower voltage as the output voltage of the DC to DC converter 16.

The increase in the charge and discharge current with increase in the temperature in each cell Bij by the temperature rise control for each cell Bij is not limited to the voltage feedback control. Specifically, it is possible to carry out open-loop control to increase the amount of charge and discharge current with increase in the measured value of the temperature of the battery 14.

On the condition that the voltage across each cell Bij is equal to or lower than the upper limit, it is possible to increase the amount of the charge and discharge current with increase in the measured value of the temperature of the batter 14 by the temperature sensor 80. A plurality of temperature sensors located at a plurality of portions of the battery 14 can be provided to measure the temperatures of the respective portions of the battery 14. In this modification, it is possible to increase the amount of the charge and discharge current with increase in an average value of the measured temperatures of the respective portions of the battery 14.

As means for grasping the temperature of each cell Bij, in addition to temperature detecting means and means for detecting a locally maximum value of the charge and discharge current, means for detecting the temperature rise control time (charge and discharge process time) can be used. Specifically, because, the longer the charge and discharge process time is, the more the temperature of each cell Bij is increased, it is possible to increase the charge and discharge current with increase in the detected value of the charge and discharge process time.

The process to reduce the frequency of the charge and discharge current with increase in the temperature of each cell Bij by the temperature rise control is not limited to the voltage feedback control. Specifically, it is possible to carry out open-loop control to reduce the frequency of the charge and discharge current with increase in the measured value of the temperature of the battery 14.

On the condition that the voltage across each cell Bij is equal to or lower than the upper limit, it is possible to reduce the frequency of the charge and discharge current with increase in the measured value of the temperature of the battery 14 by the temperature sensor 80. A plurality of temperature sensors located at a plurality of portions of the battery 14 can be provided to measure the temperatures of the respective portions of the battery 14. In this modification, it is possible to increase the amount of the charge and discharge current with increase in an average value of the measured temperatures of the respective portions of the battery 14.

As means for grasping the temperature of each cell Bij, in addition to temperature detecting means and means for detecting a locally maximum value of the charge and discharge current, means for detecting the temperature rise control time (charge and discharge process time) can be used. Specifically, because, the longer the charge and discharge process time is, the more the temperature of each cell Bij is increased, it is possible to reduce the frequency of the charge and discharge current with increase in the detected value of the charge and discharge process time.

The process to change either the frequency or the amount of the charge and discharge current with increase in the temperature of each cell Bij by the temperature rise control is not limited to any one of the processes described in the eighth to tent embodiments. For example, in the tenth embodiment, it is possible to change either the frequency or the amount of the charge and discharge current based on a map. The map includes information indicative of a relationship between a variable of the temperature of the battery 14, a variable of the frequency of the charge and discharge current, and a parameter, such as a modulation factor, required to change the charge and discharge current. It is possible to use both the voltage feedback control described in the eighth embodiment and the voltage feedback control described in the ninth embodiment.

In each of the sixth to tenth embodiments, when the temperature rise control is carried out, the condition that the voltage across each cell Bij is equal to or lower than the upper limit, but the present invention is not limited thereto.

Specifically, it is possible to provide the condition that the voltage across each cell Bij is equal to or greater than a lower limit. The lower limit is determined such that, when the voltage across each cell Bij is equal to or greater than the lower limit the reduction in the reliability of each cell Bij can be prevented. When the voltage across the cell Bij cannot be excessively reduced by the feedback control of the voltage across the cell Bij to be adjusted to the upper limit, a reduction of the voltage across the cell Bij from its lower limit can be prevented without a particularly determination of whether the voltage across the cell Bij is equal to or lower than the lower limit.

As power converting circuits located between the high-voltage battery 14 and the MG 10, the DC to DC converter 16 and the inverter IV can be used, but another circuit can be located therebetween.

Specifically, as the DC to DC converter, a buck boost converter can be located between the high-voltage battery 14 and the MG 10 in place of the DC to DC converter 16. The buck boost converter consists of a first pair of switching elements parallely connected across the battery 14, a capacitor, a second pair of switching elements parallely connected across the capacitor, and a coil. The coil is configured to connect between a connecting point between the first pair of switching elements and that between the second pair of switching elements. Three buck boost converters can be located such that an output voltage of each of the three buck boost converters is applied to a corresponding one phase of the MG 10. In this modification, when the MG 10 is prevented from being driven based on the charge and discharge of the capacitor, a switch can be provided between the MG 10 and each of the converters. The charge and discharge of the capacitor can be carried out when the switch is opened.

As power converter circuits connected to the high-voltage battery 14, a DC to DC converter for stepping down a voltage across the battery 14 and for applying the stepped-down voltage to a power supply source (a low-voltage battery) for auxiliaries installed in the hybrid vehicle HV. In this modification, transfer of charges between the high-voltage battery 14 and the low-voltage battery allow the temperature rise control of the high-voltage battery 14.

The number of cells in each battery block is not limited to six, and an IC provided for each cell BIj and operative to monitor the voltage across a corresponding cell BIj can be used. As the detection target of each TAD, each battery block can be used.

In each of the first to tenth embodiments, the TAD output data from each TAD 52 is estimated to be transferred via a serial lines but the present invention is not limited thereto. Specifically, each TAD 52 can transmit bits unused in the frequency fH via a line, and the remaining bits used in the frequency fH via another line. This allows, when the frequency fH of the clock CLK is used, the microcomputer 60 to only obtain the remaining bits to thereby calculate the voltage across each cell Pij. This reduces processing load required to calculate the voltage across each cell Pij.

As each TAD 52, the latch encoder 52d can be omitted. Each TAD 52 according to this modification can be configured to count the number of logical inversion of the output signal of the ring oscillator 52a by a integer.

Various types of vehicle control systems according to the present invention can be installed in various types of vehicle, such as an electric automobile.

As each cell for the high-voltage battery 14, a lithium ion secondary cell is used, but alternative types of secondary batteries, such as a nickel hydrogen secondary battery.

In each of the first to tenth embodiments, the high-voltage battery 14 is designed as a battery pack, but can be designed as the low-voltage battery, or a battery for personal computes, cell phones, or cameras.

As the detection target of each TAD 52, the voltage of a piezo injector to be installable in, for example, vehicles can be used While there has been described what is at present considered to be the embodiments and their modifications of the present invention, it will be understood that various modifications which are not described yet may be made therein, and it is intended to cover in the appended claims all such modifications as fall within the scope of the invention.

What is claimed is:
1. A voltage detecting apparatus comprising:
a voltage controlled oscillator configured to, when an input voltage is applied thereto, output a signal with a logical value that is periodically inverted;
a detector configured to count a number of logical inversion of the output signal from the voltage controlled oscillator over an interval between edges of pulses of a pulse signal to thereby generate, based on the counted number of logical inversion, digital data as a detected result of the input voltage;
a determiner configured to determine whether a reduction of a time required to detect the input voltage is higher in priority than an increase of a resolution of detection of the input voltage; and
a variably setting unit configured to variably set a frequency of the pulse signal based on a result of the determination of whether the reduction of the time required to detect the input voltage is higher in priority than the increase of the resolution of detection of the input voltage.

2. The voltage detecting apparatus according to claim 1, wherein the input voltage is based on a voltage across a battery, the voltage across the battery being a target voltage to be detected.

3. The voltage detecting apparatus according to claim 2, wherein the determiner is configured to obtain an absolute value of currents flowing into and out of the battery, and determine that the increase of the resolution of detection of the input voltage is higher in priority than the reduction of the time required to detect the input voltage when the obtained absolute value is lower than a preset value.

4. The voltage detecting apparatus according to claim 2, wherein an electrical load is connected to the battery and is activated based on the voltage across the battery, and the determiner is configured to determine that the increase of the resolution of detection of the input voltage is higher in priority than the reduction of the time required to detect the input voltage when the electrical load is deactivated.

5. The voltage detecting apparatus according to claim 4, wherein the battery is connected to the electrical load via a switch, and electrical connection between the battery and the electrical load is established when the switch is controlled to be closed, and the determiner is configured to determine whether the reduction of the time required to detect the input voltage is higher in priority than the increase of the resolution of detection of the input voltage based on an open or close state of the switch.

6. The voltage detecting apparatus according to claim 2, wherein the battery serves as a power source of a power generator installed in a vehicle, and the determiner is configured to obtain a running condition of the vehicle, and determine whether the increase of the resolution of detection of the input voltage is higher in priority than the reduction of the time required to detect the input voltage based on the obtained running condition of the vehicle.

7. The voltage detecting apparatus according to claim 2, wherein, when a temperature of the battery is lower than a preset value, the battery is cyclically charged and discharged by a charge and discharge unit such that the temperature of the battery is increased, and the determiner is configured to determine that the reduction of the time required to detect the input voltage is higher in priority than the increase of the resolution of detection of the input voltage.

8. The voltage detecting apparatus according to claim 7, wherein, when the battery is cyclically charged and discharged by the charge and discharge unit, the determiner determines that a priority level of the reduction of the time required to detect the input voltage is the highest.

9. The voltage detecting apparatus according to claim 7, wherein, when the battery is cyclically charged and discharged by the charge and discharge unit, the variably setting unit is configured to variably set the frequency of the pulse signal to be higher than a frequency of the cyclic charge and discharge of the battery.

10. The voltage detecting apparatus according to claim 1, wherein the voltage controlled oscillator comprises of a first voltage controlled oscillating unit and a second voltage controlled oscillating unit, each of the first and second voltage controlled oscillating units configured to, when the input voltage is applied thereto, output the signal with the logical value that is periodically inverted, the detector comprises of a first detecting unit and a second detecting unit, each of the first and second detecting units configured to count the number of logical inversion of the output signal from a corresponding one of the first and second voltage controlled oscillating units over the interval between the edges of the pulses of the pulse signal to thereby generate, based on the counted number of logical inversion, the digital data as the detected result of the input voltage, and the variably setting unit is configured to variably set the frequencies of the pulse signals for the first and second voltage controlled oscillating units to be different from each other.

11. The voltage detecting apparatus according to claim 1, wherein the detector comprises of a first detecting unit and a second detecting unit, each of the first and second detecting units configured to count the number of logical inversion of the output signal from a corresponding one of the first and second voltage controlled oscillating units over the interval between the edges of the pulses of the pulse signal to thereby generate, based on the counted number of logical inversion, the digital data as the detected result of the input voltage, further comprising:
a comparing unit configured to compare the digital data generated by the first detecting unit with the digital data generated by the second detecting unit; and
an abnormality diagnosing unit configured to diagnose that an abnormality occurs in the voltage detecting apparatus when a difference between the digital data generated by the first detecting unit and the digital data generated by the second detecting unit exceeds a specified value.

12. The voltage detecting apparatus according to claim 1, wherein at least one of the voltage controlled oscillator and the detector includes an electronic element having an input-output characteristic, further comprising:
- a compensating unit configured to compensate an error included in the digital data generated by the determiner, the error being due to the input-output characteristic of the electronic element.

13. The voltage detecting apparatus according to claim 12, wherein the compensating unit comprises:
- a generator configured to:
  - apply a plurality of reference voltage values to the voltage controlled oscillator as the input voltage so that a plurality of output signals are obtained from the voltage controlled oscillator, the plurality of output signals corresponding to the plurality of reference voltage values, respectively; and
  - generate, based on the plurality of output signals, information indicative of a relationship between a variable of the input voltage and the plurality of output signals; and
- a calculator configured to calculate corrected digital data based on the digital data generated by the detector and the generated information indicative of the relationship between the variable of the input voltage and the plurality of output signals.

14. The voltage detecting apparatus according to claim 13, wherein the generator is configured to repeatedly generate the information indicative of the relationship between the variable of the input voltage and the plurality of output signals such that:
- a number of generation of the information when it is determined that the reduction of the time required to detect the input voltage is higher in priority than the increase of the resolution of detection of the input voltage is greater than a number of generation of the information when it is determined that the increase of the resolution of detection of the input voltage is higher in priority than the reduction of the time required to detect the input voltage.

15. The voltage detecting apparatus according to claim 1, wherein the variably setting unit is configured to variably set the frequency of the pulse signal based on:
- the result of the determination of whether the reduction of the time required to detect the input voltage is higher in priority than the increase of the resolution of detection of the input voltage; and
- a history of changes of the frequency of the pulse signal.

16. A battery state control system comprising:
- the voltage detecting apparatus according to claim 7; and
- the charge and discharge unit configured to:
  - cyclically charge and discharge the battery such that the temperature of the battery is increased; and
  - change, with increase in the temperature of the battery, at least one of: a frequency of the cyclic charge and discharge of the battery, and an amount of currents flowing into and out of the battery by the cyclic charge and discharge.

17. A battery state control system for controlling a state of a battery, the system comprising:
- a charge and discharge unit configured to:
- cyclically charge and discharge the battery when a temperature of the battery is lower than a preset value; and carry out:
- a process to change, with increase in the temperature of the battery by the charge and discharge, a frequency of the cyclic charge and discharge of the battery; and
- a process to increase, with increase in the temperature of the battery by the charge and discharge, an amount of currents flowing into and out of the battery by the cyclic charge and discharge,
- wherein the charge and discharge unit is configured to reduce the frequency of the cyclic charge and discharge of the battery with increase in the temperature of the battery by the charge and discharge.

18. The battery state control system according to claim 17, wherein the charge and discharge unit is configured to cyclically charge and discharge the battery on a condition that a voltage across the battery is equal to or lower than an upper limit.

19. The battery state control system according to claim 17, wherein the charge and discharge unit is configured to increase, with increase in the temperature of the battery by the charge and discharge, the amount of currents flowing into and out of the battery by the cyclic charge and discharge.

20. The battery state control system according to claim 19, wherein the charge and discharge unit is configured to carry out feedback control of a locally maximum value of the voltage across the battery to be adjusted to a target value to thereby increase the amount of currents flowing into and out of the battery.

21. The battery state control system according to claim 17, wherein the charge and discharge unit is configured to carry out feedback control of a locally maximum value of the voltage across the battery to be adjusted to a target value to thereby reduce the frequency of the cyclic charge and discharge of the battery.

22. The battery state control system according to claim 17, wherein the charge and discharge unit is configured to increase, with increase in the temperature of the battery by the charge and discharge, the amount of currents flowing into and out of the battery by the cyclic charge and discharge while changing the frequency of the cyclic charge and discharge with increase in the temperature of the battery by the charge and discharge.

23. The battery state control system according to claim 17, wherein the charge and discharge unit comprises:
- a capacitor; and
- a power converter configured to convert an input voltage into a converted voltage, and apply the converted voltage to the capacitor,
- the charge and discharge unit is configured to control the power converter to generate an oscillated voltage as the converted voltage, the oscillated voltage allowing an oscillated current to flow through the battery.

* * * * *